(12) United States Patent
Kim et al.

(10) Patent No.: US 9,425,410 B2
(45) Date of Patent: Aug. 23, 2016

(54) ORGANIC LIGHT-EMITTING DIODE

(71) Applicant: Samsung Display Co., Ltd., Yongin, Gyeonggi-Do (KR)

(72) Inventors: So-Yeon Kim, Yongin (KR); Yoon-Hyun Kwak, Yongin (KR); Bum-Woo Park, Yongin (KR); Sun-Young Lee, Yongin (KR); Wha-Il Choi, Yongin (KR); Jong-Won Choi, Yongin (KR); Ji-Youn Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 454 days.

(21) Appl. No.: 13/940,187

(22) Filed: Jul. 11, 2013

(65) Prior Publication Data

US 2014/0225072 A1 Aug. 14, 2014

(30) Foreign Application Priority Data

Feb. 13, 2013 (KR) .................. 10-2013-0015534

(51) Int. Cl.
*H01L 51/50* (2006.01)
*H01L 51/00* (2006.01)

(52) U.S. Cl.
CPC .......... *H01L 51/0072* (2013.01); *H01L 51/006* (2013.01); *H01L 51/0052* (2013.01);
(Continued)

(58) Field of Classification Search
None
See application file for complete search history.

(56) References Cited

U.S. PATENT DOCUMENTS 5,635,308 A 6/1997 Inoue et al.
5,645,948 A 7/1997 Shi et al.
(Continued)

FOREIGN PATENT DOCUMENTS

JP 1996-0012600 A 1/1996
JP 2000-003782 A 1/2000
(Continued)

OTHER PUBLICATIONS

Adachi, et al., *Confinement of charge carriers and molecular excitons within 5-nm-thick emitter layer in organic electroluminescent devices with a double heterostructure*, Appl. Phys. Lett. 57 (6), Aug. 6, 1990, pp. 531-533.
Sakamoto, et al., *Synthesis, Characterization, and Electron-Transport Property of Perfluourinated Phenylene Dendrimers*, J. Am. Chem. Soc. 2000, 122, pp. 1832-1833.
(Continued)

*Primary Examiner* — Gregory Clark
(74) *Attorney, Agent, or Firm* — Lewis Roca Rothgerber Christie LLP

(57) ABSTRACT

An organic light-emitting diode includes a substrate, a first electrode on the substrate, a second electrode facing the first electrode, an emission layer between the first electrode and the second electrode, a hole transfer region between the first electrode and the emission layer, and an electron transfer region between the emission layer and the second electrode. The hole transfer region includes a first compound represented by Formula 1, and the emission layer includes a second compound represented by Formula 100.

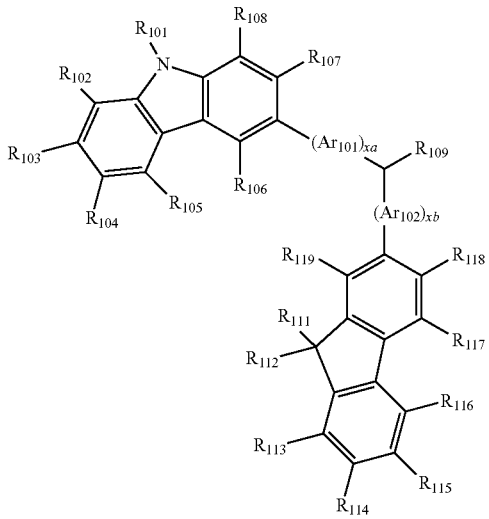

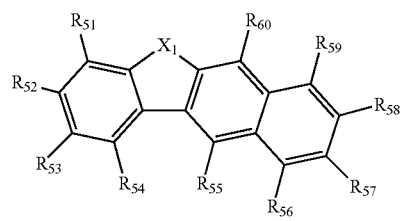

18 Claims, 2 Drawing Sheets

(52) U.S. Cl.
CPC ........ *H01L51/0059* (2013.01); *H01L 51/0061* (2013.01); *H01L 51/0067* (2013.01); *H01L 51/0073* (2013.01); *H01L 51/0074* (2013.01); *H01L 51/0085* (2013.01); *H01L 51/5016* (2013.01); *H01L 51/5056* (2013.01)

(56) References Cited

U.S. PATENT DOCUMENTS

| | | | |
|---|---|---|---|
| 5,972,247 | A | 10/1999 | Shi et al. |
| 6,465,115 | B2 | 10/2002 | Shi et al. |
| 6,596,415 | B2 | 7/2003 | Shi et al. |
| 2005/0221124 | A1 | 10/2005 | Hwang et al. |
| 2011/0193074 | A1 | 8/2011 | Lee et al. |
| 2011/0240979 | A1* | 10/2011 | Kim .................... C07D 487/04 257/40 |

FOREIGN PATENT DOCUMENTS

| | | | | |
|---|---|---|---|---|
| KR | 10-2005-0097670 A | | 10/2005 | |
| KR | 10-0573137 B1 | | 4/2006 | |
| KR | 10-2010-0039815 A | | 4/2010 | |
| KR | 10-2011-0127784 A | | 11/2011 | |
| KR | 10-2012-0122 | * | 7/2012 | ............. H01L 51/50 |
| WO | WO 2011/145876 A2 | | 11/2011 | |

OTHER PUBLICATIONS

Tang, et. al., *Organic electroluminescent diodes*, Appl. Phys. Left. 51 (12), Sep. 21, 1987, pp. 913-915.

Yamaguchi, et al., *Diphenylamino-Substituted 2,5-Diarylsiloles for Single-Layer Organic Electroluminescent Devices*, Chemistry Letters 2001, pp. 98-99.

* cited by examiner

ORGANIC LIGHT-EMITTING DIODE

CROSS-REFERENCE TO RELATED APPLICATION

This application claims priority to and the benefit of Korean Patent Application No. 10-2013-0015534, filed on Feb. 13, 2013 in the Korean Intellectual Property Office, the entire content of which is incorporated herein by reference.

BACKGROUND

1. Technical Field

An organic light-emitting diode is disclosed.

2. Description of the Related Art

Organic light-emitting diodes (OLEDs) are self-emitting diodes having advantages such as wide viewing angles, good contrast, quick response speeds, high brightness, and good driving voltage characteristics. Also, OLEDs can provide multicolored images.

A typical OLED has a structure including a substrate, and an anode, a hole transport layer (HTL), a second electrode (EML), an electron transport layer (ETL), and a cathode sequentially stacked on the substrate. The HTL, the EML, and the ETL are organic thin films formed of organic compounds.

An operating principle of an OLED having the above-described structure is as follows. When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

One or more embodiments of the present invention include an organic light-emitting diode having a novel structure. Additional aspects will be set forth in part in the description which follows and, in part, will be apparent from the description, or may be learned by practice of the presented embodiments.

According to one or more embodiments of the present invention, an organic light-emitting diode includes: a substrate; a first electrode on the substrate; a second electrode facing the first electrode; an emission layer between the first electrode and the second electrode; a hole transfer region between the first electrode and the emission layer; and an electron transfer region between the emission layer and the second electrode. The hole transfer region includes a first compound represented by Formula 1, and the emission layer includes a second compound represented by Formula 100 below.

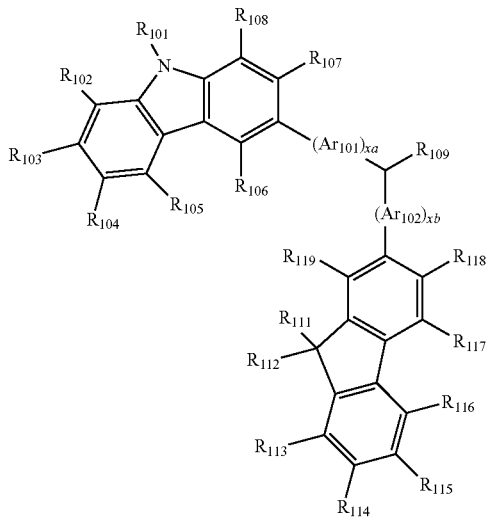

Formula 1

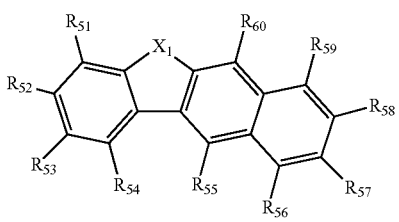

Formula 100

In Formula 1, $Ar_{101}$ and $Ar_{102}$ may each independently be a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group.

xa and xb may each independently be an integer of 0 to 5.

$R_{101}$ and $R_{109}$ may each independently be a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group.

$R_{102}$ to $R_{108}$, and $R_{111}$ to $R_{119}$ may each independently be a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthiol group, a substituted or unsubstituted $C_2$-$C_{60}$ heteroaryl group, —N($Q_1$)($Q_2$), or —Si($Q_3$)($Q_4$)($Q_5$).

$Q_1$ to $Q_5$ may each independently be a $C_1$-$C_{60}$ alkyl group, a $C_1$-$C_{60}$ alkoxy group, a $C_6$-$C_{60}$ aryl group, or a $C_2$-$C_{60}$ heteroaryl group.

In Formula 100, $X_1$ may be O or S.

$R_{56}$ and $R_{57}$ may be linked to each other to form a substituted or unsubstituted $C_3$-$C_{60}$ cyclic moiety, or a substituted or unsubstituted $C_2$-$C_{60}$ heterocyclic moiety.

$R_{51}$ to $R_{55}$ and $R_{58}$ to $R_{60}$ may each independently be a substituent represented by —$(Ar_{51})_q$—$(Ar_{61})$. Alternatively, $R_{58}$ and $R_{59}$ may be linked to each other to form a substituted or unsubstituted $C_3$-$C_{60}$ cyclic moiety, or a substituted or unsubstituted $C_2$-$C_{60}$ heterocyclic moiety; and $R_{51}$ to $R_{57}$ and $R_{60}$ may each independently be a substituent represented by —$(Ar_{51})_q$—$(Ar_{61})$.

$Ar_{51}$ may be a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a $C_2$-$C_{10}$ heterocycloalkenylene group, a substituted or unsubstituted $C_6$-$C_{60}$ arylene group, or a substituted or unsubstituted $C_2$-$C_{60}$ heteroarylene group.

$Ar_{61}$ may be a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, a substituted or unsubstituted $C_2$-$C_{60}$ heteroaryl group, —$N(Q_{21})(Q_{22})$, or —$Si(Q_{23})(Q_{24})(Q_{25})$.

$Q_{21}$ and $Q_{22}$ may each independently be a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, or a substituted or unsubstituted $C_2$-$C_{60}$ heteroaryl group.

$Q_{23}$ to $Q_{25}$ may each independently be a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, or a substituted or unsubstituted $C_2$-$C_{60}$ heteroaryl group.

q may be an integer from 0 to 5.

BRIEF DESCRIPTION OF THE DRAWINGS

These and/or other aspects will become apparent and more readily appreciated from the following description of the embodiments when taken in conjunction with the accompanying drawings in which.

DETAILED DESCRIPTION

Figure 1:
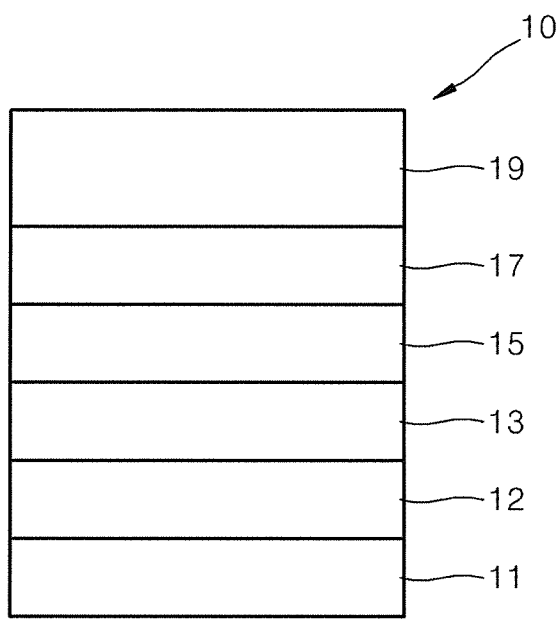
FIG. 1 is a schematic view of a structure of an organic light-emitting diode according to an embodiment of the present invention.

Reference will now be made to certain embodiments, examples of which are illustrated in the accompanying drawings. Throughout the description and drawings, like reference numerals refer to like elements. It is understood that the described embodiments may be modified in different ways, and therefore, the present invention should not be construed as being limited to the descriptions set forth herein. Accordingly, the embodiments are described below with reference to the figures to explain different aspects of the present invention. As used herein, the term "and/or" includes any and all combinations of one or more of the associated listed items. Expressions such as "at least one of," when preceding a list of elements, modify the entire list of elements and do not modify the individual elements of the list.

Referring to FIG. 1, an organic light emitting diode 10 according to an embodiment of the present invention has a structure including a substrate 11, a first electrode 12, a hole transfer region 13, an emission layer (EML) 15, an electron transfer region 17, and a second electrode 19 sequentially stacked on one another.

The substrate 11 may be any substrate commonly used in organic light-emitting diodes. In some embodiments, for example, the substrate 11 may be a glass substrate or a transparent plastic substrate having mechanical strength, thermal stability, transparency, surface smoothness, ease of handling, and water resistance.

The first electrode 12 may be formed by depositing or sputtering a first electrode-forming material on the substrate 11. When the first electrode 12 is an anode, a material having a high work function may be used as the first electrode-forming material to facilitate hole injection. The first electrode 12 may be a reflective electrode or a transmission electrode. Transparent and conductive materials such as ITO, IZO, $SnO_2$, and ZnO may be used to form the first electrode 12. The first electrode 12 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 12 may have a single-layer structure or a multi-layered structure including at least two layers. For example, the first electrode 12 may have a three-layered structure of ITO/Ag/ITO, but is not limited thereto.

The first electrode 12 may be a hole-injecting electrode (anode).

The second electrode 19 faces the first electrode 12. The second electrode 19 may be a cathode, which is an electron injecting electrode. The material for forming the second electrode 19 may be a metal, an alloy, an electrically conductive compound (which materials have low-work functions), or a mixture thereof. For example, the second electrode 19 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some embodiments, to manufacture a top-emission light-emitting diode, the transmission electrode may be formed of indium tin oxide (ITO) or indium zinc oxide (IZO).

The EML 15 is between the first electrode 12 and the second electrode 19. The hole transfer region 13 is between the first electrode 12 and the EML 15. The electron transfer region 17 is between the EML 15 and the second electrode 19.

In the organic light-emitting diode 10, holes are injected through the first electrode 12 and migrate to the EML 15 through the hole transfer region 13, while electrons are injected through the second electrode 19 and migrate to the EML 15 through the electron transfer region 17. The holes and electrons recombine in the EML 15 to generate excitons. When the excitons drop from an excited state to a ground state, light is emitted.

A first compound represented by Formula 1 below is in the hole transfer region 13, and a second compound represented by Formula 100 below is in the emission layer 15.

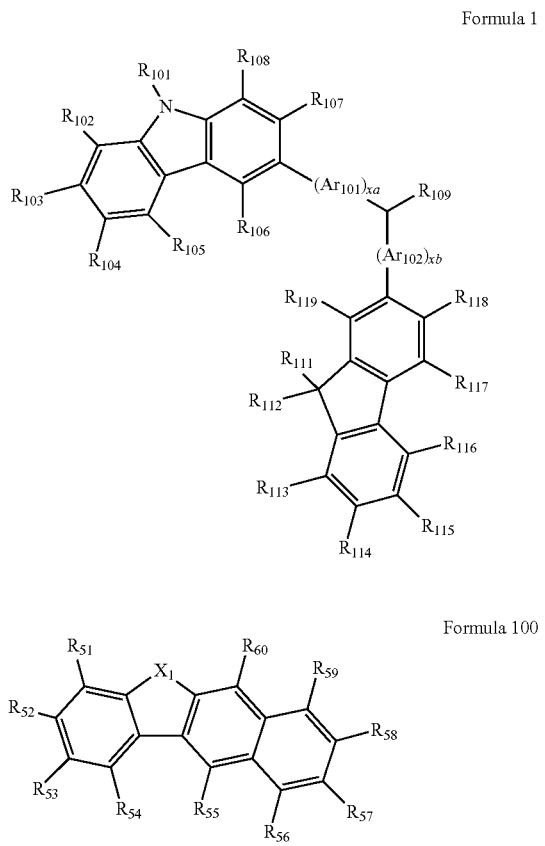

Formula 1

Formula 100

In Formula 1, $Ar_{101}$ and $Ar_{102}$ may be each independently a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group.

For example, in Formula 1, $Ar_{101}$ and $Ar_{102}$ may be each independently a substituted or unsubstituted phenylene group, a substituted or unsubstituted pentalenylene group, a substituted or unsubstituted indenylene group, a substituted or unsubstituted naphthalene group, a substituted or unsubstituted azulenylene group, a substituted or unsubstituted heptalenylene group, a substituted or unsubstituted indacenylene group, a substituted or unsubstituted acenaphthalene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzofuranylene group, a substituted or unsubstituted dibenzothiophenylene group, or a substituted or unsubstituted benzocarbazolyl group.

In some embodiments, $Ar_{101}$ and $Ar_{102}$ in Formula 1 may be each independently a moiety represented by one of Formulae 3-1 to 3-24:

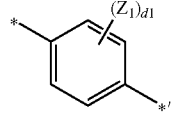

Formula 3-1

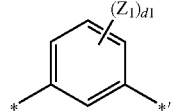

Formula 3-2

-continued
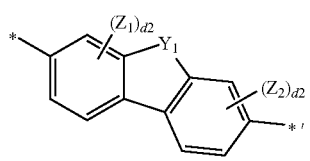
Formula 3-3
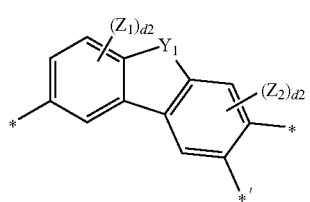
Formula 3-4
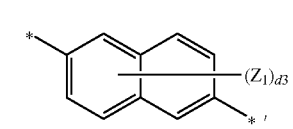
Formula 3-5
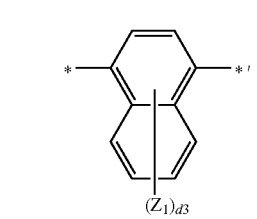
Formula 3-6
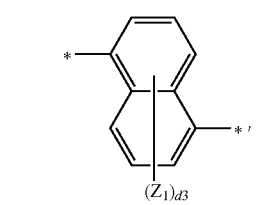
Formula 3-7
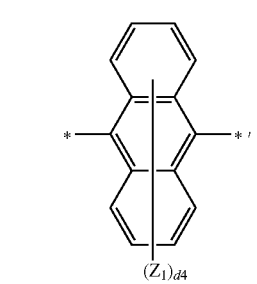
Formula 3-8
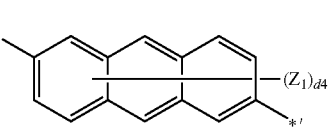
Formula 3-9
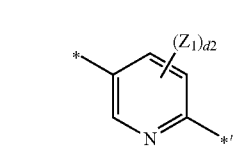
Formula 3-10
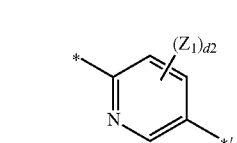
Formula 3-11
-continued
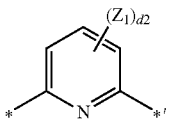
Formula 3-12
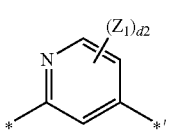
Formula 3-13
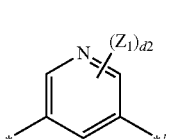
Formula 3-14
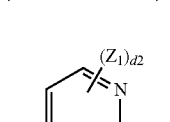
Formula 3-15
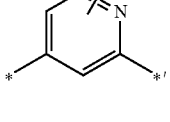
Formula 3-16
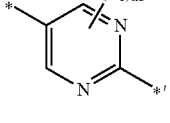
Formula 3-17
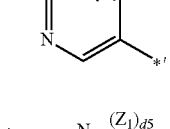
Formula 3-18
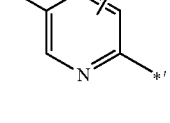
Formula 3-19
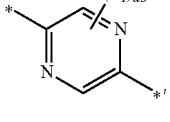
Formula 3-20
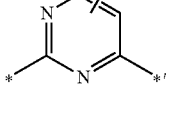
Formula 3-21
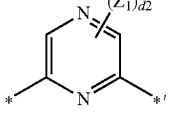
Formula 3-22
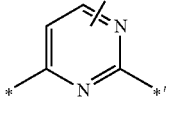

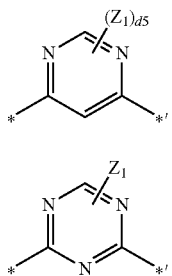

Formula 3-23

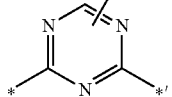

Formula 3-24

In Formulae 3-1 to 3-24, $Y_1$ may be O, S, $C(R_{21})(R_{22})$, or $N(R_{23})$.

In Formulae 3-1 to 3-24, $Z_1$, $Z_2$, and $R_{21}$ to $R_{23}$ may be each independently:

i) a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, or a $C_1$-$C_{20}$alkoxy group; or ii) a $C_1$-$C_{20}$alkyl group or a $C_1$-$C_{20}$alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof; or iii) a $C_6$-$C_{20}$aryl group or a $C_2$-$C_{20}$heteroaryl group; or iv) a $C_6$-$C_{20}$aryl group or a $C_2$-$C_{20}$heteroaryl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$ alkenyl group, a $C_2$-$C_{60}$ alkynyl group, a $C_1$-$C_{60}$alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group; or v) —$N(Q_1)(Q_{12})$ or —$Si(Q_{13})(Q_{14})(Q_{15})$, where $Q_{11}$ to $Q_{15}$ are each independently a $C_1$-$C_{20}$alkyl group, a $C_1$-$C_{20}$alkoxy group, a $C_6$-$C_{20}$aryl group, or a $C_2$-$C_{20}$heteroaryl group.

For example, $Z_1$, $Z_2$, and $R_{21}$ to $R_{23}$ may be each independently:

i) a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, or a $C_1$-$C_{20}$alkoxy group; or ii) a $C_1$-$C_{20}$alkyl group or a $C_1$-$C_{20}$alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof; or iii) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group; or iv) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group; or v) —$N(Q_{11})(Q_{12})$ or $Si(Q_{13})(Q_{14})(Q_{15})$, where $Q_{11}$ to $Q_{15}$ are each independently a $C_1$-$C_{20}$ alkyl group, a $C_1$-$C_{20}$ alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

However, $Z_1$, $Z_2$, and $R_{21}$ to $R_{23}$ are not limited to the above listed moieties.

In Formulae 3-1 to 3-24 above, d1 may be an integer of 1 to 4, d2 may be an integer of 1 to 3, d3 may be an integer of 1 to 6, d4 may be an integer of 1 to 8, and d5 may be an integer of 1 or 2.

In some embodiments, $Ar_{101}$ and $Ar_{102}$ in Formula 1 may each independently be a moiety represented by one of Formulae 4-1 to 4-7 below, but $Ar_{101}$ and $Ar_{102}$ are not limited thereto:

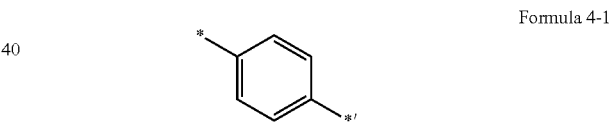

Formula 4-1

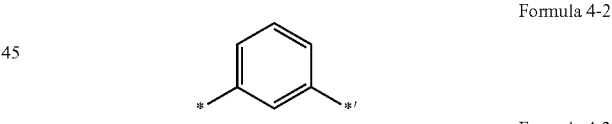

Formula 4-2

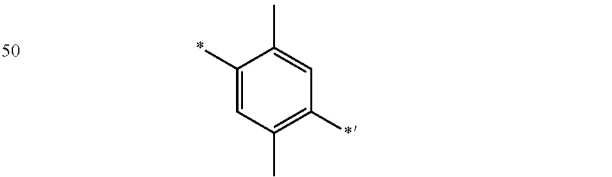

Formula 4-3

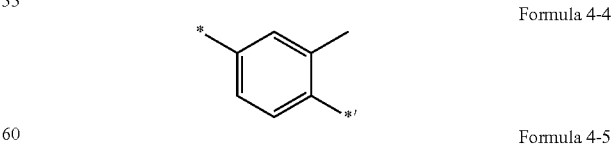

Formula 4-4

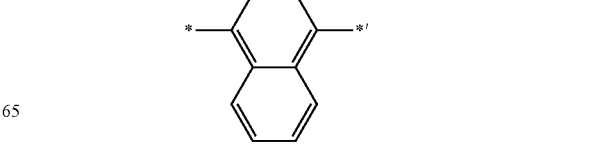

Formula 4-5

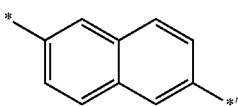

Formula 4-6

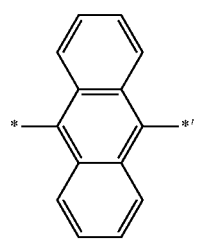

Formula 4-7

In Formula 1 above, xa indicates the number of $Ar_{101}$s, and xb indicates the number of $Ar_{102}$s, and xa and xb may each independently be an integer of 0 to 5. When xa and/or xb is 0, the "carbazole" and/or "fluorene" in Formula 1 may be linked directly to "N". When xa is 2 or greater, the at least two $Ar_{101}$s may be identical to or different from each other. When xb is 2 or greater, the at least two $Ar_{102}$s may be identical to or different from each other.

In some embodiments, in Formula 1, i) xa=0 and xb=0; ii) xa=1 and xb=0; iii) xa=2 and xb=0; iv) xa=0 and xb=1; v) xa=0 and xb=2; or vi) xa=1 and xb=1, but the present invention is not limited thereto.

In Formula 1, $R_{101}$ and $R_{109}$ may each independently be a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, or a substituted or unsubstituted $C_2$-$C_{60}$heteroaryl group.

For example, in Formula 1, $R_{101}$ and $R_{109}$ may each independently be a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spirofluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzopuranyl group, a substituted or unsubstituted dibenzothiophenyl group, or a substituted or unsubstituted benzocarbazolyl group.

In some other embodiments, $R_{101}$ and $R_{109}$ may each independently be a moiety represented by one of Formulae 5-1 to 5-22 below:

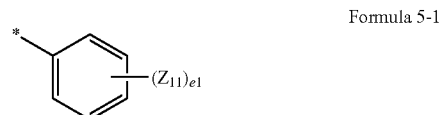

Formula 5-1

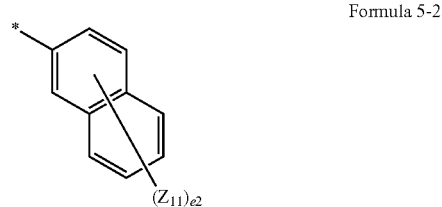

Formula 5-2

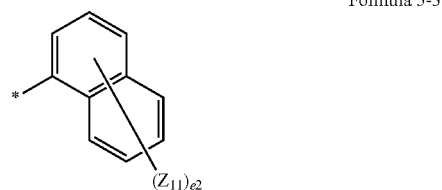

Formula 5-3

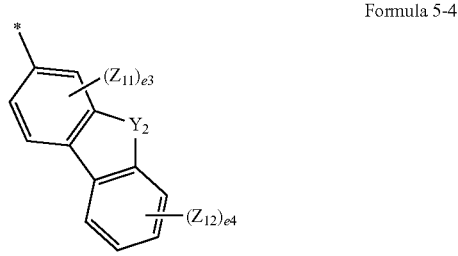

Formula 5-4

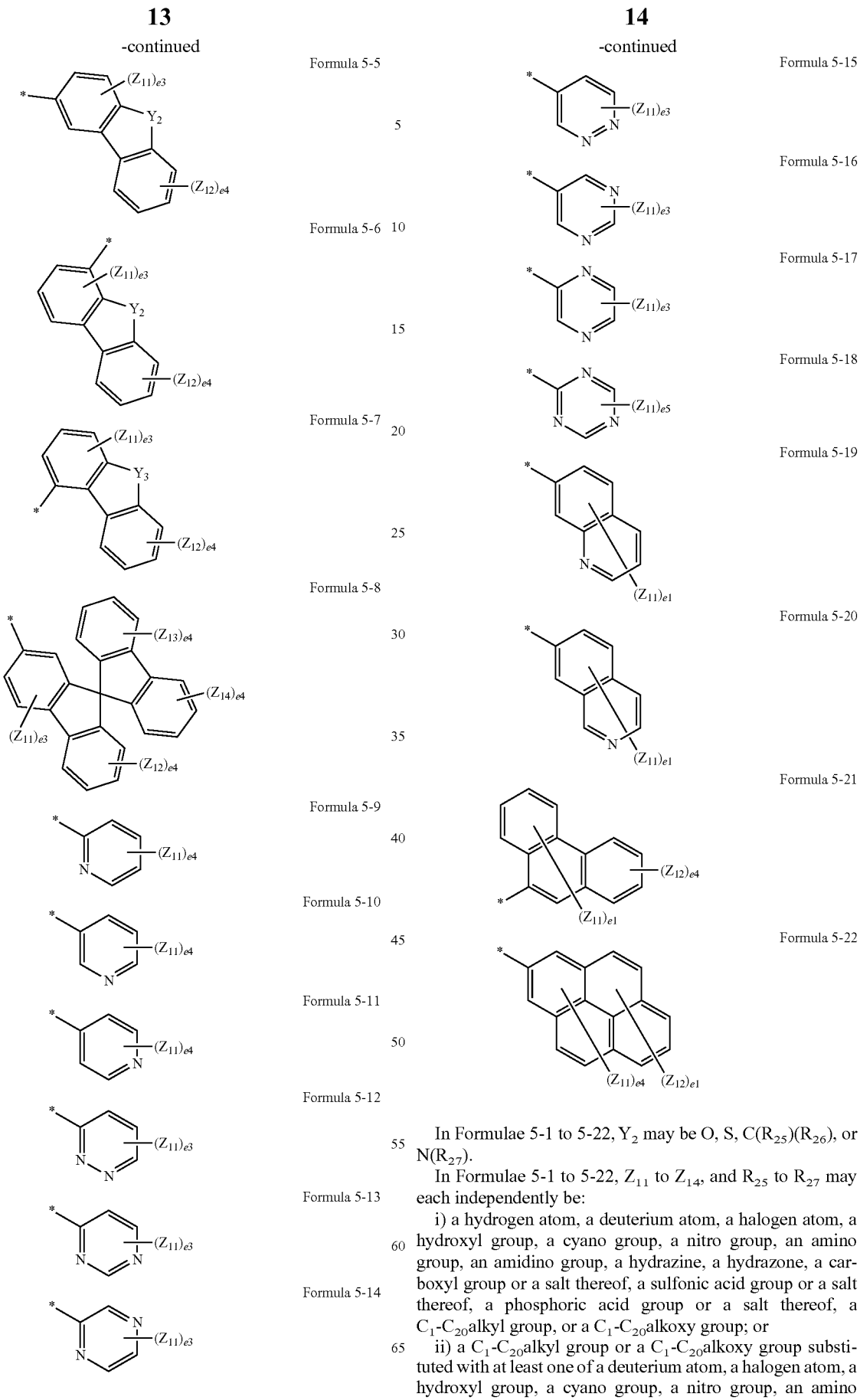

In Formulae 5-1 to 5-22, $Y_2$ may be O, S, $C(R_{25})(R_{26})$, or $N(R_{27})$.

In Formulae 5-1 to 5-22, $Z_{11}$ to $Z_{14}$, and $R_{25}$ to $R_{27}$ may each independently be:

i) a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, or a $C_1$-$C_{20}$alkoxy group; or ii) a $C_1$-$C_{20}$alkyl group or a $C_1$-$C_{20}$alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof; or iii) a $C_6$-$C_{20}$aryl group or a $C_2$-$C_{20}$heteroaryl group; or iv) a $C_6$-$C_{20}$aryl group or a $C_2$-$C_{20}$heteroaryl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{60}$alkyl group, a $C_2$-$C_{60}$ an alkenyl group $C_2$-$C_{60}$ an alkynyl group, $C_1$-$C_{60}$alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group; or v) —N($Q_{11}$)($Q_{12}$) or Si($Q_{13}$)($Q_{14}$)($Q_{15}$), where $Q_{11}$ to $Q_{15}$ are each independently a $C_1$-$C_{20}$alkyl group, a $C_1$-$C_{20}$alkoxy group, a $C_6$-$C_{20}$aryl group, or a $C_2$-$C_{20}$heteroaryl group.

For example, $Z_{11}$ to $Z_{14}$, and $R_{25}$ to $R_{27}$ may each independently be:

i) a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{20}$alkyl group, or a $C_1$-$C_{20}$alkoxy group; or ii) a $C_1$-$C_{20}$alkyl group or a $C_1$-$C_{20}$alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; or iii) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group; or iv) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group; or v) —N($Q_{11}$)($Q_{12}$) or —Si($Q_{13}$)($Q_{14}$)($Q_{15}$), where $Q_{11}$ to $Q_{15}$ are each independently a $C_1$-$C_{20}$alkyl group, a $C_1$-$C_{20}$alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

However, $Z_{11}$ to $Z_{14}$, and $R_{25}$ to $R_{27}$ are not limited to the above moieties.

In Formulae 5-1 to 5-22, e1 may be an integer of 1 to 5, e2 may be an integer of 1 to 7, e3 may be an integer or 1 to 3, e4 may be an integer or 1 to 4, and e5 may be an integer of 1 or 2.

For example, $R_{101}$ in Formula 1 may be a group represented by one of Formulae 6-1 to 6-8 below, and $R_{109}$ in Formula 1 may be a group represented by one of Formulae Formula 6-1 to 6-11 below:

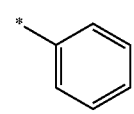

Formula 6-1

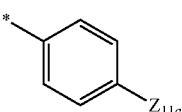

Formula 6-2

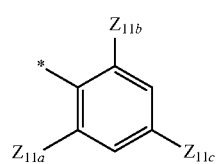

Formula 6-3

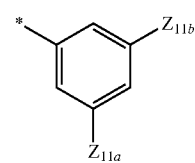

Formula 6-4

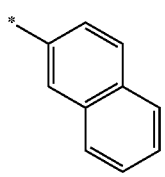

Formula 6-5

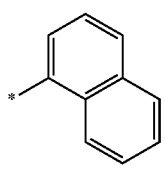

Formula 6-6

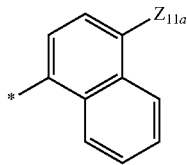

Formula 6-7

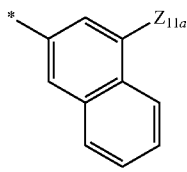

Formula 6-8

-continued

Formula 6-9

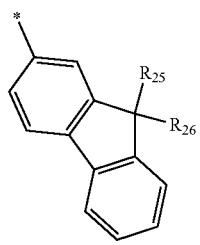

Formula 6-10

Formula 6-11

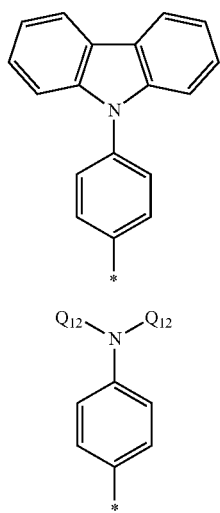

In Formulae 6-1 to 6-11, $Z_{11a}$ to $Z_{11c}$ are the same as $Z_{11}$ described above, and $R_{25}$, $R_{26}$, $Q_{11}$, and $Q_{12}$ are as described herein.

For example, in Formulae 6-1 to 6-11, $Z_{11a}$ to $Z_{11c}$, $R_{25}$, and $R_{26}$ may each independently be:

i) a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, or a $C_1$-$C_{20}$alkoxy group; or ii) a $C_1$-$C_{20}$alkyl group or a $C_1$-$C_{20}$alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof; or iii) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group; or iv) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

However, $Z_{11a}$ to $Z_{11c}$, $R_{25}$, and $R_{26}$ are not limited to the above listed moieties.

$Q_{11}$ and $Q_{12}$ may each independently be a $C_1$-$C_{20}$ alkyl group, a $C_1$-$C_{20}$alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

However, $Q_{11}$ and $Q_{12}$ are not limited to the above listed moieties.

For example, $R_{111}$ and $R_{112}$ in Formula 1 may each independently be:

i) a $C_1$-$C_{20}$ alkyl group, or ii) a $C_1$-$C_{20}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof, or iii) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group, or iv) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

In Formula 100, $R_{56}$ and $R_{57}$ may be linked to each other to form a substituted or unsubstituted $C_3$-$C_{60}$cyclic moiety, or a substituted or unsubstituted $C_2$-$C_{60}$ heterocyclic moiety; and $R_{51}$ to $R_{55}$ and $R_{58}$ to $R_{60}$ may be each independently a substituent represented by $-(Ar_{51})_q-(Ar_{61})$. In some alternative embodiments, in Formula 100, $R_{58}$ and $R_{59}$ may be linked to each other to form a substituted or unsubstituted $C_3$-$C_{60}$ cyclic moiety, or a substituted or unsubstituted $C_2$-$C_{60}$ heterocyclic moiety; and $R_{51}$ to $R_{57}$ and $R_{60}$ may be each independently a substituent represented by $-(Ar_{51})_q-(Ar_{61})$.

In some embodiments, the second compound may be a compound represented by Formula 100A or 100B below:

Formula 100A

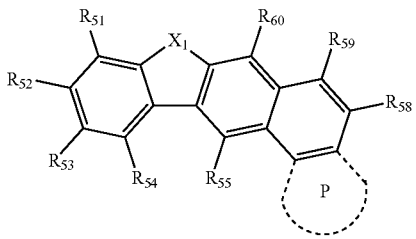

-continued

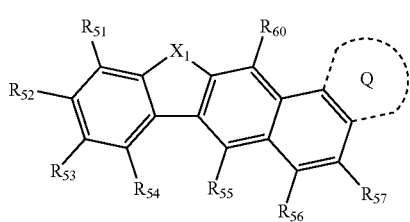

Formula 100B

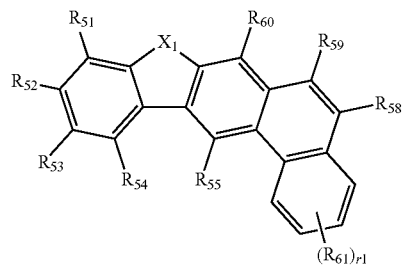

Formula 100A-1

In Formulae 100A and 100B, $X_1$ and $R_{51}$ to $R_{60}$ are the same as described above.

In Formulae 100A and 100B, the ring P and the ring Q may each independently be:

i) benzene, naphthalene, fluorene, carbazole, dibenzofuran, or dibenzothiophene; or ii) benzene, naphthalene, fluorene, carbazole, dibenzofuran, or dibenzothiophene substituted with at least one of:

ii)a) a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group, or ii)b) a $C_1$-$C_{20}$ alkyl group or a $C_1$-$C_{60}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof, or ii)c) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group, or ii)d) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group, or ii)e) —N($Q_{11}$)($Q_{12}$), where $Q_{11}$ and $Q_{12}$ may each independently be a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

In some embodiments, $R_{51}$ to $R_{54}$ in Formulae 100A and 100B may all be hydrogen atoms.

In some other embodiments, the second compound may be a compound represented by one of Formulae 100A-1 to 100A-8 and 100B-1 to 100B-8, but is not limited thereto:

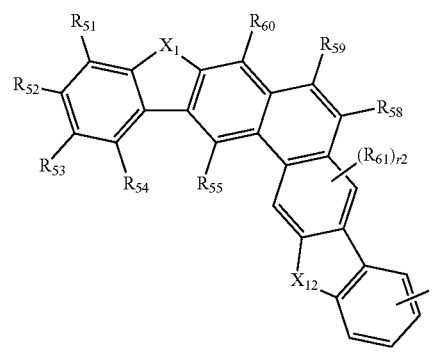

Formula 100A-2

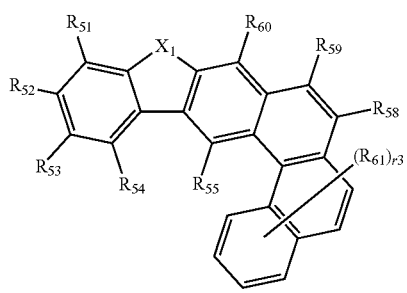

Formula 100A-3

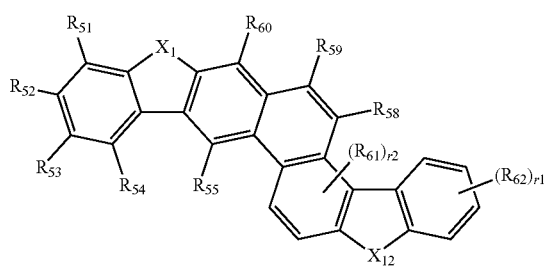

Formula 100A-4

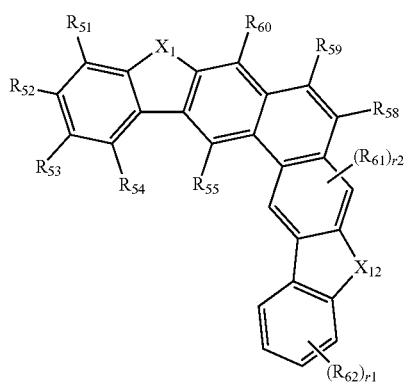

Formula 100A-5

Formula 100A-6
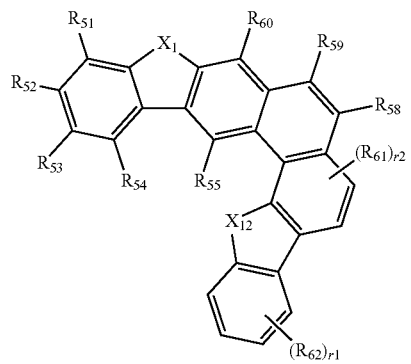
Formula 100A-7
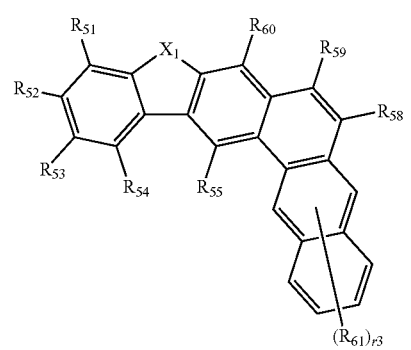
Formula 100A-8
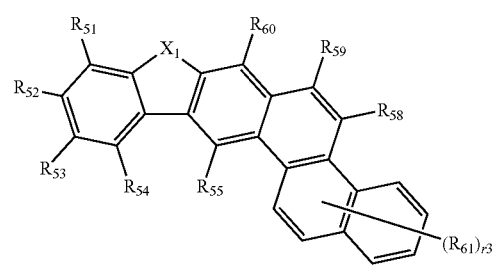
Formula 100B-1
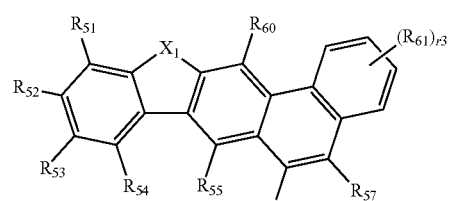
Formula 100B-2
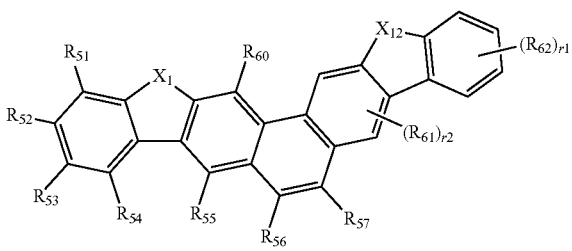
Formula 100B-3
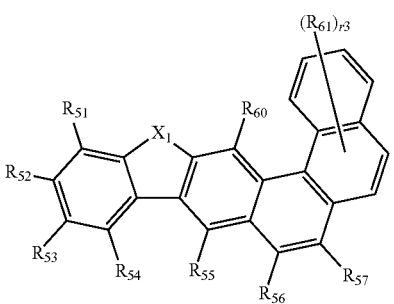
Formula 100B-4
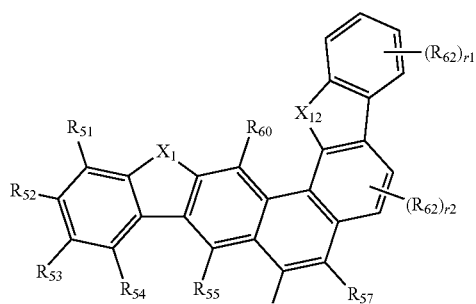
Formula 100B-5
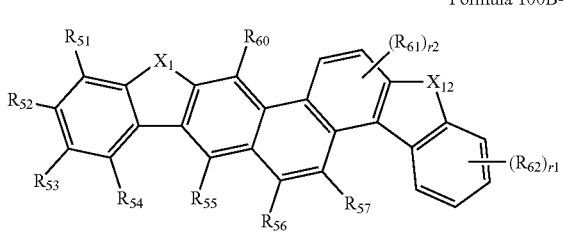
Formula 100B-6
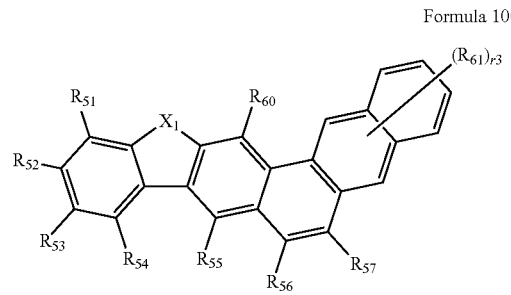
Formula 100B-7
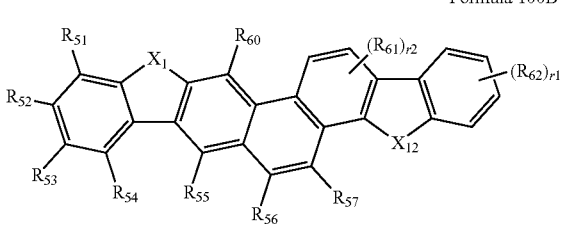

-continued

Formula 100B-8

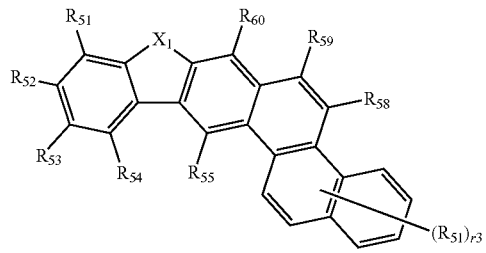

In Formulae 100A-1 to 100A-8 and 100B-1 to 100B-8 $R_{51}$ to $R_{60}$, and $X_1$ are as described above. $X_{12}$ may be O, S, $C(R_{71})(R_{72})$, or $N(R_{73})$.

$R_{61}$, $R_{62}$, and $R_{71}$ to $R_{73}$ may each independently be:

i) a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, or ii) a $C_1$-$C_{60}$ alkyl group, a $C_2$-$C_{60}$ alkenyl group, a $C_2$-$C_{60}$ alkynyl group, or a $C_1$-$C_{60}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof, or iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group, or iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group, or v) —$N(Q_{11})(Q_{12})$, or —$Si(Q_{11})(Q_{12})(Q_{13})$, where $Q_{11}$ and $Q_{12}$ are each independently a $C_6$-$C_{60}$ aryl group or a $C_2$-$C_{60}$ heteroaryl group, and $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group.

r1 may be an integer of 1 to 4, r2 may be 1 or 2; and r3 may be an integer of 1 to 6.

For example, in Formulae 100A-1 to 100A-8 and 100B-1 to 100B-8, $R_{61}$, $R_{62}$, and $R_{71}$ to $R_{73}$ may each independently be:

i) a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group, or ii) a $C_1$-$C_{20}$ alkyl group or a $C_1$-$C_{20}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof, or iii) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group, or iv) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group, or v) —$N(Q_{11})(Q_{12})$, or —$Si(Q_{11})(Q_{12})(Q_{13})$, where $Q_{11}$ and $Q_{12}$ are each independently a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group; and $Q_{13}$ to $Q_{15}$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

However, $R_{71}$ to $R_{73}$ are not limited to the above listed moieties.

In Formula 100, $Ar_{51}$ may be a substituted or unsubstituted phenylene group, a substituted or unsubstituted pentalenylene group, a substituted or unsubstituted indenylene group, a substituted or unsubstituted naphthalene group, a substituted or unsubstituted azulenylene group, a substituted or unsubstituted heptalenylene group, a substituted or unsubstituted indacenylene group, a substituted or unsubstituted acenaphthalene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzopuranylene group, a substituted or unsubstituted dibenzothiophenylene group, or a substituted or unsubstituted benzocarbazolylene group. However, $Ar_{51}$ is not limited thereto.

In some embodiments, in Formula 100, $Ar_{51}$ may be:

i) a phenylene group, a naphthalene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, or a dibenzothiophenylene group, or ii) a phenylene group, a naphthalene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, or a dibenzothiophenylene group substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

In some other embodiments, in Formula 100, $Ar_{51}$ may be a group represented by Formulae 102-1 to 102-5:

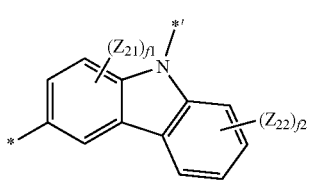

Formula 102-1

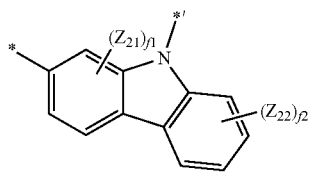

Formula 102-2

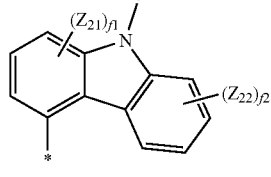

Formula 102-3

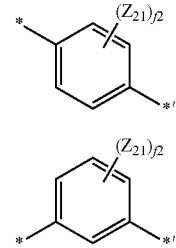

Formula 102-4

Formula 102-5

In Formulae 102-1 to 102-5, $Z_{21}$ and $Z_{22}$ may each independently be a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

$f_1$ may be an integer of 1 to 3;

$f_2$ may be an integer of 1 to 4.

* indicates a binding site to the core of Formula 1, or a binding site to another $Ar_{50}$ or $Ar_{51}$ adjacent to the core.

*' indicates a binding site to another $Ar_{51}$ or $Ar_{61}$ that is spaced apart from the core of Formula 1. However, $Z_{21}$, $Z_{22}$, $f_1$, $f_2$, *, *' are not limited to the above.

In Formula 100, $Ar_{61}$ may be a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzopuranyl group, a substituted or unsubstituted dibenzothiophenyl group, a substituted or unsubstituted benzocarbazoly group, or —N($Q_{21}$)($Q_{22}$).

$Q_{21}$ and $Q_{22}$ may each independently be a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

In some other embodiments, $Ar_{61}$ in Formula 100 may be a group represented by one of Formulae 103-1 to 103-16:

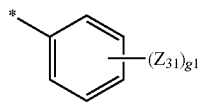

Formula 103-1

Formula 103-2

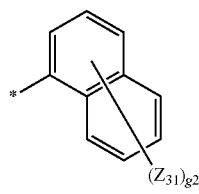

Formula 103-3

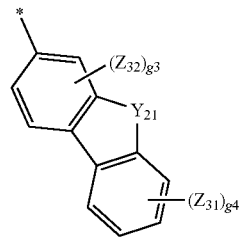

Formula 103-4

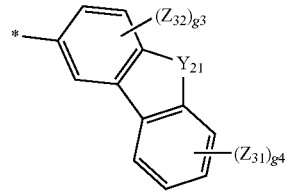

Formula 103-5

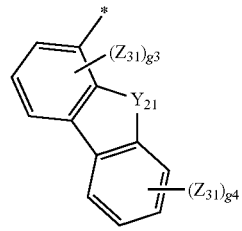

Formula 103-6

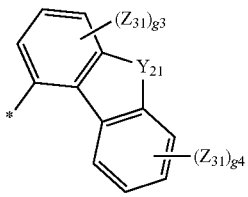

Formula 103-7

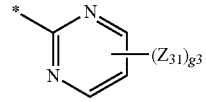

Formula 103-8

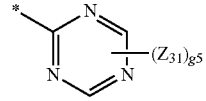

Formula 103-9

Formula 103-10

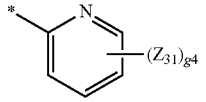

Formula 103-11

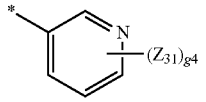

Formula 103-12

-continued

Formula 103-13

Formula 103-14

Formula 103-15

Formula 103-16

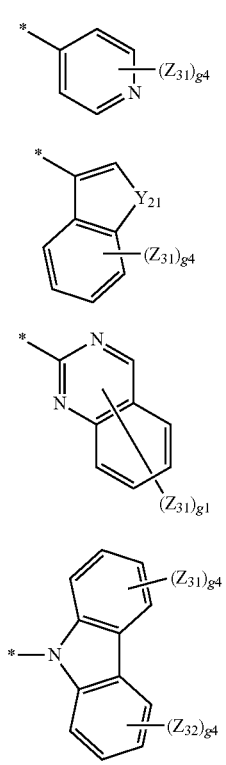

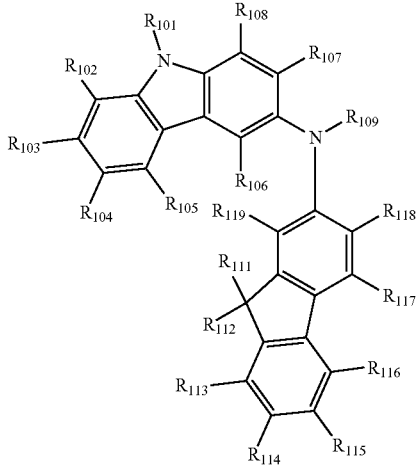

Formula 1A

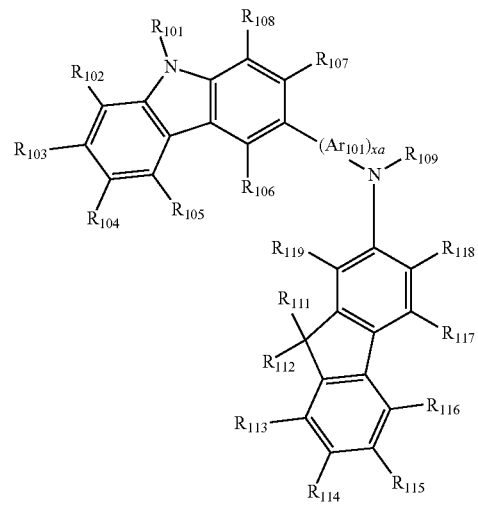

Formula 1B

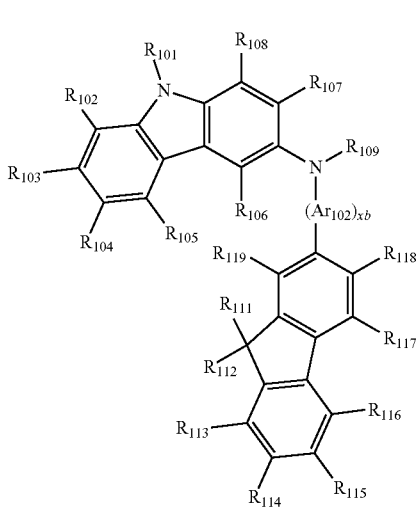

Formula 1C

In Formulae 103-1 to 103-16, $Y_{21}$ may be O, S, $C(Z_{41})(Z_{42})$, or $N(Z_{43})$. $Z_{31}$, $Z_{32}$, and $Z_{41}$ to $Z_{43}$ may each independently be a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

$Q_{21}$ and $Q_{22}$ may each independently be a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

g1 may be an integer of 1 to 5, g2 may be an integer of 1 to 7, g3 may be an integer of 1 to 3, g4 may be an integer of 1 to 4, and g5 may be 1 or 2.

However, $Y_{21}$, $Z_{31}$, $Z_{32}$, $Z_{41}$ to $Z_{43}$, $Q_{21}$, $Q_{22}$, g1, g2, g3, g4 and g5 are not limited thereto.

In Formula 100, "q" in $-(Ar_{51})_q-(Ar_{61})$ indicates the number of $Ar_{51}$s, and may be an integer of 0 to 5. When q is 0, $Ar_{51}$ is directly linked to the core of Formula 100. When q is 2 or greater, the two or more $Ar_{51}$s may be identical to or different from each other.

In some embodiments, the first compound may be a compound represented by Formula 1A, 1B, or 1C below:

The substituents in Formulae 1A, 1B, and 1C are the same as those described above.

For example, in Formulae 1A, 1B, and 1C, $Ar_{101}$ and $Ar_{102}$ may each independently be a group represented by one of Formulae 3-1 to 3-24.

xa and xb may each independently be 1 or 2.

$R_{101}$ and $R_{109}$ may each independently be a group represented by one of Formulae 5-1 to 5-22.

$R_{111}$ and $R_{112}$ may each independently be:

i) a $C_1$-$C_{20}$ alkyl group; or ii) a $C_1$-$C_{20}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof, or iii) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group, or iv) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

$R_{102}$ to $R_{108}$ and $R_{113}$ to $R_{119}$ may each independently be:

i) a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, or a $C_1$-$C_{20}$alkoxy group, or ii) a $C_1$-$C_{20}$alkyl group or a $C_1$-$C_{20}$alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof, or iii) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group, or iv) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

However, $Ar_{101}$, $Ar_{102}$, xa, xb, $R_{101}$, $R_{109}$, $R_{111}$, $R_{112}$, $R_{102}$ to $R_{108}$, and $R_{113}$ to $R_{119}$ are not limited to the above.

For example, in Formulae 1A, 1B, and 1C $Ar_{101}$ and $Ar_{102}$ may each independently be a group represented by one of Formulae 4-1 to 4-7.

xa and xb may be each independently 1 or 2.

$R_{101}$ may be a group represented by one of Formulae 6-1 to 6-8.

$R_{109}$ may be a group represented by one of Formulae 6-1 to 6-11.

$R_{111}$ and $R_{112}$ may each independently be:

i) a $C_1$-$C_{20}$ alkyl group; or ii) a $C_1$-$C_{20}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof; or iii) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group; or iv) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

$R_{102}$ to $R_{108}$ and $R_{113}$ to $R_{119}$ may be hydrogen atoms.

In some other embodiments, the second compound may be a compound represented by Formula 100A-H1, 100A-H2, 100B-H1, or 100B-H2:

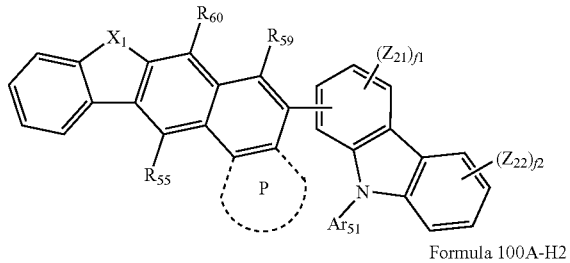

Formula 100A-H1

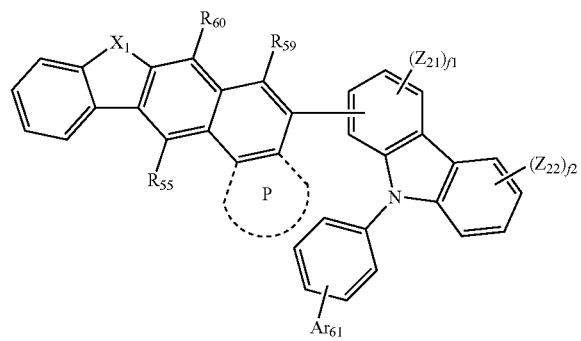

Formula 100A-H2

-continued

Formula 100B-H1

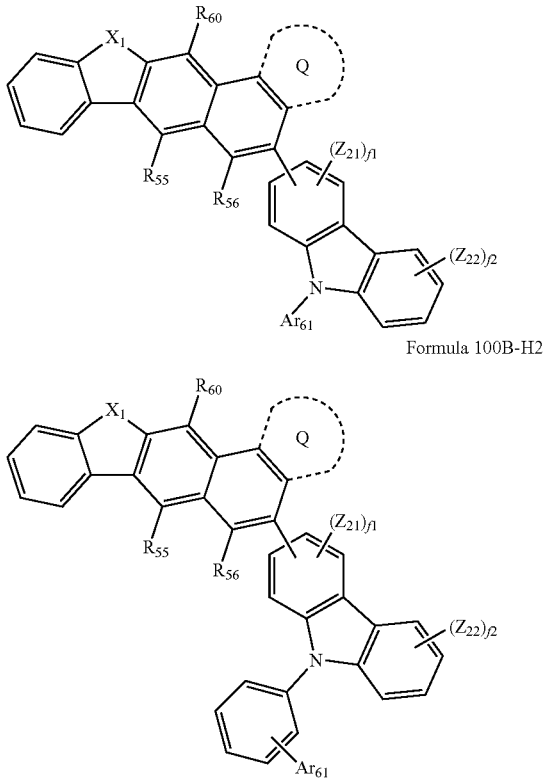

Formula 100B-H2

In Formulae 100A-H1, 100A-H2, 100B-H1, and 100B-H2, $X_1$ may be O or S.

The ring P and the ring Q may each independently be:

i) benzene, naphthalene, fluorene, carbazole, dibenzofuran, or dibenzothiophene, or ii) benzene, naphthalene, fluorene, carbazole, dibenzofuran, or dibenzothiophene substituted with at least one of:

ii)a) a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group, or ii)b) a $C_1$-$C_{20}$ alkyl group or a $C_1$-$C_{60}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof, or ii)c) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group, or ii)d) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group, or ii)e) —N($Q_{11}$)($Q_{12}$) where $Q_{11}$ and $Q_{12}$ may each independently be a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

$R_{55}$, $R_{56}$, $R_{59}$, $R_{60}$, $Z_{21}$, and $Z_{22}$ may each independently be a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

f1 and f2 may each independently be 0, 1, or 2.

$Ar_{61}$ may be a group represented by one of Formulae 103-1 to 103-16.

In some other embodiments, the first compound of Formula 1 may be one of Compounds 1-1 to 1-19 below, but is not limited thereto:

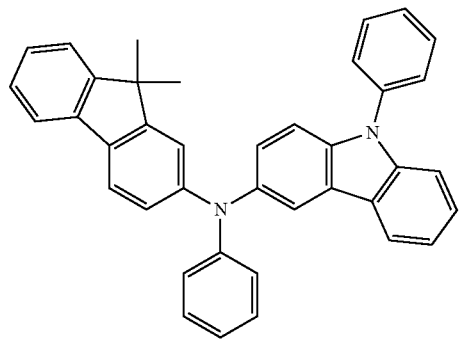

1-1

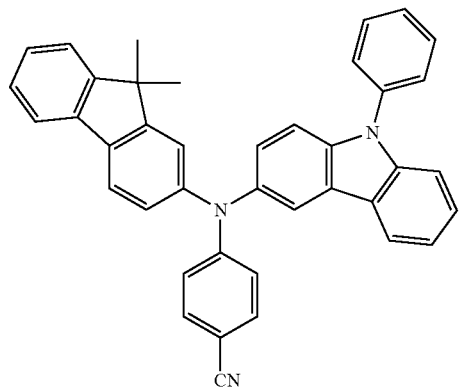

1-2

1-3
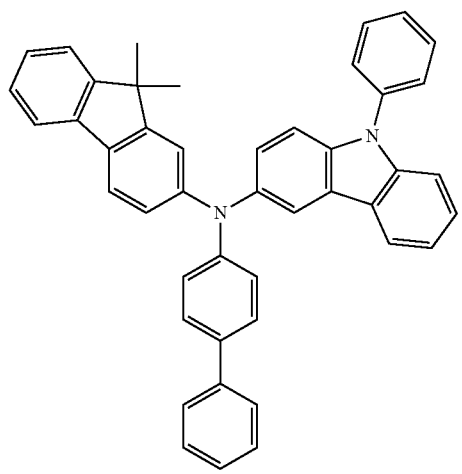
1-4
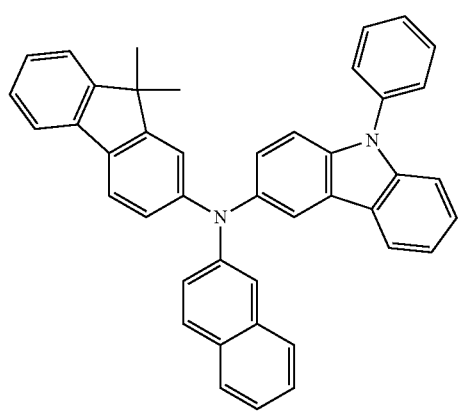
1-5
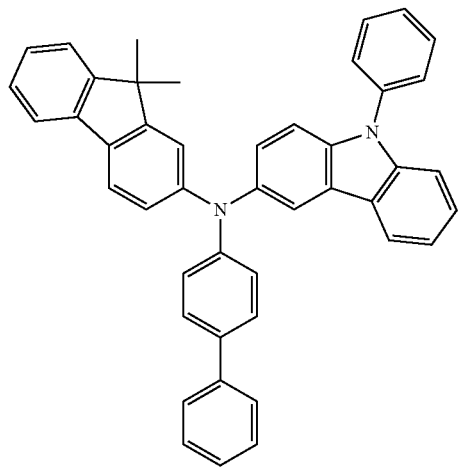
1-6
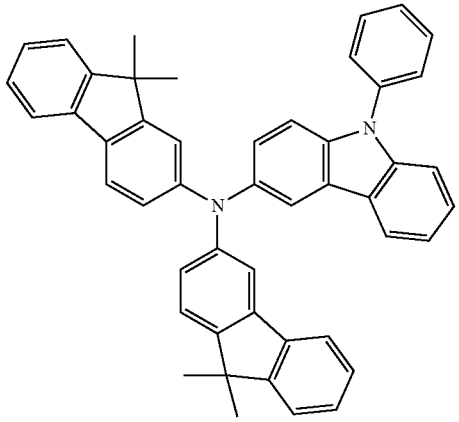
1-7
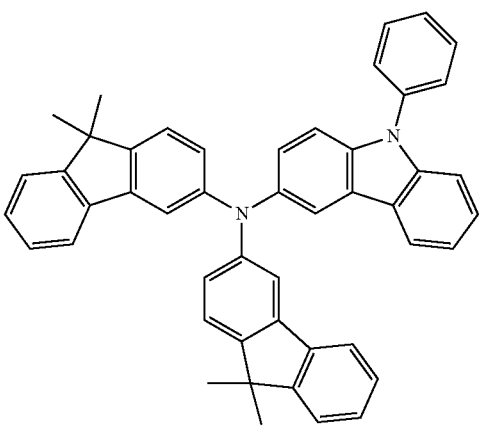
1-8
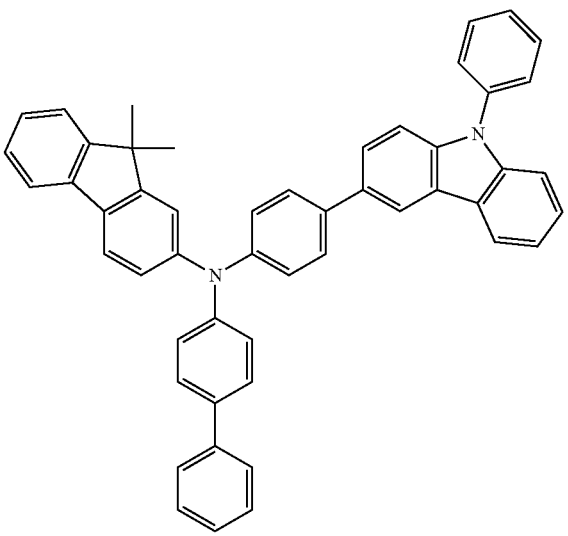

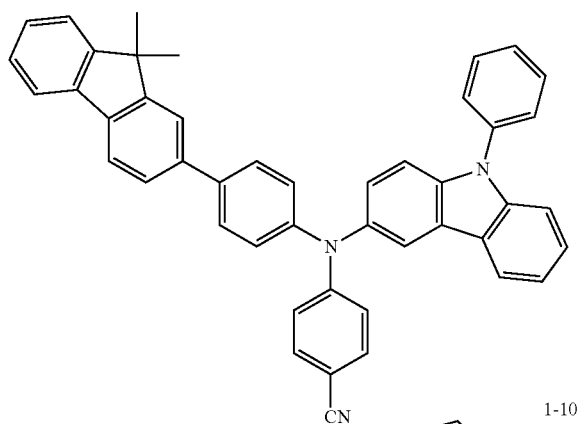
1-9
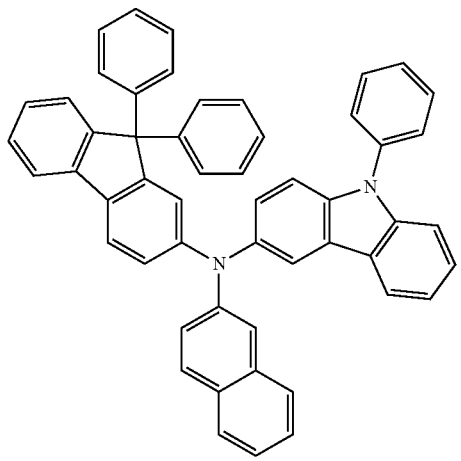
1-13
1-10
1-14
1-11
1-12
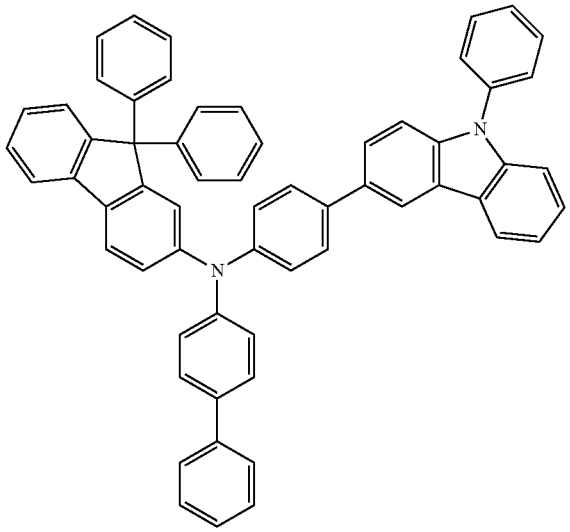
1-15
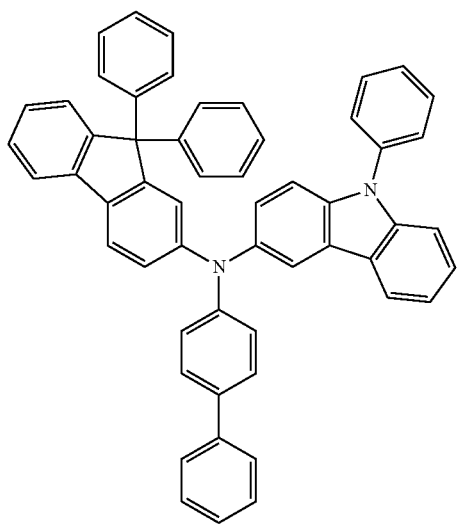

1-16
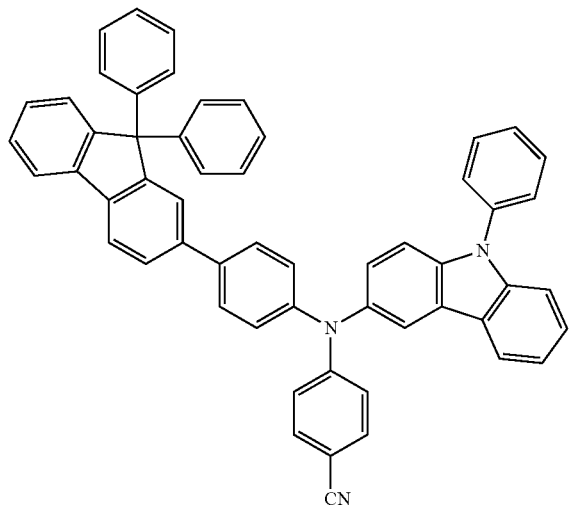
1-17
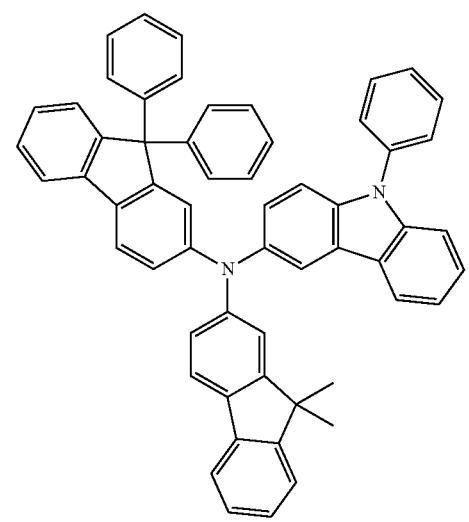
1-18
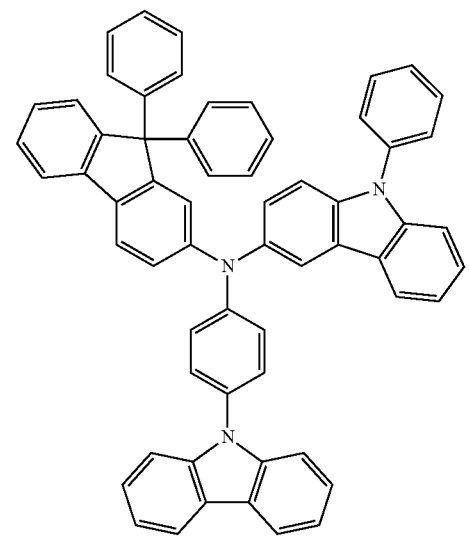
1-19
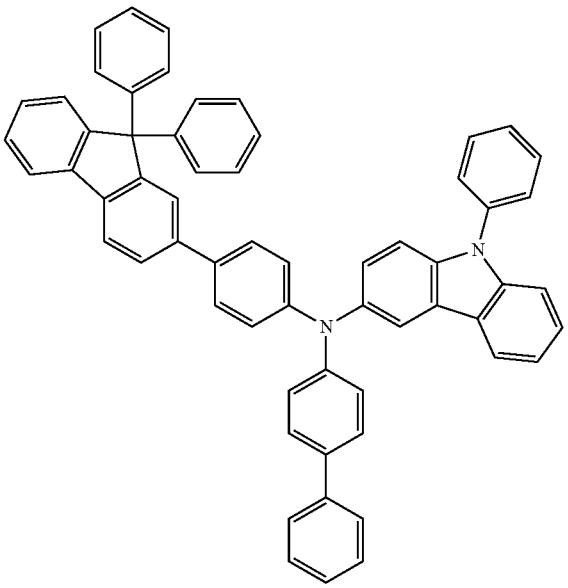
In some other embodiments, the second compound of Formula 100 may be one of Compounds 2-1 to 2-25 below, but is not limited thereto:
2-1
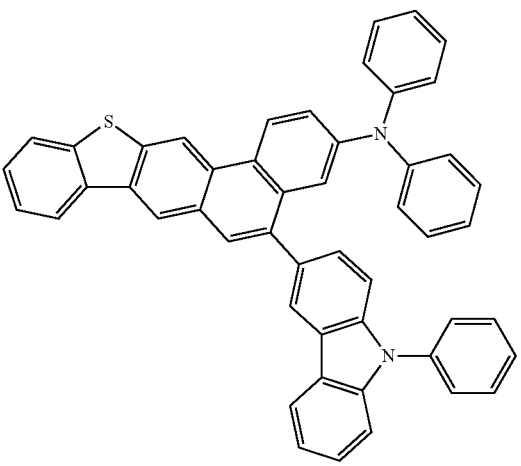
2-2
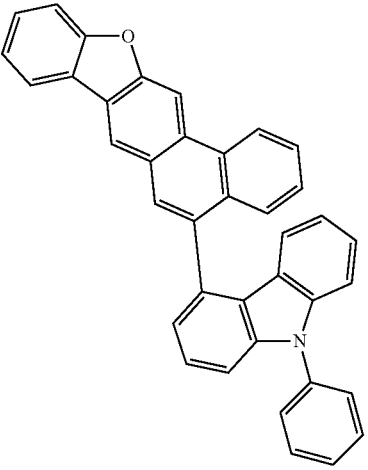

2-3
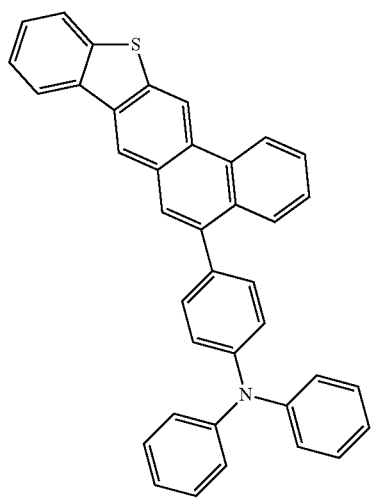
2-4
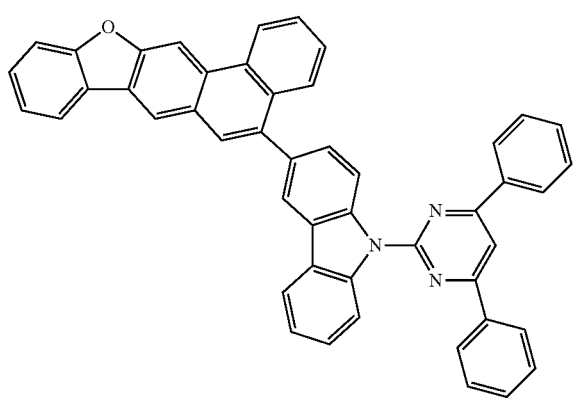
2-5
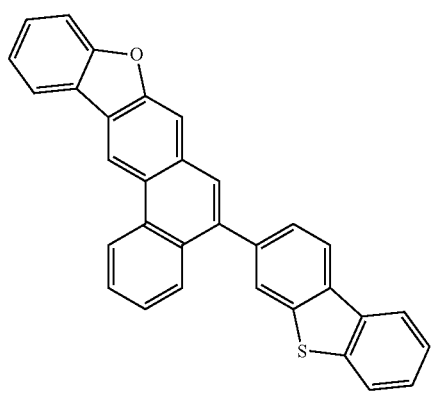
2-6
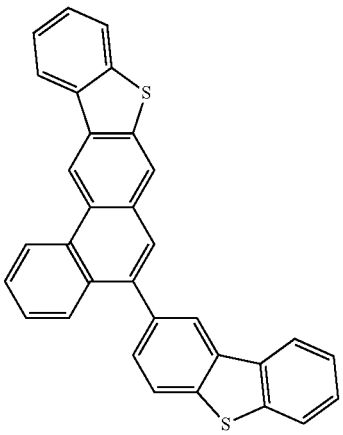
2-7
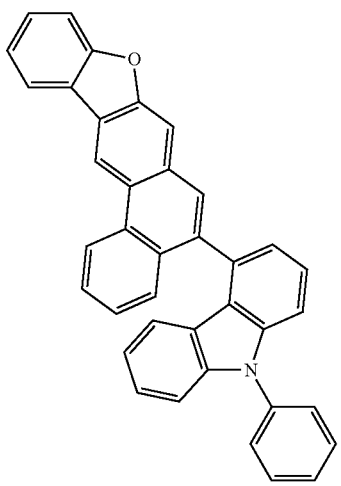
2-8
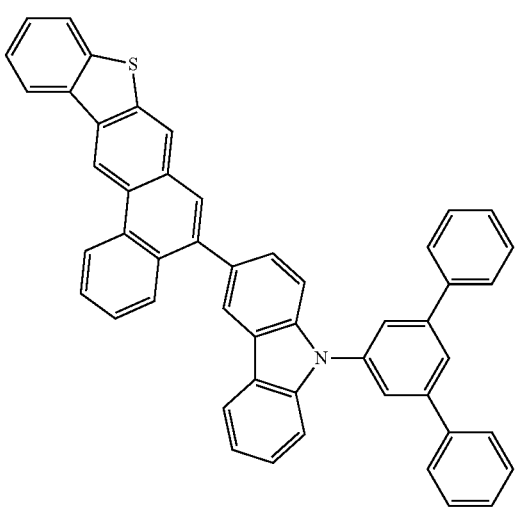

2-9
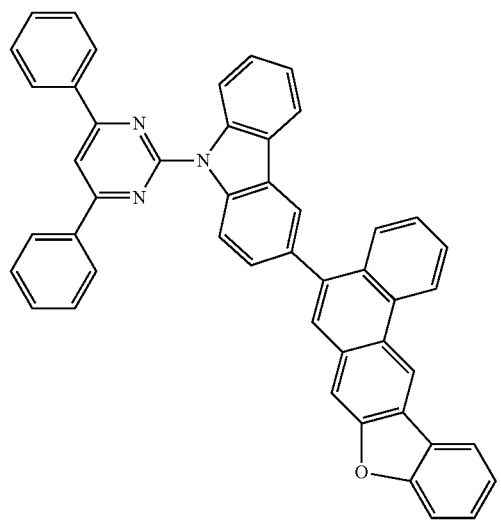
2-12
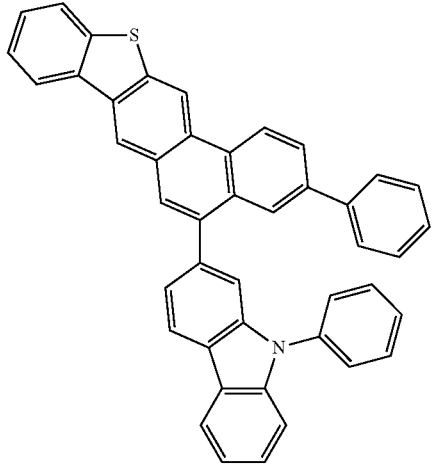
2-10
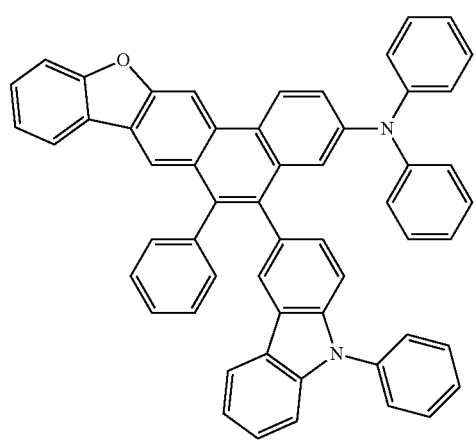
2-13
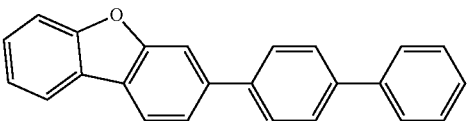
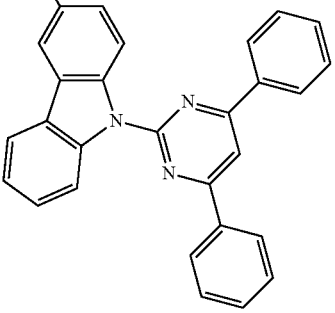
2-11
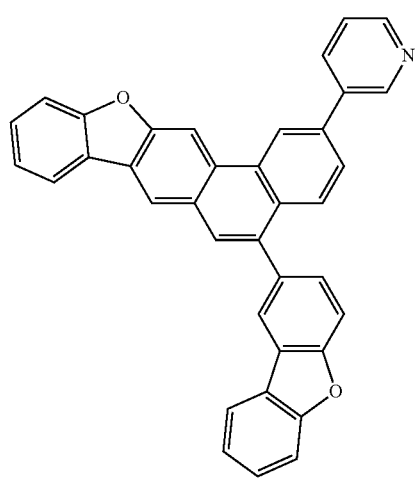
2-14
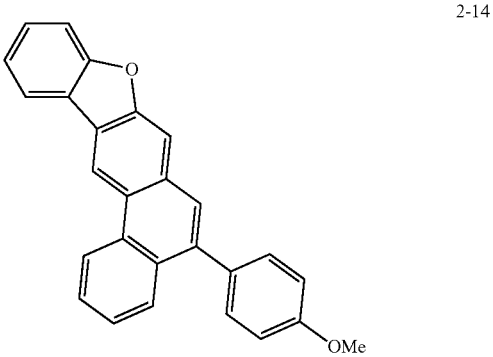

2-15
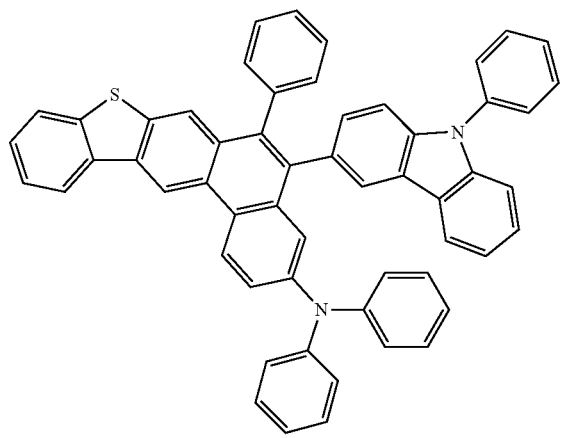
2-18
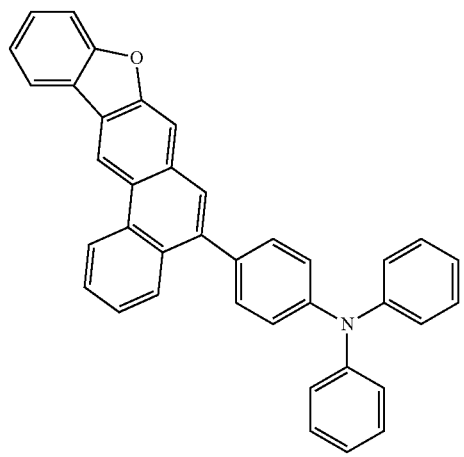
2-16
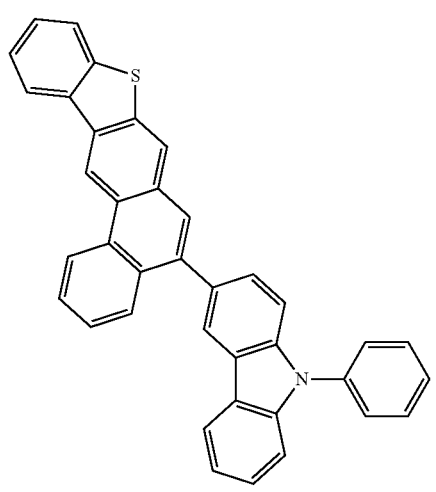
2-19
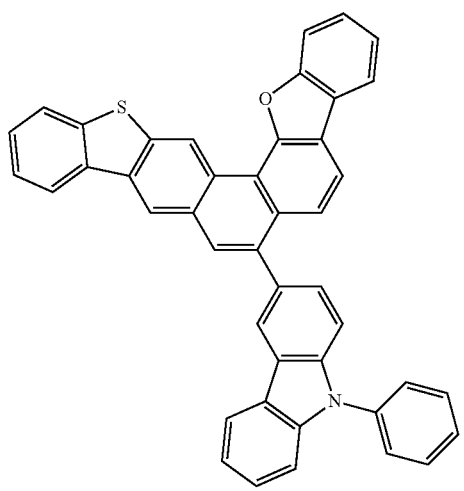
2-17
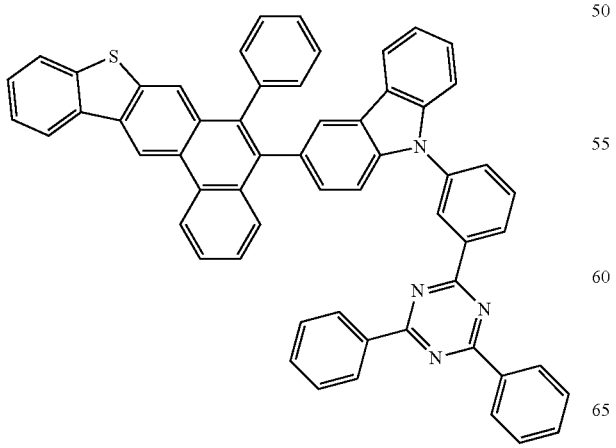
2-20
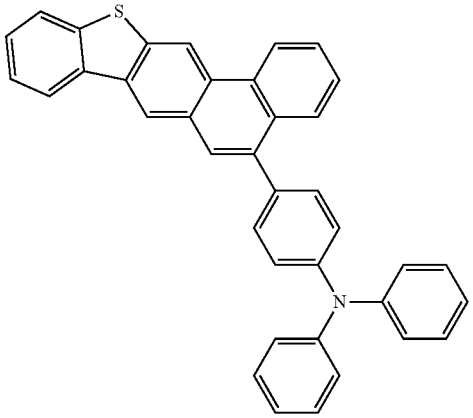

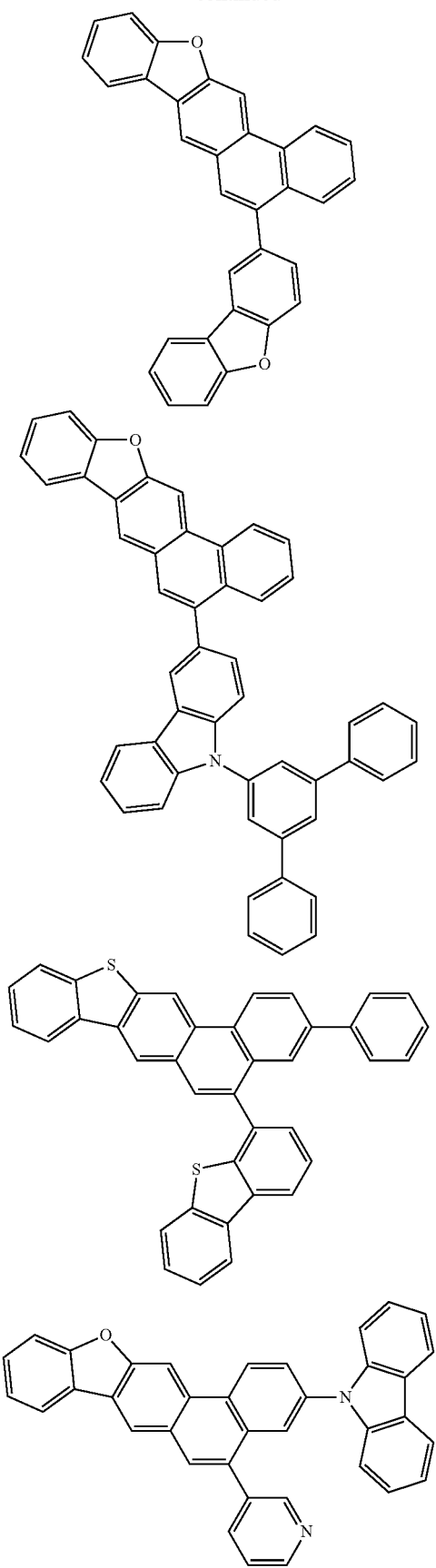

2-21

2-22

2-23

2-24

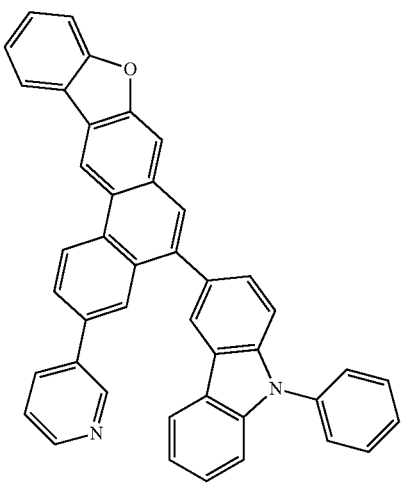

2-25

Each of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$arylene group, the substituted $C_2$-$C_{60}$heteroarylene group, the substituted $C_3$-$C_{10}$cycloalkyl group the substituted $C_2$-$C_{10}$heterocycloalkyl group the substituted $C_3$-$C_{10}$cycloalkenyl group the substituted $C_2$-$C_{10}$heterocycloalkenyl group the substituted $C_6$-$C_{60}$aryl group, the substituted $C_2$-$C_{60}$heteroaryl group, the substituted $C_1$-$C_{60}$ an alkyl group the substituted $C_2$-$C_{60}$ an alkenyl group the substituted $C_2$-$C_{60}$ an alkynyl group, the substituted $C_1$-$C_{60}$alkoxy group, the substituted $C_6$-$C_{60}$aryloxy group, and the substituted $C_6$-$C_{60}$ arylthio group includes at least one substituent which may independently be:

i) a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$ alkenyl group, a $C_2$-$C_{60}$alkynyl group, or a $C_1$-$C_{60}$alkoxy group; or ii) a $C_1$-$C_{60}$alkyl group, a $C_2$-$C_{60}$ alkenyl group, a $C_2$-$C_{60}$alkynyl group, or a $C_1$-$C_{60}$alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof; or iii) a $C_3$-$C_{10}$cycloalkyl group, a $C_3$-$C_{10}$heterocycloalkyl group, a $C_3$-$C_{10}$cycloalkenyl group, a $C_3$-$C_{10}$heterocycloalkenyl group, a $C_6$-$C_{60}$ aryl group, a $C_6$-$C_{60}$aryloxy group, a $C_6$-$C_{60}$ arylthio group, or a $C_2$-$C_{60}$heteroaryl group; or iv) a $C_3$-$C_{10}$cycloalkyl group, a $C_3$-$C_{10}$heterocycloalkyl group, a $C_3$-$C_{10}$cycloalkenyl group, a $C_3$-$C_{10}$heterocycloalkenyl group, a $C_6$-$C_{60}$aryl group, a $C_6$-$C_{60}$aryloxy group, a $C_6$-$C_{60}$ arylthio group, or a $C_2$-$C_{60}$heteroaryl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{60}$alkyl group, a $C_2$-$C_{60}$ alkenyl group $C_2$-$C_{60}$ alkynyl group, $C_1$-$C_{60}$alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group; or v) —Si($Q_{13}$)($Q_{14}$)($Q_{15}$) where $Q_{13}$ to $Q_{15}$ are each independently a $C_1$-$C_{60}$alkyl group, a $C_1$-$C_{60}$alkoxy group, a $C_6$-$C_{60}$aryl group, or a $C_2$-$C_{60}$heteroaryl group.

However, the substituents of the substituted groups are not limited to the above.

The first compound of Formula 1 above has good charge (hole) transporting ability. The second compound of Formula 100 above has good charge (hole) transporting ability, good light-emitting ability, and has a high band gap energy between the highest occupied molecular orbital (HOMO) and lowest unoccupied molecular orbital (LUMO), and thus allows easy energy level adjustment. When including the first compound in the hole transfer region 13 and the second compound in the EML 15, the organic light-emitting diode 10 may have a low driving voltage, high luminance, high efficiency, and a long lifetime.

Figure 2:
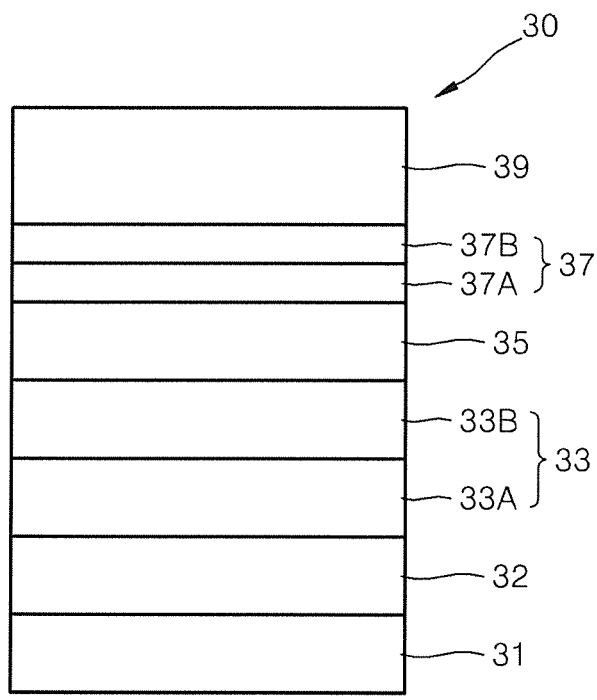
FIG. 2 is a schematic view of a structure of an organic light-emitting diode according to another embodiment of the present invention.

FIG. 2 is a schematic view of a structure of an organic light-emitting diode 30 according to another embodiment of the present invention. Referring to FIG. 2, the organic light-emitting diode 30 has a laminated structure including a substrate 31, and a first electrode 32, a hole transfer region 33, an emission layer (EML) 35, an electron transfer region 37, and a second electrode 39 sequentially stacked on the substrate 31. The hole transfer region 33 includes a hole injection layer (HIL) 33A and a hole transport layer (HTL) 33B sequentially stacked on the first electrode 32. The electron transfer region 37 includes an electron transport layer (ETL) 37A and an electron injection layer (EIL) 38B sequentially stacked on the emission layer 35.

The above descriptions of the substrate 11, first electrode 12, and second electrode 19 are incorporated here as descriptions of the substrate 31, first electrode 32, and second electrode 39 of FIG. 2.

The HIL 33A may be formed on the first electrode 32 by any of a variety of methods, such as vacuum deposition, spin coating, casting, Langmuir-Blodgett (LB) deposition, or the like. When the HIL 33A is formed using vacuum deposition, the conditions may vary depending on the compound that is used to form the HIL 33A, and the desired structural and thermal properties of the HIL 33A to be formed. For example, the vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL 33A is formed using spin coating, the coating conditions may vary depending on the compound that is used to form the HIL 33A, and the desired structural and thermal properties of the HIL 33A to be formed. For example, the coating rate may be in the range of about 2000 rpm to about 5000 rpm, and the temperature at which heat treatment is performed to remove solvent after coating may be in the range of about 80° C. to about 200° C. However, the coating conditions are not limited thereto.

Non-limiting examples of materials for the HIL 33A include N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), or (polyaniline)/poly(4-styrene-sulfonate) (PANI/PSS):

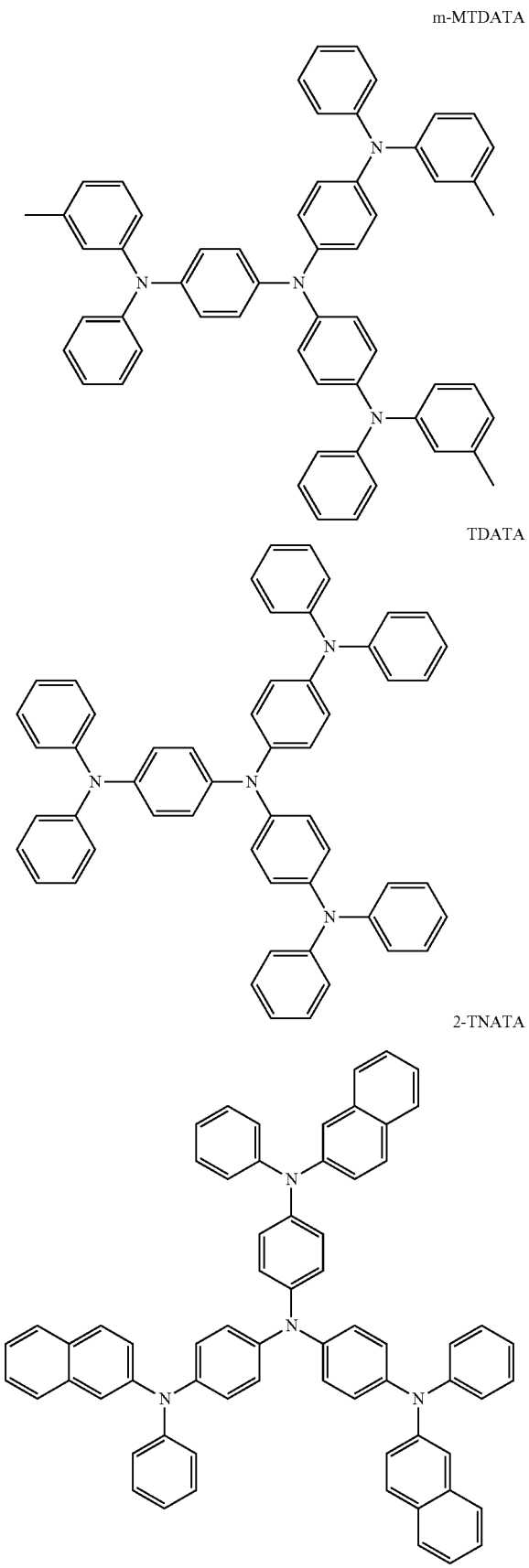

The thickness of the HIL 33A may be from about 100 Å to about 10000 Å, and in some embodiments, may be from about 100 Å to about 1000 Å. When the thickness of the HIL 33A is within these ranges, the HIL 33A may have good hole injecting ability without a substantial increase in driving voltage.

Then, the HTL 33B may be formed on the HIL 33A by any of a variety of methods, for example, vacuum deposition, spin coating, casting, Langmuir-Blodgett (LB) deposition, or the like. When the HTL 33B is formed using vacuum deposition or spin coating, the conditions for deposition or coating may be similar to those described above for the formation of the HIL 33A, although the conditions for the deposition or coating may vary depending on the compound that is used to form the HTL 33B-1.

The HTL 33B may be formed of the first compound represented by Formula 1 above. The above description of Formula 1 is therefore incorporated here. For example, the HTL 33B may include a first compound represented by Formula 1A, 1B, or 1C above. In Formula 1A, 1B, and 1C, $Ar_{101}$ and $Ar_{102}$ may each independently be a group represented by one of Formulae 4-1 to 4-7; xa and xb may each independently be 1 or 2; $R_{101}$ may be a group represented by one of Formulae 6-1 to 6-8; $R_{109}$ may be a group represented by one of Formulae 6-1 to 6-11; $R_{102}$ to $R_{108}$ and $R_{113}$ to $R_{119}$ may be hydrogen atoms; and $R_{111}$ and $R_{112}$ may each independently be one of:

i) a $C_1$-$C_{20}$ alkyl group; or ii) a $C_1$-$C_{20}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof; or iii) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group; or iv) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

In some other embodiments, a material for the HTL 33B may be one of Compounds 1-1 to 1-19 above.

The thickness of the HTL 33B may be from about 50 Å to about 2000 Å, and in some embodiments, from about 100 Å to about 1500 Å. When the thickness of the HTL 33B is within these ranges, the HTL 33B may have satisfactory hole transporting ability without a substantial increase in driving voltage.

At least one of the HIL 33A and the HTL 33B may further include a charge-generating material in addition to the above-described materials. The charge-generating material may be included to improve the conductivity of the layers.

The charge-generating material may be, for example, a p-dopant. The p-dopant may be selected from quinine derivatives, metal oxides, and cyano-containing compounds, but the p-dopant is not limited thereto. Non-limiting examples of the p-dopant include quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200 below.

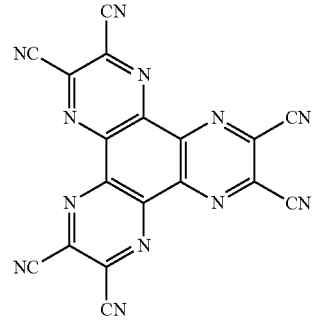

Compound 200

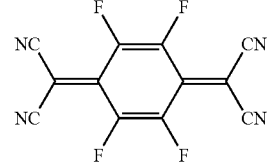

F4-TCNQ

The charge-generating material may be homogeneously dispersed or inhomogeneously distributed in at least one of the HIL 33A or the HTL 33B. The charge-generating material may be present in any form.

Then, the EML 35 may be formed on the HTL 33B by any of a variety of methods, for example, vacuum deposition, spin coating, casting, LB deposition or the like. When the EML 35 is formed using vacuum deposition or spin coating, the deposition or coating conditions may be similar to those described above for the formation of the HIL 33A, though the conditions for deposition and coating may vary depending on the compound that is used to form the EML 35.

A material for the EML 35 may be the second compound of Formula 100 described above. The above description of Formula 100 is incorporated here. For example, the EML 35 may include a second compound of Formula 100A-H1, 100A-H2, 100B-H1, or 100B-H2 above. The above descriptions of Formulae 100A-H1, 100A-H2, 100B-H1 and 100B-H2 are incorporated here. In some embodiments, the second compound may be Compound 2-1 or 2-25, but the present invention is not limited thereto. The second compound may act as a host in the EML 35.

The EML 35 may further include a second host, in addition to the second compound of Formula 100, which acts as a host.

Non-limiting examples of hosts include $Alq_3$, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di-2-naphthylanthracene (TBADN), E3, distyrylarylene (DSA), dmCBP (see a formula below), and Compounds 501 to 509 below.

-continued
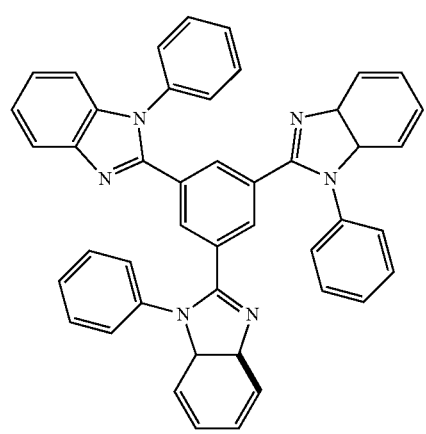
TPBI
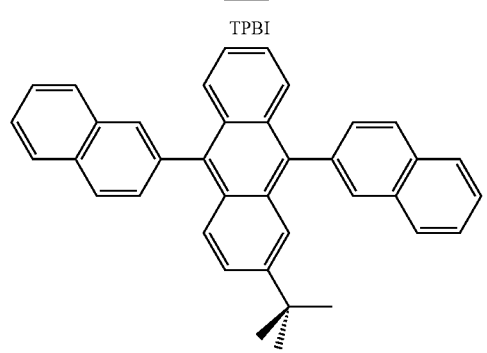
TBADN
E3
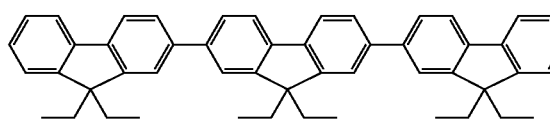
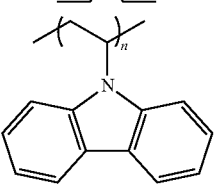
PVK
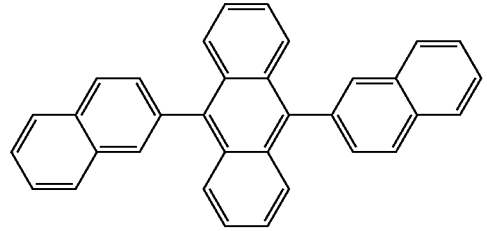
ADN
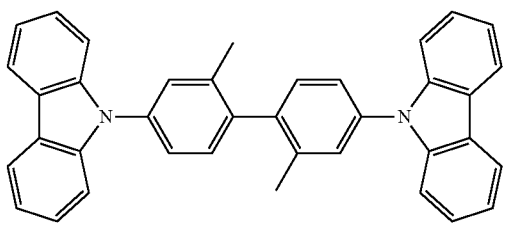
dmCBP
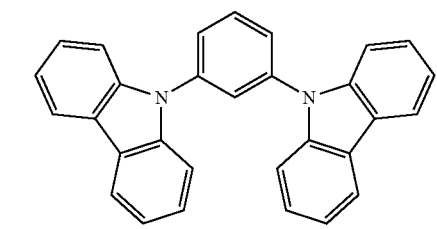
501
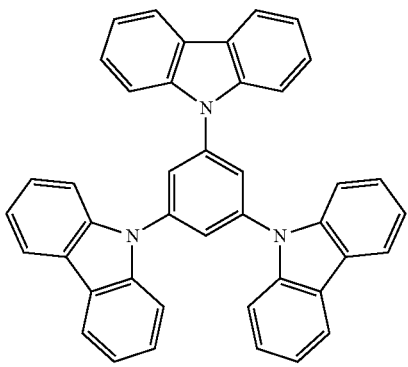
502
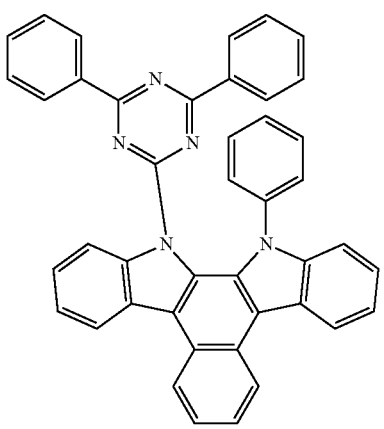
503
CBP

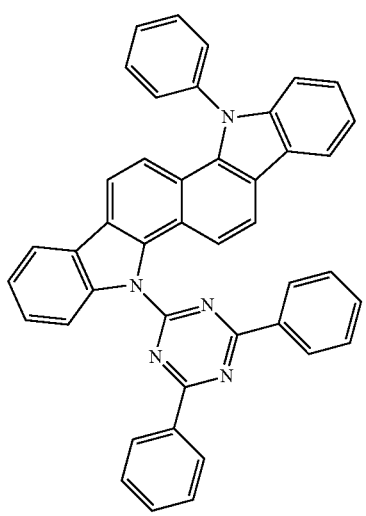
504

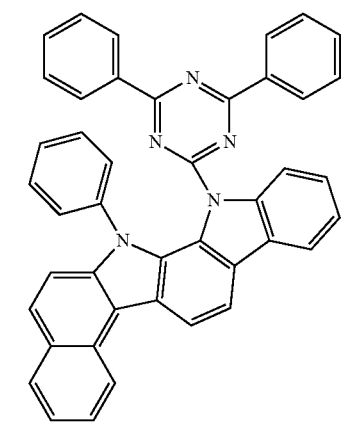
505

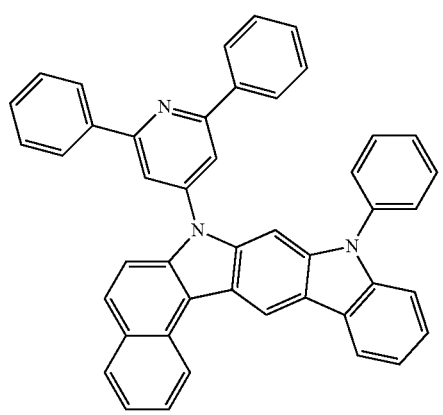
506

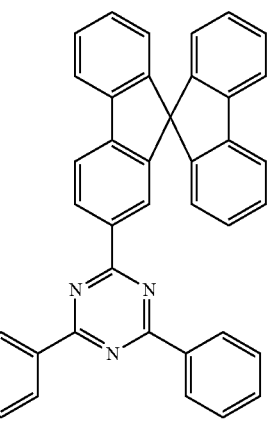
507

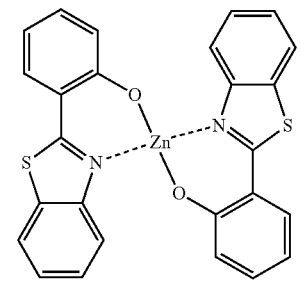
508

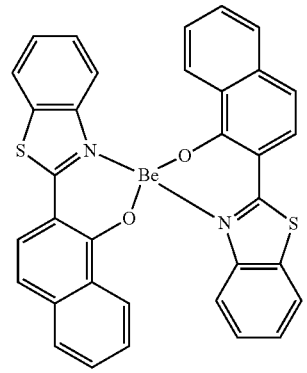
509

In some embodiments, an anthracene-based compound represented by Formula 400 below may be used as a host:

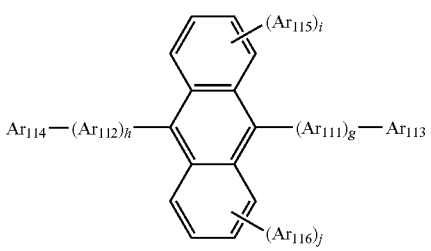
Formula 400

In Formula 400, $Ar_{111}$ and $Ar_{112}$ may each independently be a substituted or unsubstituted $C_5$-$C_{60}$arylene group. $Ar_{113}$ to $Ar_{116}$ may each independently be a substituted or unsubstituted $C_1$-$C_{10}$ alkyl group or a substituted or unsubstituted $C_5$-$C_{60}$aryl group. g, h, i, and j may each independently be an integer of 0 to 4.

In some embodiments, $Ar_{111}$ and $Ar_{112}$ in Formula 400 may each independently be a phenylene group, a naphthalene group, a phenanthrenylene group, and a pyrenylene group; or a phenylene group, a naphthalene group, a phenanthrenylene group, a fluorenyl group, and a pyrenylene group, each substituted with at least one of a phenyl group, a naphthyl group, or an anthryl group, but $Ar_{111}$ and $Ar_{112}$ are not limited thereto.

In Formula 400 above, g, h, i, and j may each independently be 0, 1, or 2.

In some embodiments, $Ar_{113}$ to $Ar_{116}$ in Formula 400 may each independently be:

i) a $C_1$-$C_{10}$ alkyl group substituted with at least one of a phenyl group, a naphthyl group, or an anthryl group; or ii) a phenyl group, a naphthyl group, an anthryl group, a pyrenyl group, a phenanthrenyl group, or a fluorenyl group; or iii) a phenyl group, a naphthyl group, an anthryl group, a pyrenyl group, a phenanthrenyl group, or a fluorenyl group substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, or a fluorenyl group; or iv)

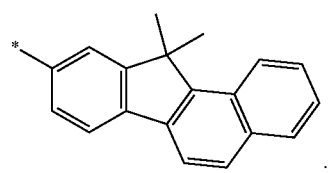

However, $Ar_{113}$ to $Ar_{116}$ are not limited thereto.

For example, the anthracene-based compound of Formula 400 above may be one of the compounds represented by the following formulae, but the anthracene-based compound of Formula 400 is not limited thereto:

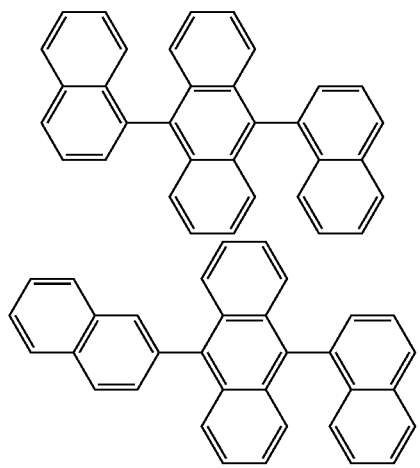

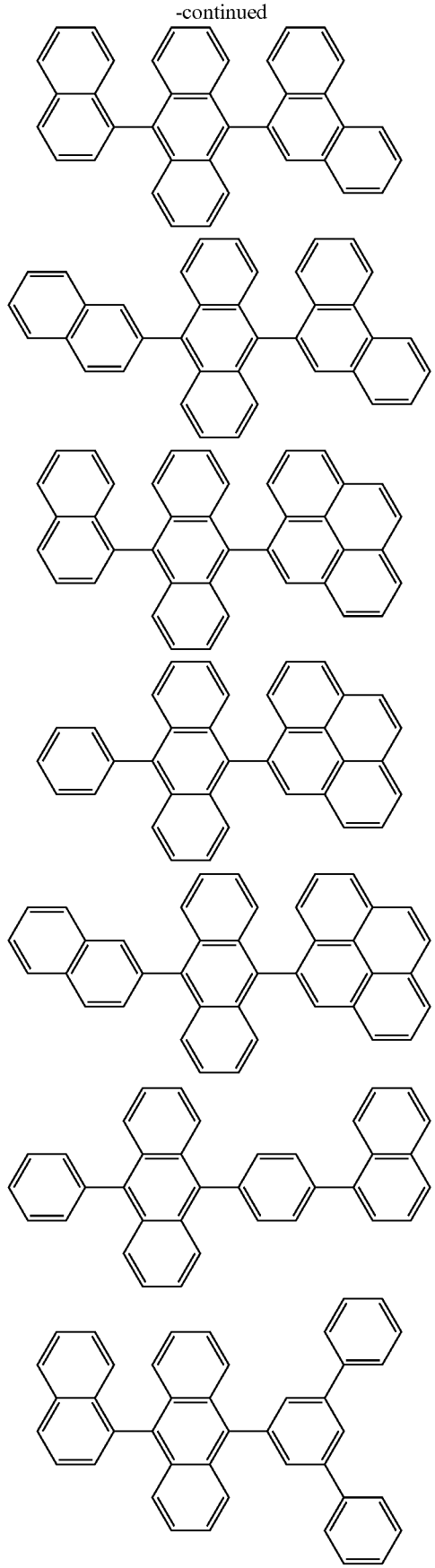

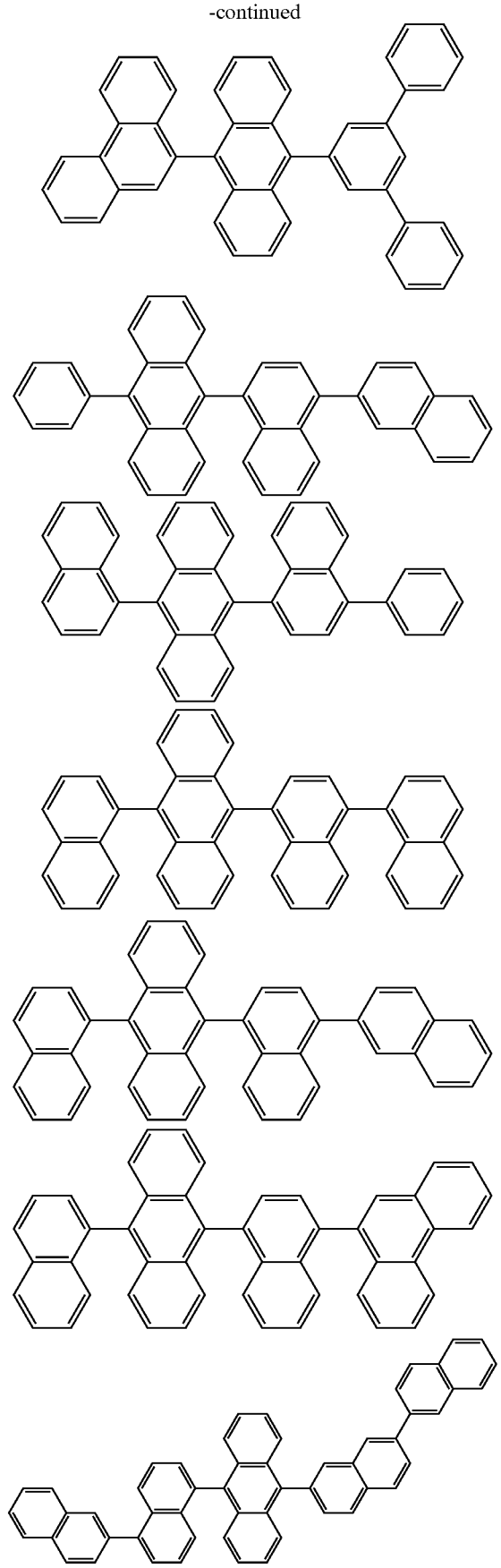
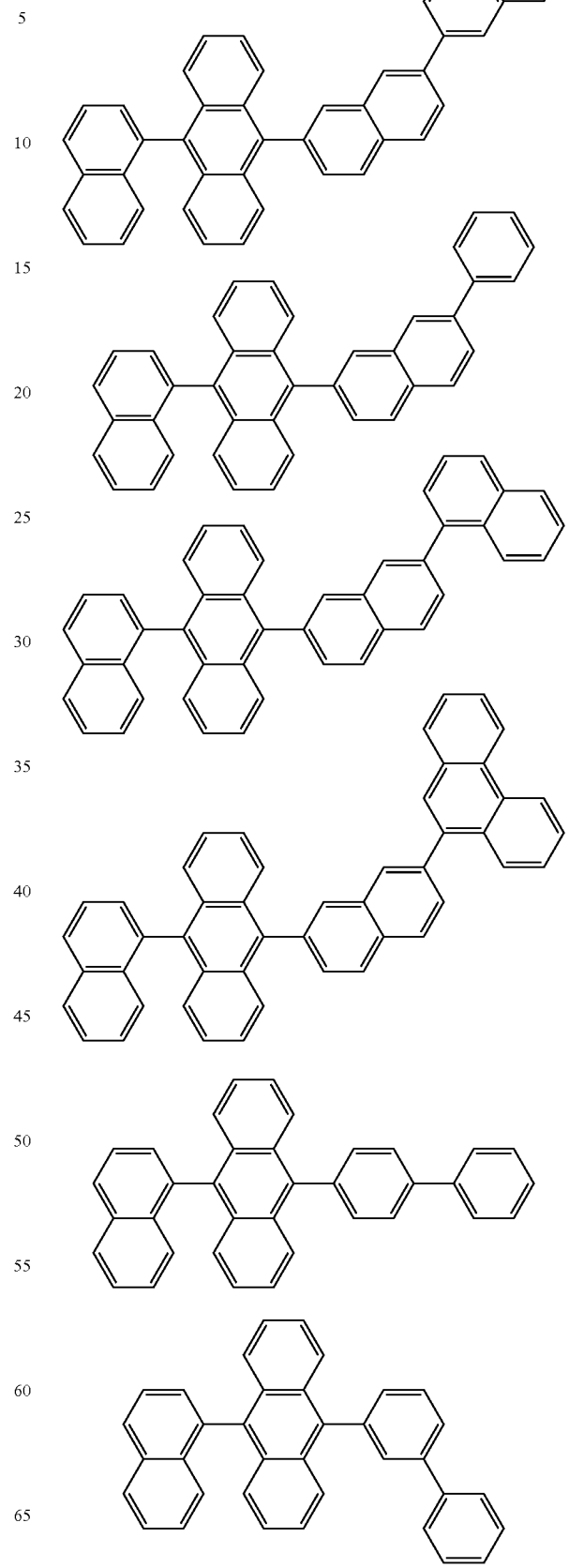

61
-continued
62
-continued
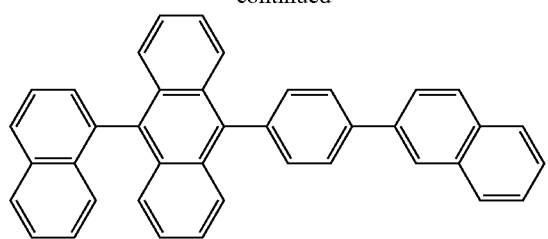
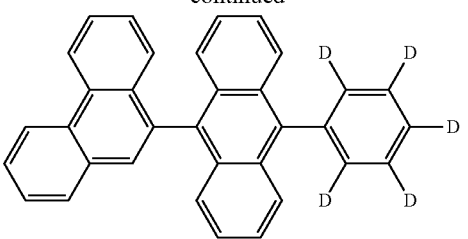

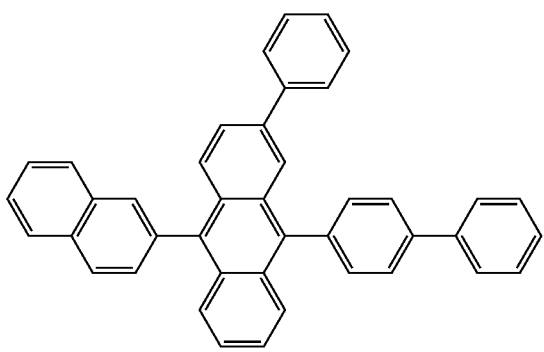

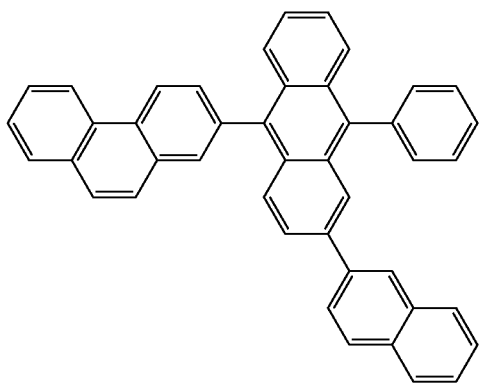

In some embodiments, an anthracene-based compound represented by Formula 401 below may be used as a host.

Formula 401

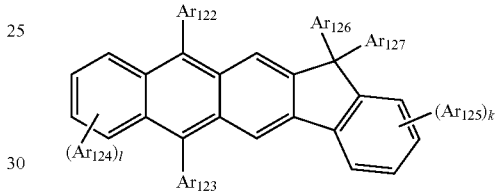

$Ar_{122}$ to $Ar_{125}$ in Formula 401 are the same as $Ar_{113}$ of Formula 400, which is described above and incorporated here.

$Ar_{126}$ and $Ar_{127}$ in Formula 401 may each independently be a $C_1$-$C_{10}$ alkyl group (for example, a methyl group, an ethyl group, or a propyl group).

In Formula 401, k and l may each independently be an integer of 0 to 4, for example, 0, 1, or 2.

For example, the anthracene compound of Formula 401 above may be one of the compounds represented by the following formulae, but the anthracene compound of Formula 401 is not limited thereto:

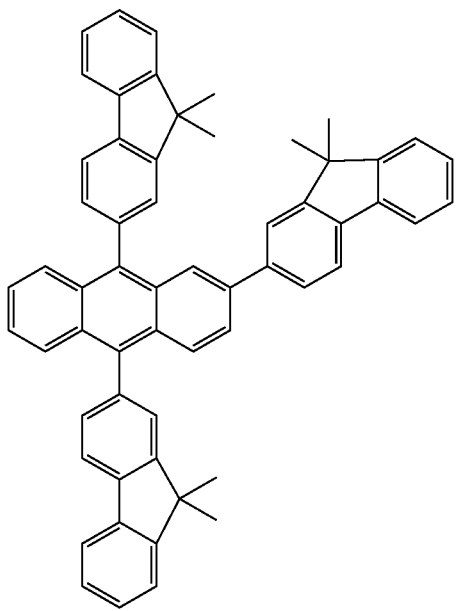

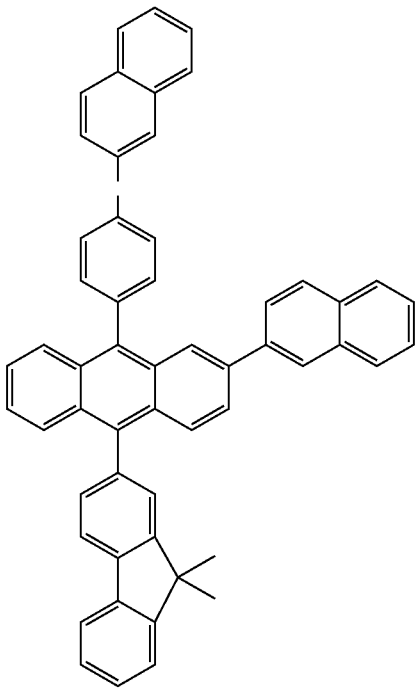

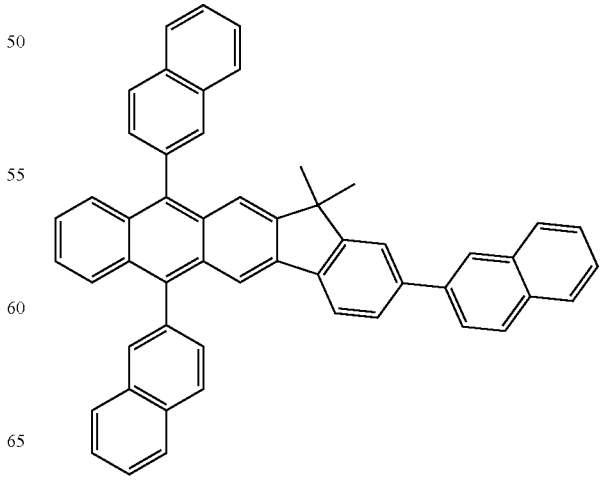

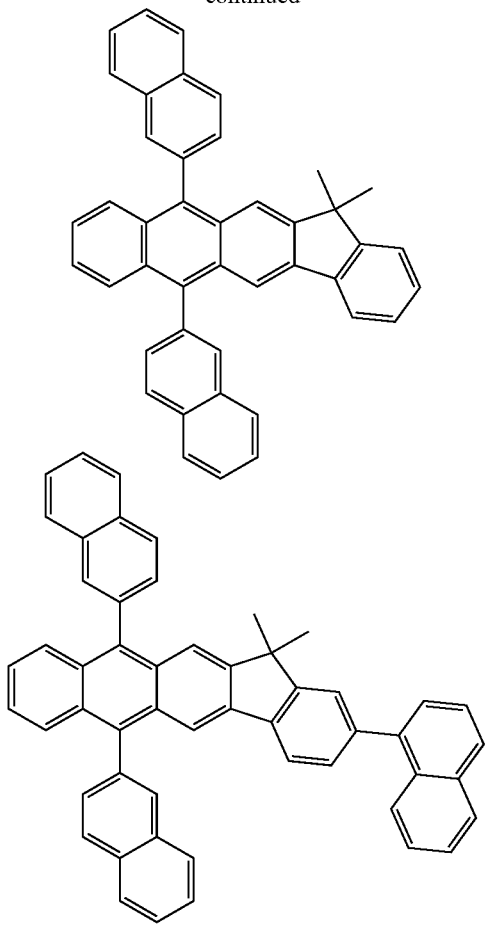

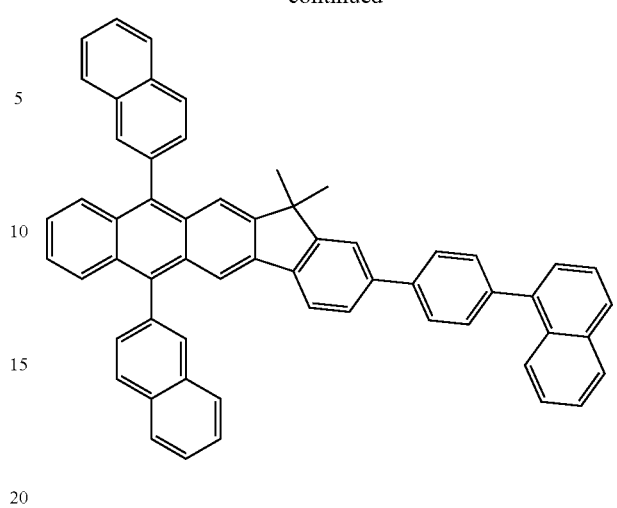

When the organic light-emitting diode is a full color organic light-emitting diode, the EML may be patterned into a red EML, a green EML, and a blue EML. In some embodiments, the EML 35 may include a red EML, a green EML, and/or a blue EML stacked on one another to emit white light, but the EML 35 is not limited thereto.

The EML 35 may further include a dopant, in addition to the above-described host. The dopant may be any dopant commonly used in OLEDs.

Non-limiting examples of blue dopants include compounds represented by the following formulae.

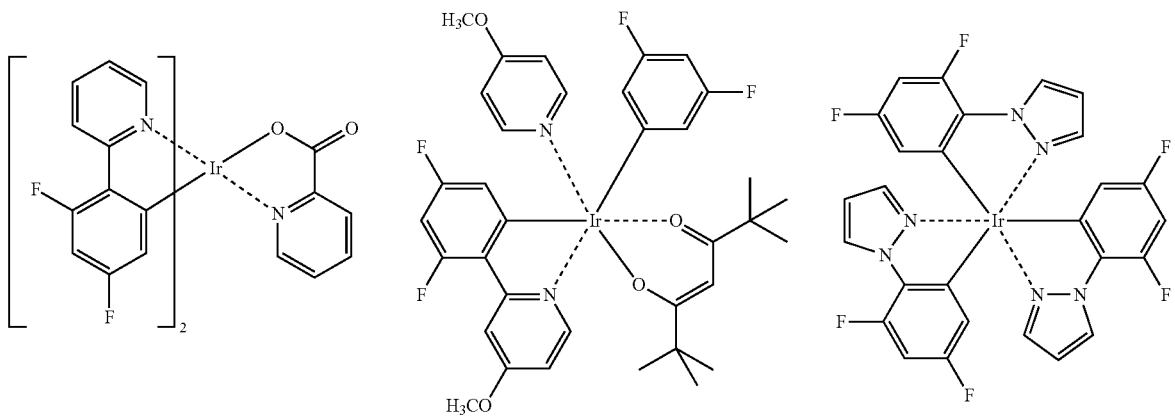

F$_2$Irpic       (F$_2$ppy)$_2$Ir(tmd)       Ir(dfppz)$_3$

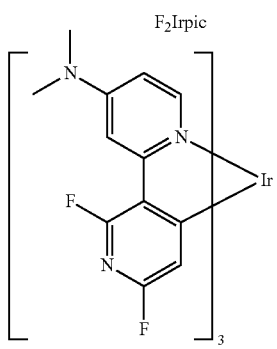
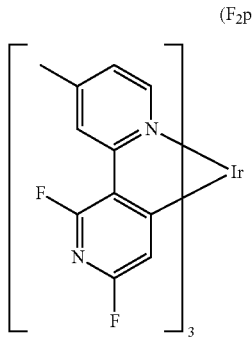
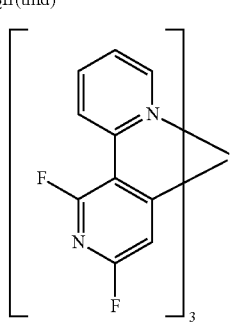

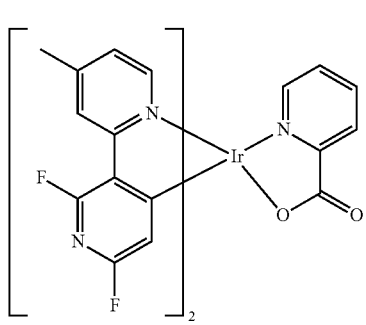
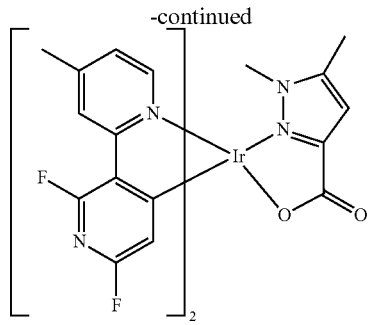
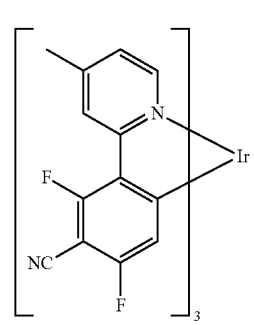
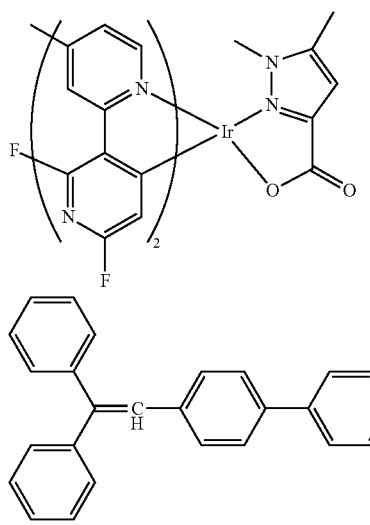
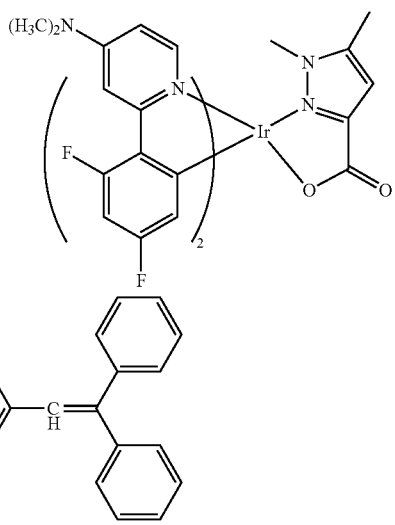
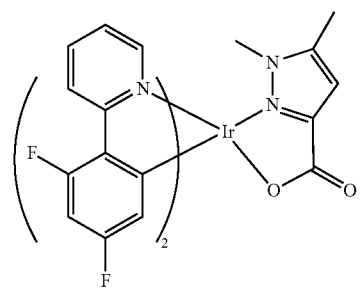
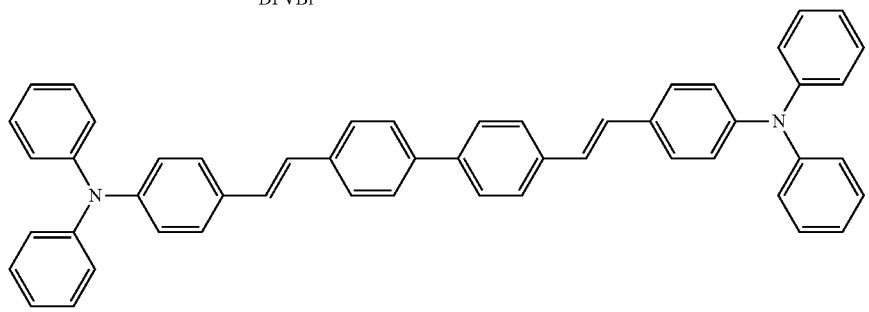
DPVBi
DPAVBi
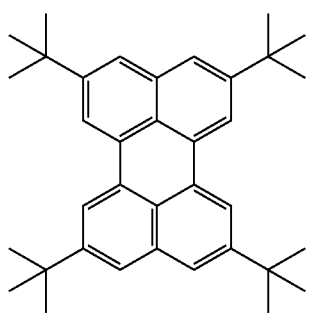
TBPe
Non-limiting examples of red dopants include compounds represented by the following formulae. In some embodiments, the red dopant may be DCM or DCJTB, which are described below.

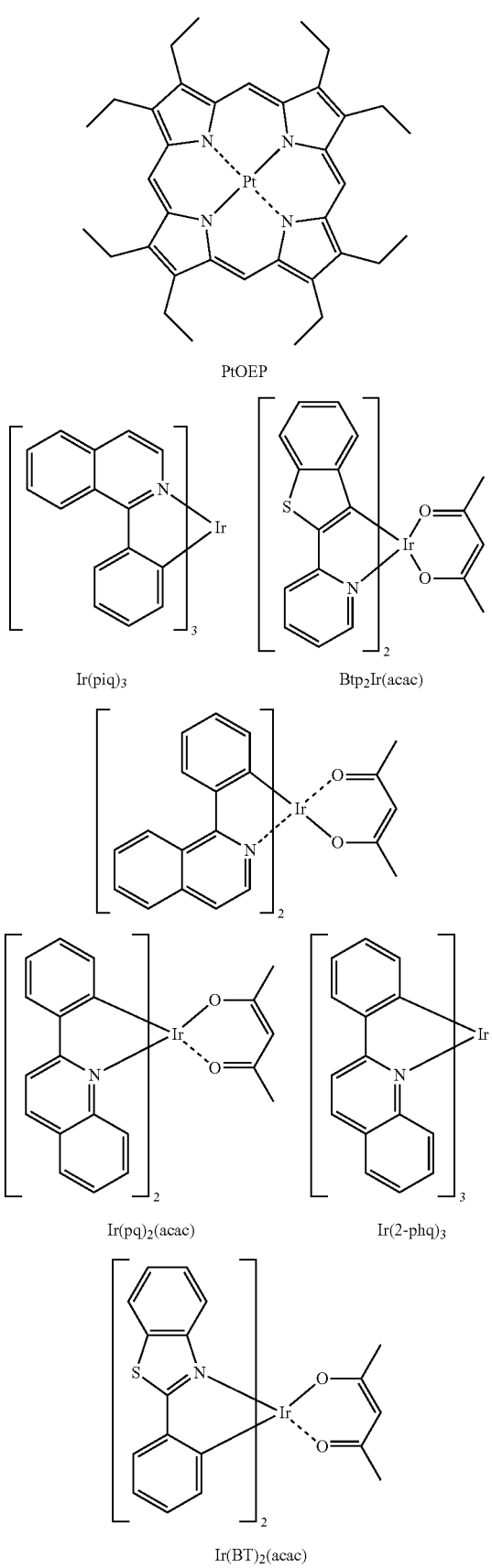
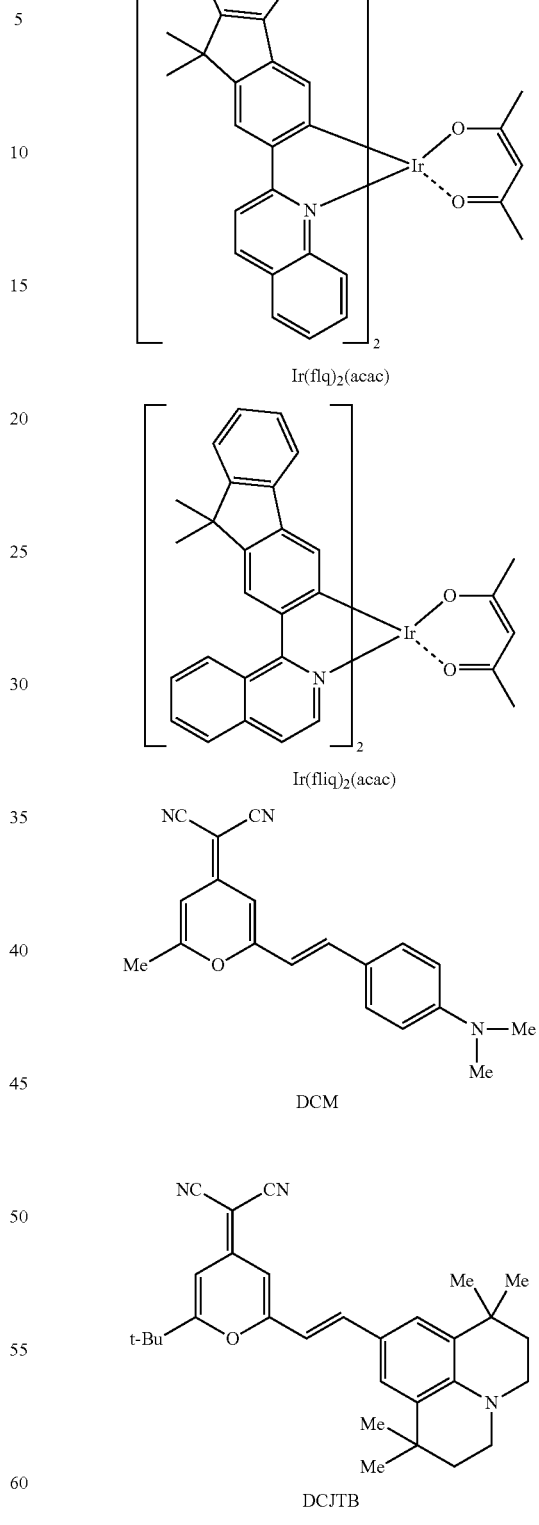
Non-limiting examples of green dopants include compounds represented by the following formulae. For example, the green dopant may be C545T represented below.

Ir(ppy)₃
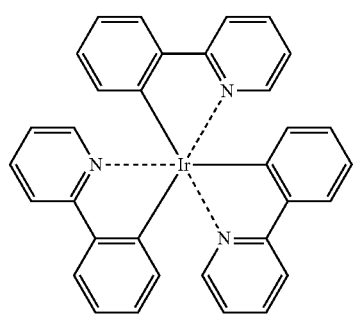
Ir(ppy)₂(acac)
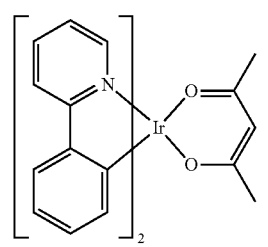
Ir(mpyp)₃
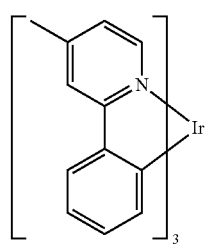
C545T
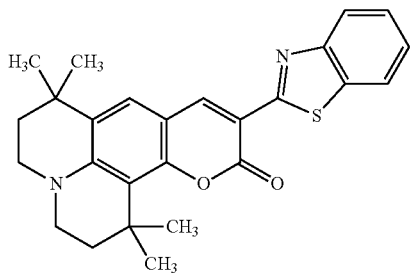
Non-limiting examples of dopants that may be used in the EML 35 include Pt complexes represented by the following formulae:
D1
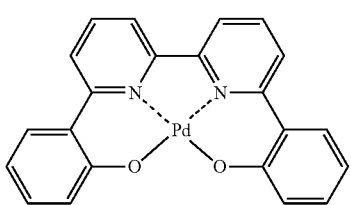
D2
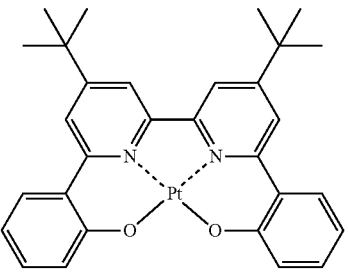
D3
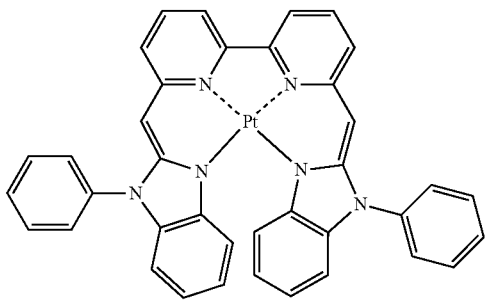
D4
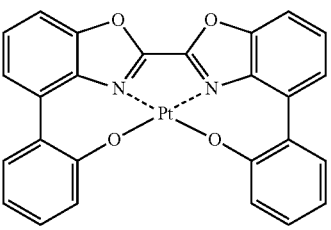
D5
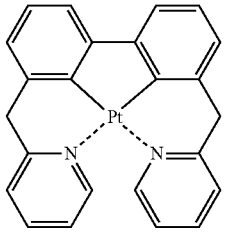
D6
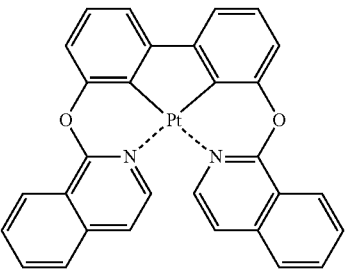
D7
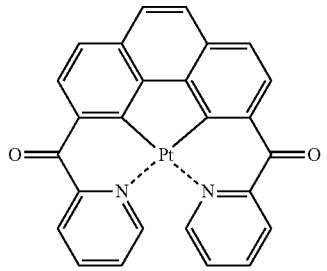

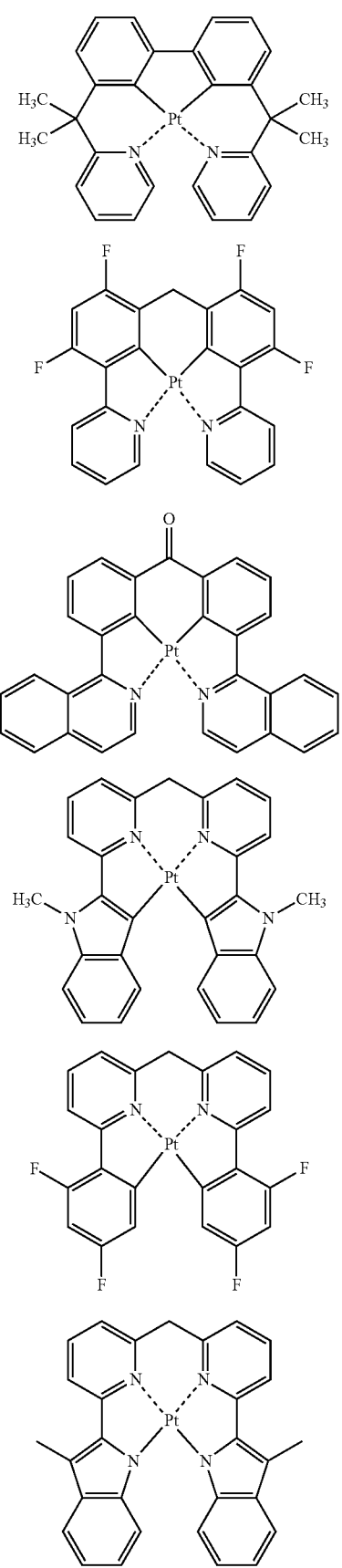
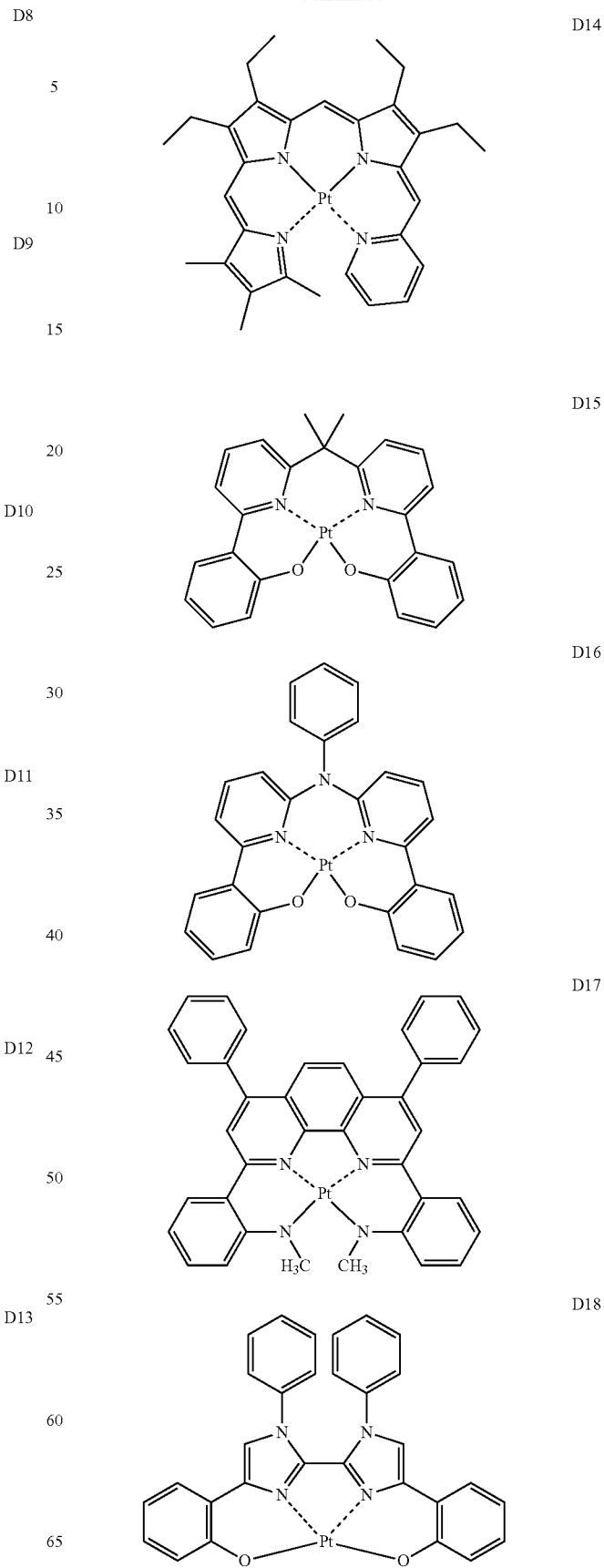

D19
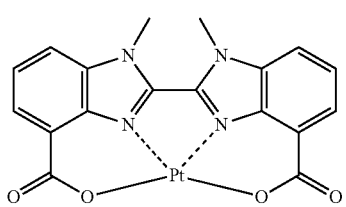
D20
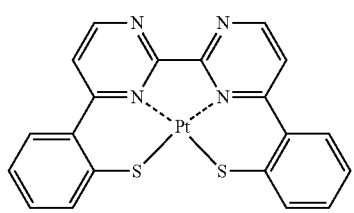
D21
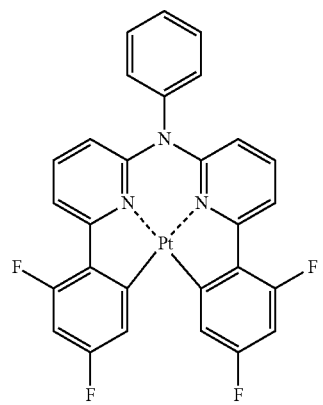
D22
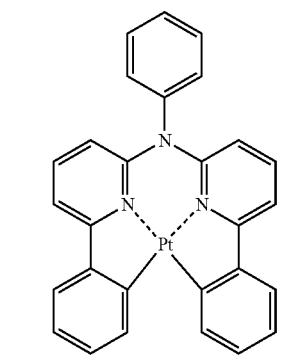
D23
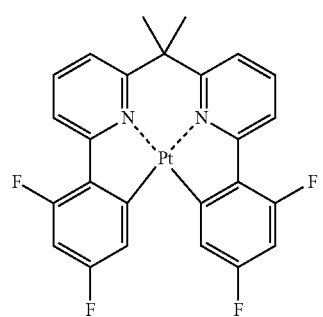
D24
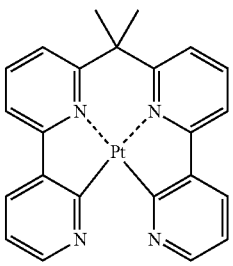
D25
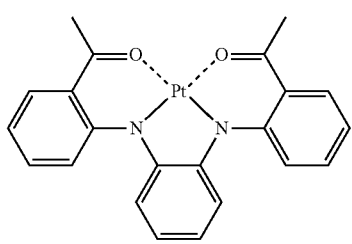
D26
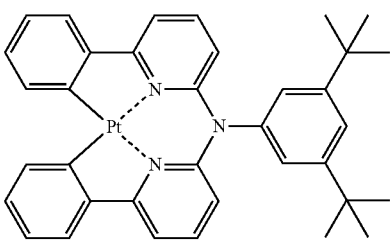
D27
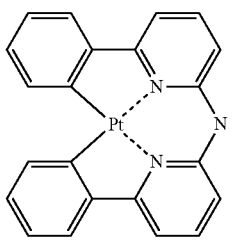
D28
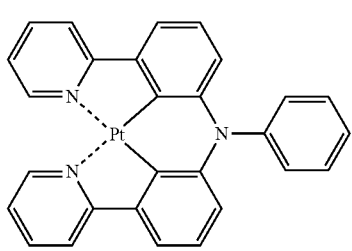
D29
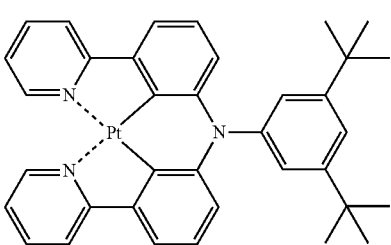

-continued
D30
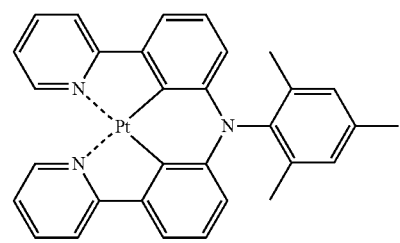
D31
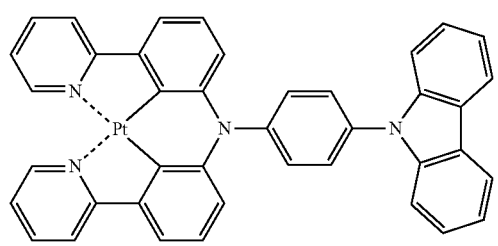
D32
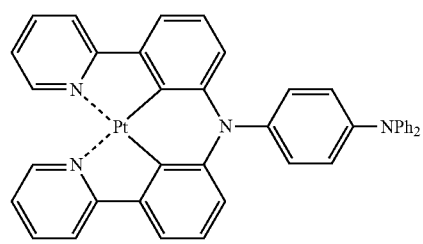
D33
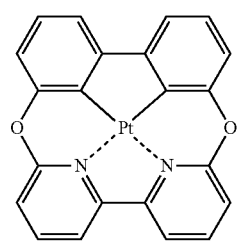
D34
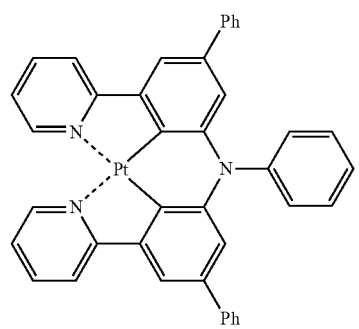
D35
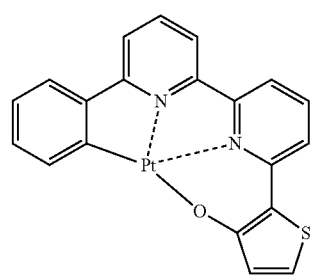
-continued
D36
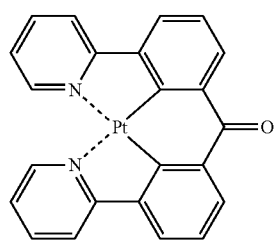
D37
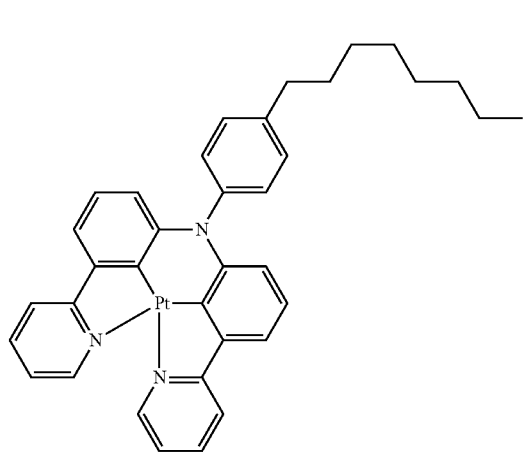
D38
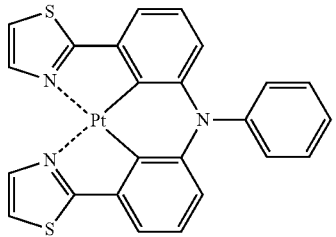
D39
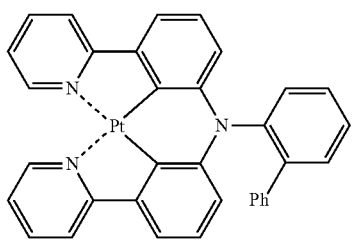
D40
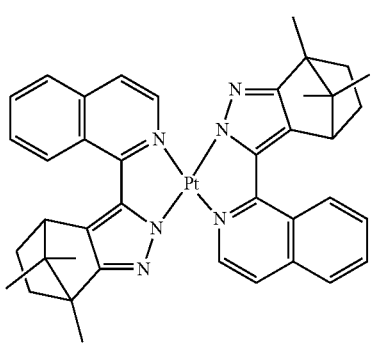

D41 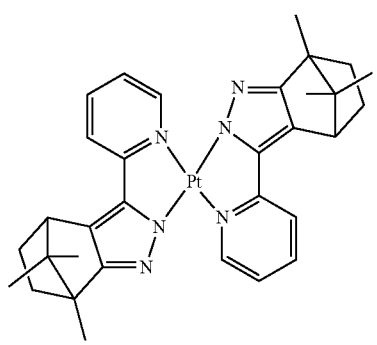
D42 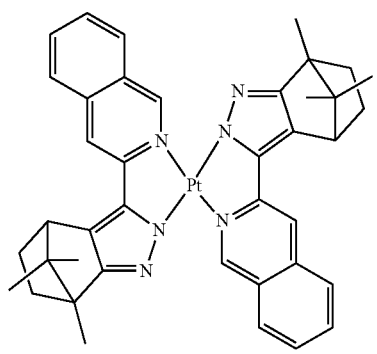
D43 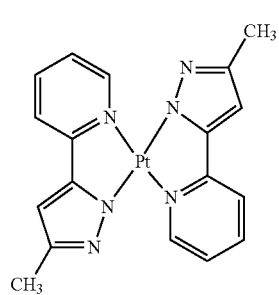
D44 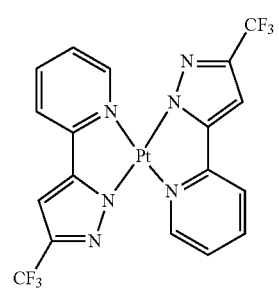
D45 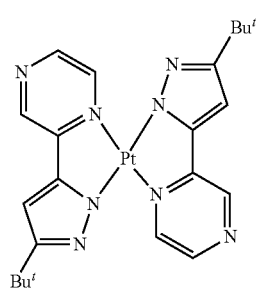
D46 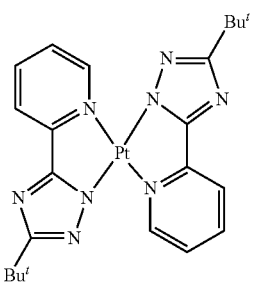
D47 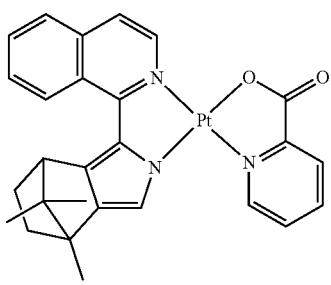
D48 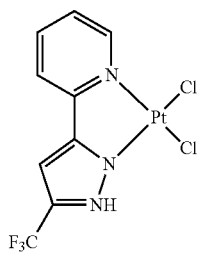
D49 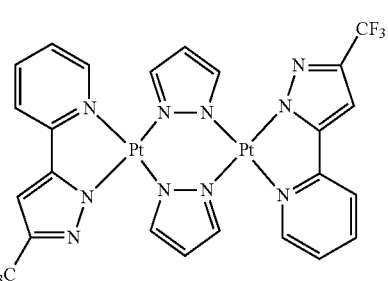
D50 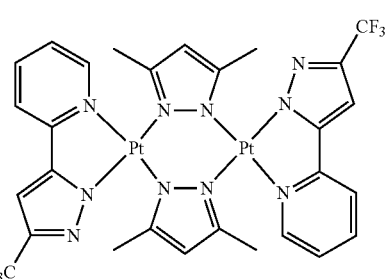
Non-limiting examples of dopants that may be used in the EML 35 include Os complexes represented by the following formulae:

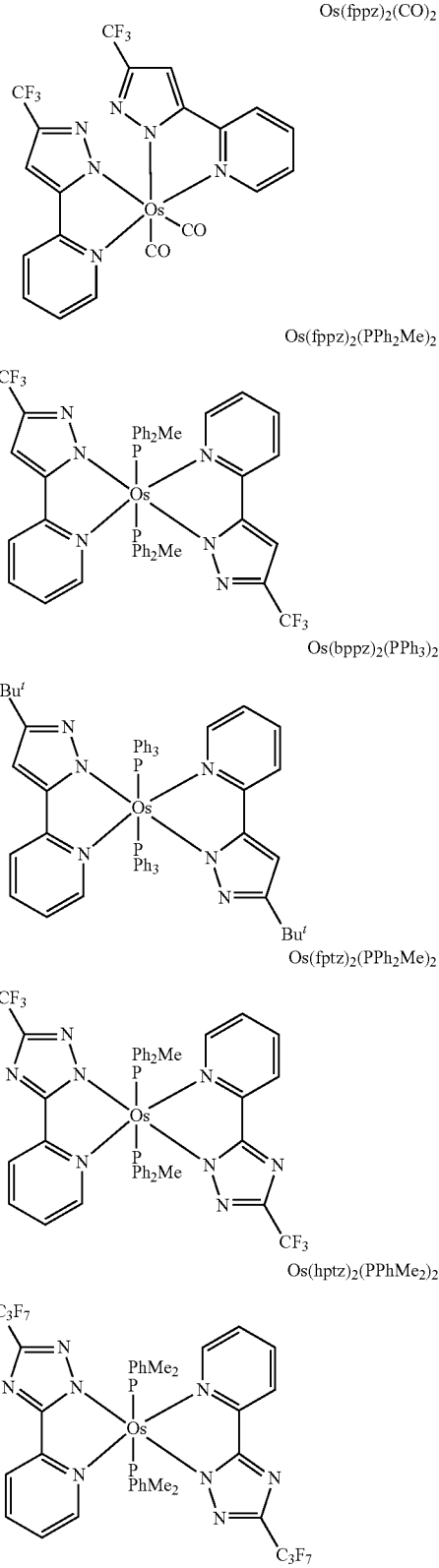

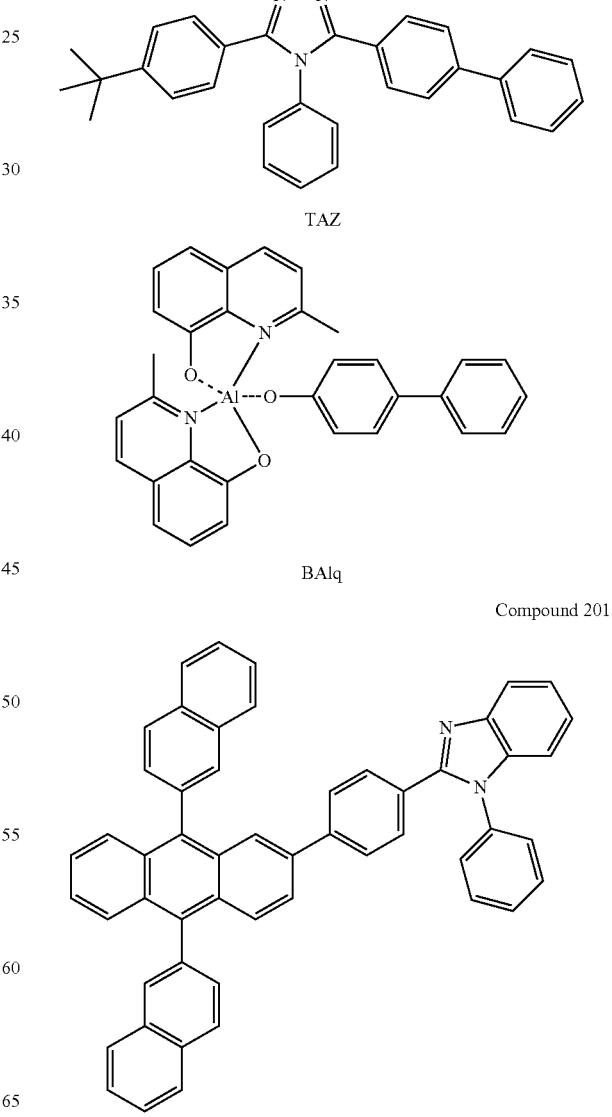

A thickness of the EML 35 may be about 100 Å to about 1000 Å, and in some embodiments, may be about 200 Å to about 600 Å. When the thickness of the EML 35 is within these ranges, the EML 35 may have improved light-emitting ability without a substantial increase in driving voltage.

Then, an ETL 37A is formed on the EML 35 by any of a variety of methods, such as vacuum deposition, spin coating, casting, or the like. When the ETL 37A is formed using vacuum deposition or spin coating, the conditions may be similar to those described above for the formation of the HIL 33A, though the deposition or coating conditions may vary depending on the compound that is used to form the ETL 33A. A material for forming the ETL 37A may be any material that can stably transport electrons injected from the second electrode 39. Non-limiting examples of materials for forming the ETL include a quinoline derivative, such as tris(8-quinolinorate)aluminum (Alq3), TAZ, BAlq, beryllium bis(benzoquinolin-10-olate) (Bebq$_2$), 9,10-di(naphthalene-2-yl)anthracene (ADN), Compound 201, and Compound 202.

When the EML 35 includes both a host and a dopant, the amount of the dopant may be about 0.01 to about 15 parts by weight based on 100 parts by weight of the host, but the amount of the dopant is not limited thereto.

Compound 202

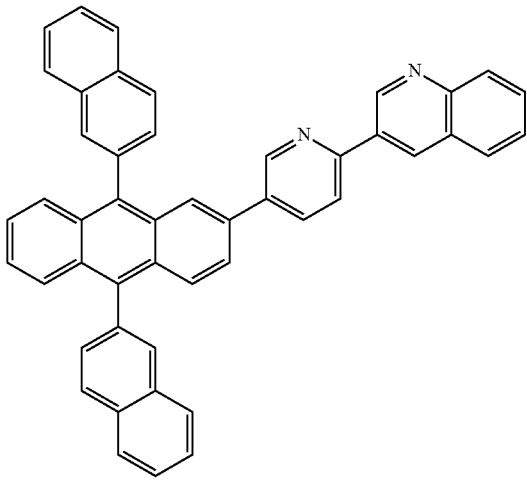

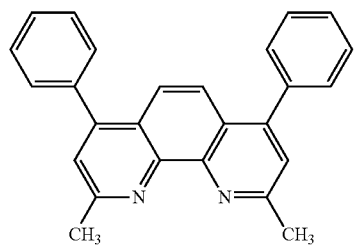

BCP

The thickness of the ETL 37A may be about 100 Å to about 1,000 Å, and in some embodiments, may be about 150 Å to about 500 Å. When the thickness of the ETL 37A is within these ranges, the ETL 37A may have satisfactory electron transporting ability without a substantial increase in driving voltage.

The ETL 37A may further include a metal-containing material in addition to the electron transporting organic material described above.

The metal-containing material may include a lithium (Li) complex. Non-limiting examples of the Li complex include lithium quinolate (LiQ) and Compound 203 below:

Compound 203

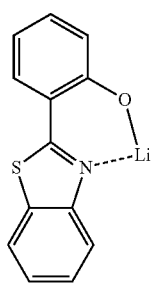

Then, an EIL 37B (which facilitates injection of electrons from the anode) may be formed on the ETL 37A. Any suitable electron-injecting material may be used to form the EIL 37B.

Non-limiting examples of materials for forming the EIL 37B include LiF, NaCl, CsF, $Li_2O$, and BaO. The deposition conditions for forming the EIL 37B may be similar to those described above for the formation of the HIL 33A, though the deposition conditions may vary depending on the compound that is used to form the EIL 37B.

The thickness of the EIL 37B may be about 1 Å to about 100 Å, and in some embodiments, may be about 3 Å to about 90 Å. When the thickness of the EIL 37B is within these ranges, the EIL 37B may have satisfactory electron injection ability without a substantial increase in driving voltage.

Although embodiments of the present invention have been described with reference to the organic light-emitting diodes 10 and 30 depicted in FIGS. 1 and 2, the present invention is not limited thereto. Although not shown in FIG. 2, a buffer layer (not shown) may be further disposed between the HTL 33B and the EML 35 of FIG. 2 in order to compensate for an optical resonance distance according to the wavelength of light emitted from the EML 35 for higher efficiency. The buffer layer may include a hole injection material, a hole transporting material, the first compound of Formula 1 above, or the like.

When the EML 35 includes a phosphorescent dopant, a hole blocking layer (HBL) may be disposed between the EML 35 and the ETL 37A of FIG. 2, in order to prevent diffusion of triplet excitons or holes into the ETL 37A. When the HBL is formed using vacuum deposition or spin coating, the conditions for deposition or coating may be similar to those described above for the formation of the HIL, although the conditions for deposition and coating may vary depending on the compound that is used to form the HBL. Any hole-blocking material may be used. Non-limiting examples of hole-blocking materials include oxadiazole derivatives, triazole derivatives, and phenanthroline derivatives. For example, bathocuproine (BCP) (represented by the following formula) may be used as a material for forming the HBL.

BCP

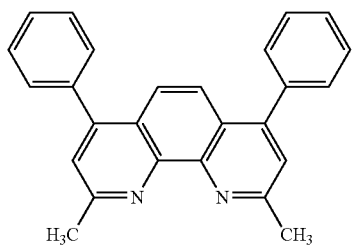

The thickness of the HBL may be about 20 Å to about 1000 Å, and in some embodiments, may be about 30 Å to about 300 Å. When the thickness of the HBL is within these ranges, the HBL may have improved hole blocking ability without a substantial increase in driving voltage.

In some embodiments, the HIL 33A of FIG. 2 may not be included. However, the present invention is not limited thereto, and embodiments of the present invention may include any of a variety of structures.

As used herein, the unsubstituted $C_1$-$C_{60}$ alkyl group (or a $C_1$-$C_{60}$ alkyl group) refers to a linear or branched alkyl group having 1 to 60 carbon atoms. Nonlimiting examples of the unsubstituted $C_1$-$C_{60}$ alkyl group include a methyl group, an ethyl group, a propyl group, an isobutyl group, a sec-butyl group, a pentyl group, an iso-amyl group, or a hexyl group. The substituted $C_1$-$C_{60}$ alkyl group refers to the substitution of at least one hydrogen atom of unsubstituted $C_1$-$C_{60}$ alkyl group with at least one of:

i) a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$ an alkenyl group, a $C_2$-$C_{60}$alkynyl group, or a $C_1$-$C_{60}$alkoxy group; or ii) a $C_1$-$C_{60}$alkyl group, a $C_2$-$C_{60}$ alkenyl group, a $C_2$-$C_{60}$alkynyl group, or a $C_1$-$C_{60}$alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof; or iii) a $C_3$-$C_{10}$cycloalkyl group, a $C_3$-$C_{10}$heterocycloalkyl group, a $C_3$-$C_{10}$cycloalkenyl group, a $C_3$-$C_{10}$heterocycloalkenyl group, a $C_6$-$C_{60}$aryl group, a $C_6$-$C_{60}$aryloxy group, a $C_6$-$C_{60}$ arylthio group, or a $C_2$-$C_{60}$heteroaryl group; or iv) a $C_3$-$C_{10}$cycloalkyl group, a $C_3$-$C_{10}$heterocycloalkyl group, a $C_3$-$C_{10}$cycloalkenyl group, a $C_3$-$C_{10}$heterocycloalkenyl group, a $C_6$-$C_{60}$aryl group, a $C_6$-$C_{60}$aryloxy group, a $C_6$-$C_{60}$ arylthio group, or a $C_2$-$C_{60}$heteroaryl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$ alkenyl group, a $C_2$-$C_{60}$ alkynyl group, a $C_1$-$C_{60}$alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group; or v) —N($Q_{11}$)($Q_{12}$) or —Si($Q_{11}$)($Q_{12}$)($Q_{13}$) where $Q_{11}$ and $Q_{12}$ may each independently be a $C_6$-$C_{60}$aryl group, or a $C_2$-$C_{60}$heteroaryl group; and $Q_{13}$ to $Q_{15}$ may each independently be a $C_1$-$C_{60}$alkyl group, a $C_1$-$C_{60}$alkoxy group, a $C_6$-$C_{60}$aryl group, or a $C_2$-$C_{60}$heteroaryl group. However, the substituents of the substituted $C_1$-$C_{60}$ alkyl group are not limited thereto.

As used herein, the unsubstituted $C_1$-$C_{60}$alkoxy group (or $C_1$-$C_{60}$alkoxy group) refers to a group represented by —OA (where A is an unsubstituted $C_1$-$C_{60}$ alkyl group, as described above). Nonlimiting examples of the unsubstituted $C_1$-$C_{60}$alkoxy group include a methoxy group, an ethoxy group, an isopropoxy group, or the like. The substituted $C_1$-$C_{60}$alkoxy group refers to the substitution of at least one hydrogen atom of the alkoxy groups with the substituents described above in connection with the substituted $C_1$-$C_{60}$ alkyl group.

As used herein, the unsubstituted $C_2$-$C_{60}$ alkenyl group (or a $C_2$-$C_{60}$ alkenyl group) refers to a unsubstituted $C_2$-$C_{60}$ alkyl group having at least one carbon-carbon double bond in the center or terminal end thereof. Nonlimiting examples of the alkenyl group include an ethenyl group, a propenyl group, a butenyl group, and the like. The substituted $C_2$-$C_{60}$ alkenyl group refers to the substitution of at least one hydrogen atom of the unsubstituted $C_2$-$C_{60}$ alkenyl group with the substituents described above in connection with the substituted $C_1$-$C_{60}$ alkyl group.

As used herein, the unsubstituted $C_2$-$C_{60}$ alkynyl group (or a $C_2$-$C_{60}$ alkynyl) refers to a $C_2$-$C_{60}$ alkyl group having at least one carbon-carbon triple bond in the center or at a terminal end thereof. Nonlimiting examples of the unsubstituted $C_2$-$C_{60}$ alkynyl group include an ethenyl group, a propynyl group, and the like. The substituted $C_2$-$C_{60}$ alkynyl group refers to the substitution of at least one hydrogen atom of the alkynyl group with the substituents described above in connection with the substituted $C_1$-$C_{60}$ alkyl group.

As used herein, the unsubstituted $C_6$-$C_{60}$ aryl group refers to a monovalent group having a carbocyclic aromatic system having 6 to 60 carbon atoms and including at least one aromatic ring. The unsubstituted $C_6$-$C_{60}$ arylene group refers to a divalent group having a carbocyclic aromatic system having 6 to 60 carbon atoms and including at least one aromatic ring. When the aryl group or the arylene group has at least two rings, the rings may be fused to each other. The substituted $C_6$-$C_{60}$ aryl group or substituted $C_6$-$C_{60}$ arylene group refers to the substitution of at least one hydrogen atom in the aryl group or the arylene group with the substituents described above in connection with the $C_1$-$C_{60}$ alkyl group.

Nonlimiting examples of the substituted or unsubstituted $C_6$-$C_{60}$ aryl group include a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- or p-fluorophenyl group and a dichlorophenyl group), a dicyanophenyl group, a trifluoromethoxyphenyl group, an o-, m- or p-tolyl group, an o-, m- or p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthalenyl group, a phenalenyl group, a fluorenyl group, an anthraquinolyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, hexacenyl group, a rubicenyl group, a coronenyl group, a trinaphthalenyl group, a heptaphenyl group, a heptacenyl group, a pyranthrenyl group, and an ovalenyl group. Examples of the substituted $C_6$-$C_{60}$ aryl group may be inferred based on those of the unsubstituted $C_6$-$C_{60}$ aryl group and the substituted $C_1$-$C_{60}$ alkyl group described above. Examples of the substituted or unsubstituted $C_6$-$C_{60}$ arylene group may be inferred from the examples of the substituted or unsubstituted $C_6$-$C_{60}$ aryl group described above.

As used herein, the unsubstituted $C_2$-$C_{60}$ heteroaryl group refers to a monovalent group having at least one aromatic ring including at least one heteroatom selected from N, O, P, and S. The unsubstituted $C_2$-$C_{60}$ heteroarylene group refers to a divalent group having at least one aromatic ring including at least one heteroatom selected from N, O, P, and S. When the heteroaryl group or the heteroarylene group has at least two rings, the rings may be fused to each other. The substituted $C_2$-$C_{60}$ heteroaryl group or substituted $C_2$-$C_{60}$ heteroarylene group refers to the substitution of at least one hydrogen atom in the heteroaryl group or the heteroarylene group with the substituents described above with reference to the $C_1$-$C_{60}$ alkyl group.

Nonlimiting examples of the unsubstituted $C_2$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group and an imidazopyrimidinyl group. Examples of the substituted or unsubstituted $C_2$-$C_{60}$ heteroarylene group may be inferred from the examples of the substituted or unsubstituted $C_2$-$C_{60}$ arylene group described above.

The substituted or unsubstituted $C_6$-$C_{60}$ aryloxy group refers to a group represented by —$OA_2$ where $A_2$ is a substituted or unsubstituted $C_6$-$C_{60}$ aryl group, as described above. The substituted or unsubstituted $C_5$-$C_{60}$ arylthiol group refers to a group represented by —$SA_3$ where $A_3$ is a substituted or unsubstituted $C_6$-$C_{60}$ aryl group, as described above.

Hereinafter, embodiments of the present invention will be described with reference to the following synthesis examples and other examples. However, these examples are presented for illustrative purposes only and are not intended to limit the scope of the present invention.

EXAMPLES

Synthesis Example 1

Synthesis of Compound 2-10

Compound 2-10 was synthesized according to Reaction Scheme 1 below:

Reaction Scheme 1

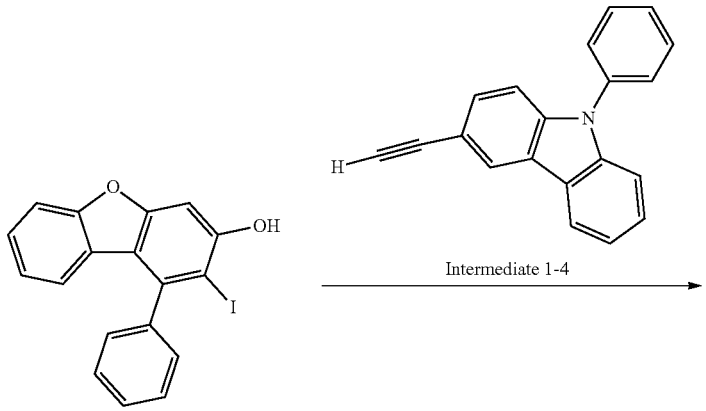

Compound a

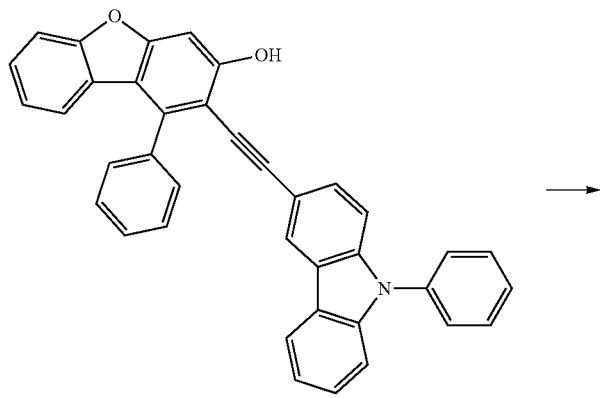

Intermediate 1-e

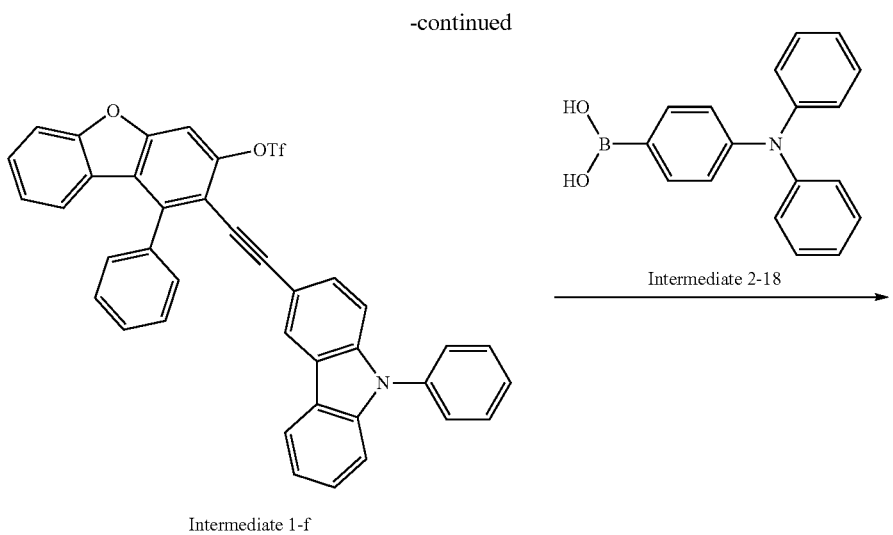

Intermediate 1-f

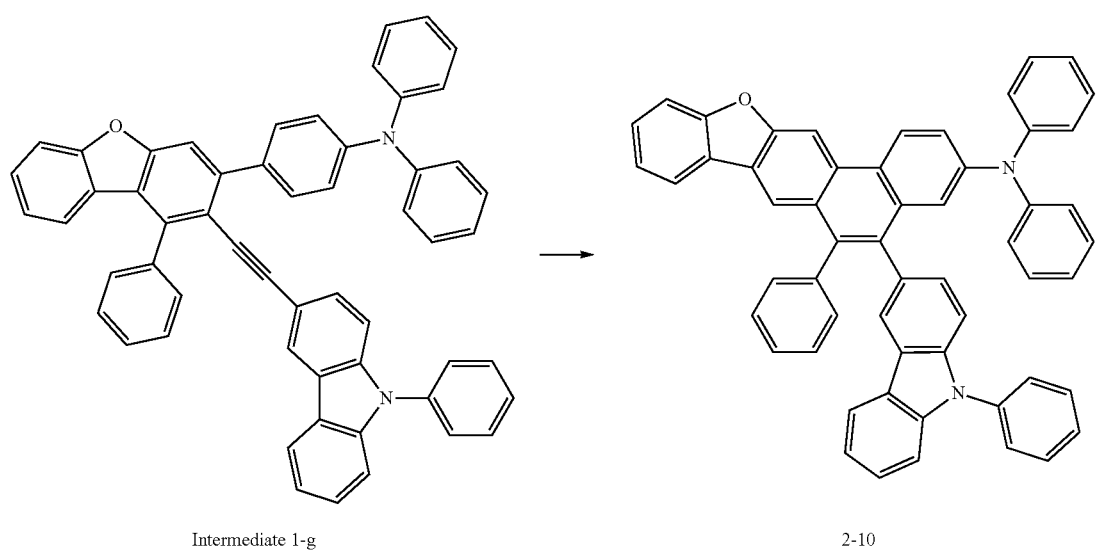 [SMILES: C(#Cc1c(-c2ccc(N(c3ccccc3)c3ccccc3)cc2)cc2oc3ccccc3c2c1-c1ccccc1)c1ccc2c(c1)c1ccccc1n2-c1ccccc1 ; c1ccc(-c2c(-c3ccc4c(c3)c3ccccc3n4-c3ccccc3)c3cc(N(c4ccccc4)c4ccccc4)ccc3c3cc4oc5ccccc5c4cc23)cc1]

Intermediate 1-g → 2-10

Synthesis of Intermediate 1-e 1 eq of Compound a, 430 mg (0.02 eq) of bis(chloro(triphenylphosphine)palladium ($PdCl_2(PPh_3)_2$), 400 mg (0.05 eq) of $PPh_3$, and 350 mg (0.06 eq) of CuI were mixed together in a flask, which was then subjected to a vacuum environment and $N_2$ atmosphere. 80 mL of THF was added to the mixture, and the mixture was then stirred, followed by a slow, dropwise addition of 30 mL (8 eq) of triethylamine and 12 g (1.5 eq) of Intermediate 1-4. The mixture was then stirred in a $N_2$ atmosphere at room temperature for about 2 hours. After removing the solvent from the mixture using a rotary evaporator, 100 mL of water was added to the reaction solution, and the resultant was extracted three times with 100 mL of ethyl ether. The organic layer was collected and then dried using magnesium sulfate to evaporate the solvent. The residue was separated and purified by silica gel column chromatography to obtain Intermediate 1-e.

Synthesis of Intermediate 1-f 7.1 g of Intermediate 1-e and 3.7 mL (3 eq) of pyridine were mixed with 60 mL of $CH_2Cl_2$, followed by a slow, dropwise addition of 3.8 mL (1.5 eq) of trifluoromethane sulfonic anhydride using a cooling bath at about 0° C. The mixture was stirred at room temperature for about 2 hours. The mixture was neutralized with 1N HCl, and then extracted three times with 100 mL of water and 100 mL of $CH_2Cl_2$. The organic layer was collected and then dried using magnesium sulfate to evaporate the solvent. The residue was separated and purified by silica gel column chromatography to obtain Intermediate 1-f.

Synthesis of Intermediate 1-g 7.3 g of Intermediate 1-f, 1.2 eq of Intermediate 2-18, 988 mg (0.07 eq) of Pd(PPh$_3$)$_4$, and 2.8 g (1.7 eq) of K$_2$CO$_3$ were mixed with 36 mL of THF and 18 mL of distilled water, and then stirred under reflux for about 24 hours after a temperature increase to about 70° C. The mixture was cooled down to room temperature, and then extracted three times with 100 mL of water and 100 mL of diethylether. The organic layer was collected and then dried using magnesium sulfate to evaporate the solvent. The residue was separated and purified by silica gel column chromatography to obtain Intermediate 1-g.

Synthesis of Compound 2-10

After 4.5 g of Intermediate 1-g was mixed with 500 mL of methylene chloride (MC), 20 mL (40 eq) of trifluoroacetic acid was slowly dropwise added thereto, and the mixture was stirred at room temperature for about 1 hour. After completion of the reaction, the reaction solution was extracted three times with 100 mL of water and 100 mL of diethylether. The organic layer was collected and then dried using magnesium sulfate to evaporate the solvent. The residue was separated and purified by silica gel column chromatography to obtain Compound 2-10.

Synthesis Example 2

Synthesis of Compound 2-15

Compound 2-15 was synthesized according to Reaction Scheme 2 below:

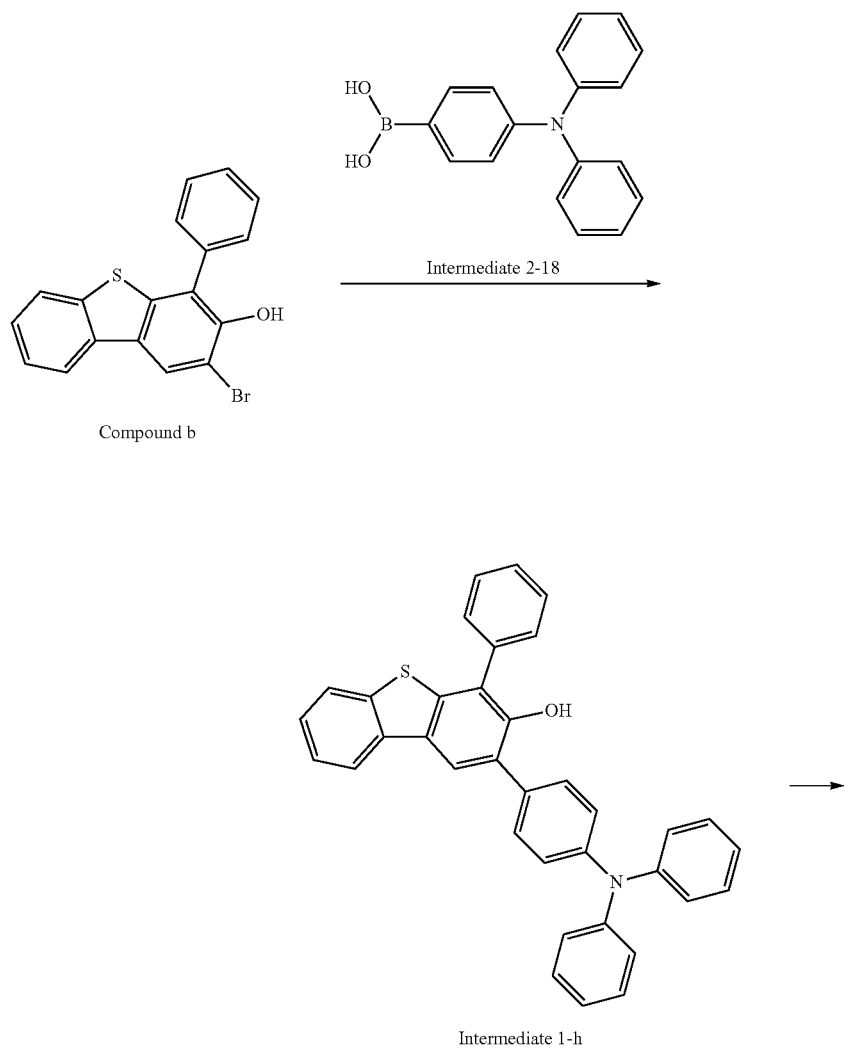

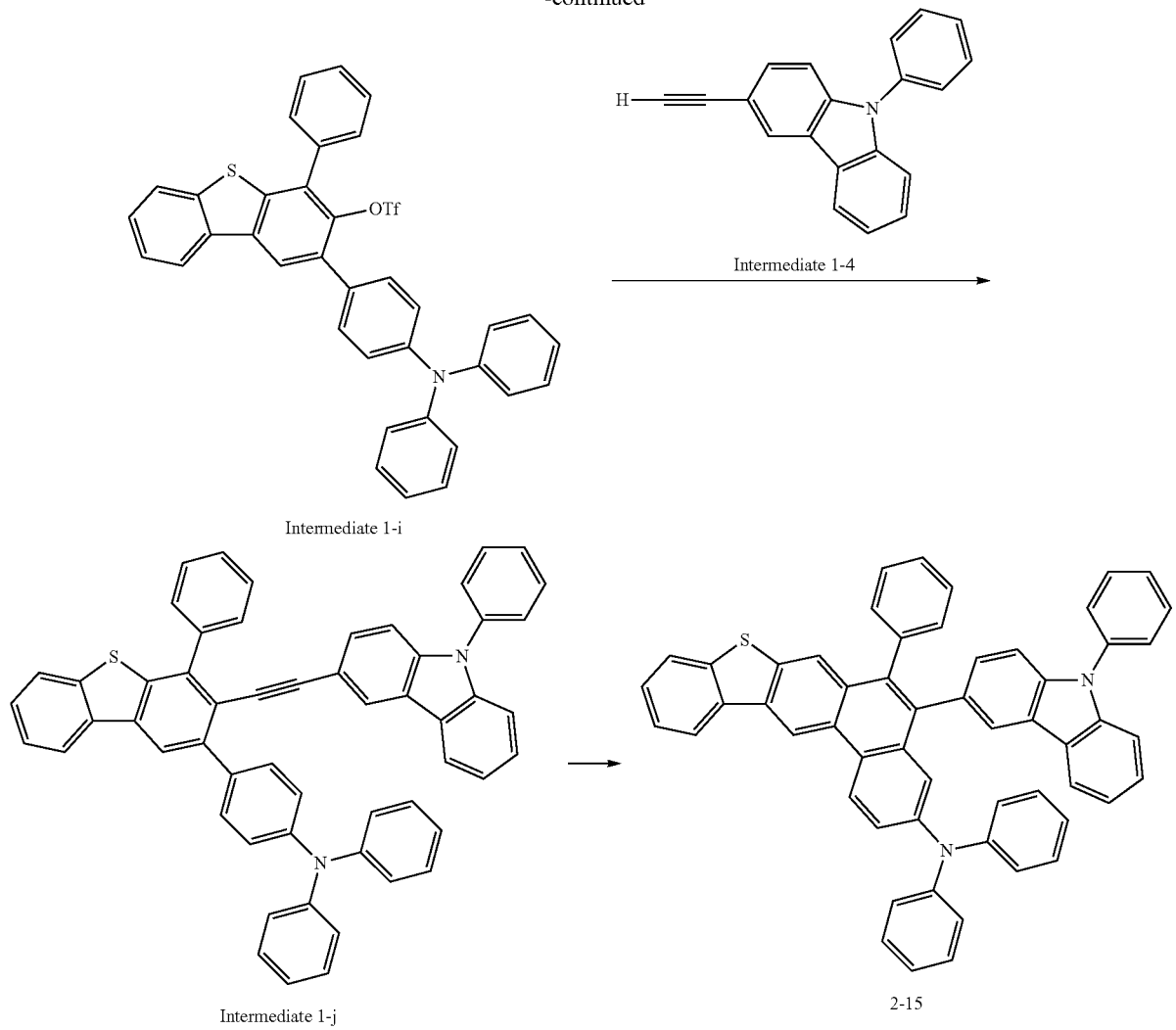

Intermediate 1-i

Intermediate 1-4

Intermediate 1-j 2-15

Synthesis of Intermediate 1-h 8 g of Compound b, 1.2 eq of Intermediate 2-18, 2.4 g (0.07 eq) of Pd(PPh$_3$)$_4$, and 7.1 g (1.7 eq) of K$_2$CO$_3$ were mixed with 90 mL of THF and 45 mL of distilled water, and then stirred under reflux for about 24 hours after a temperature increase to about 70° C. The mixture was cooled down to room temperature, and then extracted three times with 100 mL of water and 100 mL of diethylether. The organic layer was collected and then dried using magnesium sulfate to evaporate the solvent. The residue was separated and purified by silica gel column chromatography to obtain Intermediate 1-h.

Synthesis of Intermediate 1-i 4.1 g of Intermediate 1-h and 3.8 mL (3 eq) of pyridine were mixed with 60 mL of CH$_2$Cl$_2$, followed by a slow, dropwise addition of 4.0 mL (1.5 eq) of trifluoromethane sulfonic anhydride using a cooling bath at about 0° C. The mixture was stirred at room temperature for about 2 hours. The mixture was neutralized with 1N HCl, and then extracted three times with 100 mL of water and 100 mL of CH$_2$Cl$_2$. The organic layer was collected and then dried using magnesium sulfate to evaporate the solvent. The residue was separated and purified by silica gel column chromatography to obtain Intermediate 1-i.

Synthesis of Intermediate 1-j 1 eq of Intermediate 1-i, 182 mg (0.02 eq) of bis(chloro (triphenylphosphine)palladium (PdCl$_2$(PPh$_3$)$_2$), 170 mg (0.05 eq) of PPh$_3$, and 146 mg (0.06 eq) of CuI were mixed together in a flask, which was then subjected to a vacuum environment and N$_2$ atmosphere. 40 mL of THF was added to the mixture, and the mixture was then stirred, followed by a dropwise addition of 15 mL (8 eq) of triethylamine and 1.5 eq of Intermediate 1-4. The mixture was then stirred in a N$_2$ atmosphere at room temperature for about 8 hours. After removing the solvent from the mixture using a rotary evaporator, the mixture was extracted three times with 100 mL of water and 100 mL of ethylether. The organic layer was collected and then dried using magnesium sulfate to evaporate the solvent. The residue was separated and purified by silica gel column chromatography to obtain Intermediate 1-j.

Synthesis of Compound 2-15

After 5.1 g of Intermediate 1-j was dissolved in 500 mL of methylene chloride (MC), 23 mL (40 eq) of trifluoroacetic acid was slowly dropwise added thereto, and the mixture was stirred at room temperature for about 1 hour. After completion of the reaction, the reaction solution was extracted three times with 100 mL of water and 100 mL of diethylether. The organic layer was collected and then dried using magnesium sulfate to evaporate the solvent. The residue was separated and purified by silica gel column chromatography to obtain Compound 2-15.

Synthesis Example 3

Synthesis of Compound 2-13

Compound 2-13 was synthesized according to Reaction Scheme 3 below:

Reaction Scheme 3

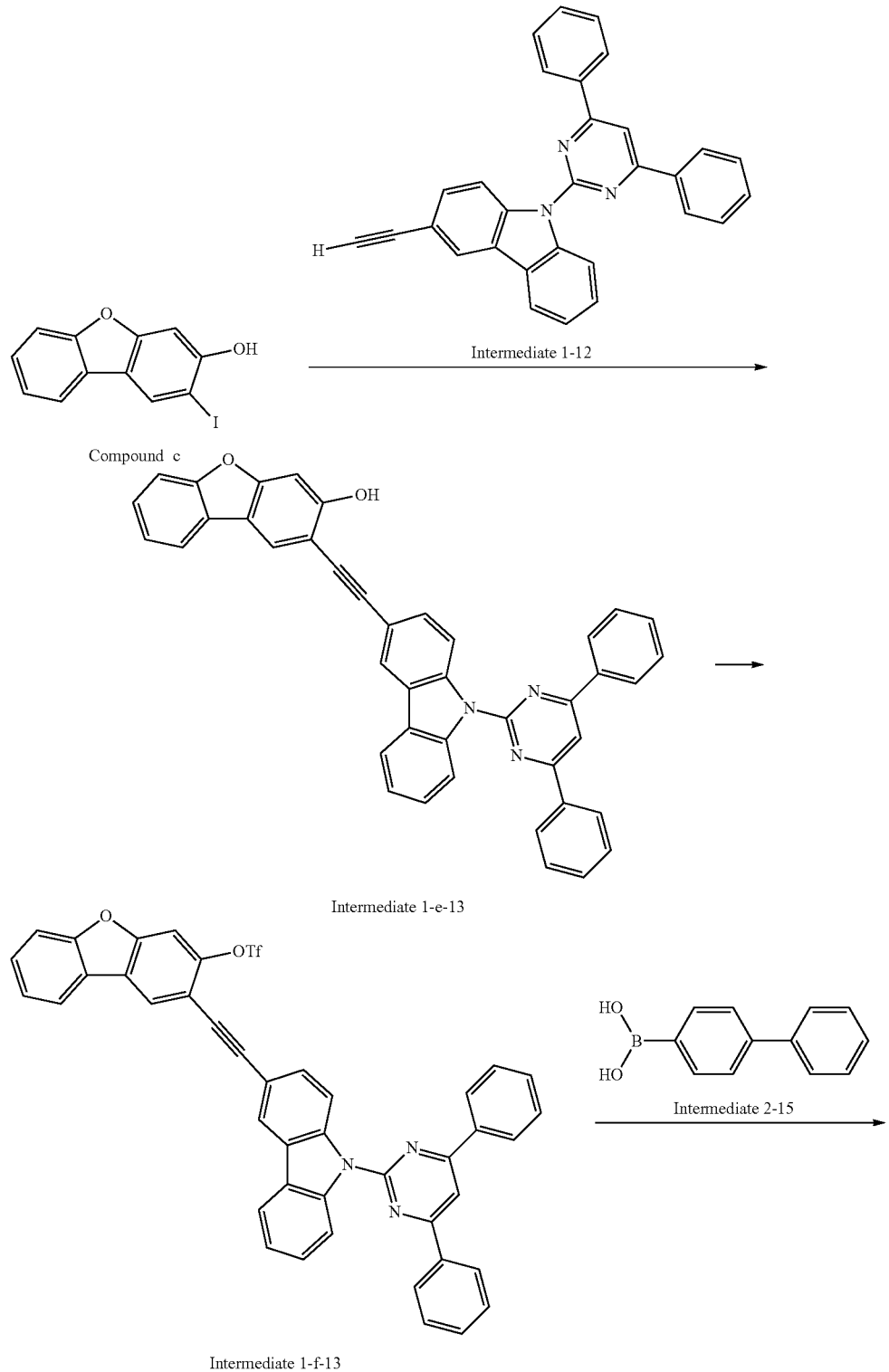

-continued

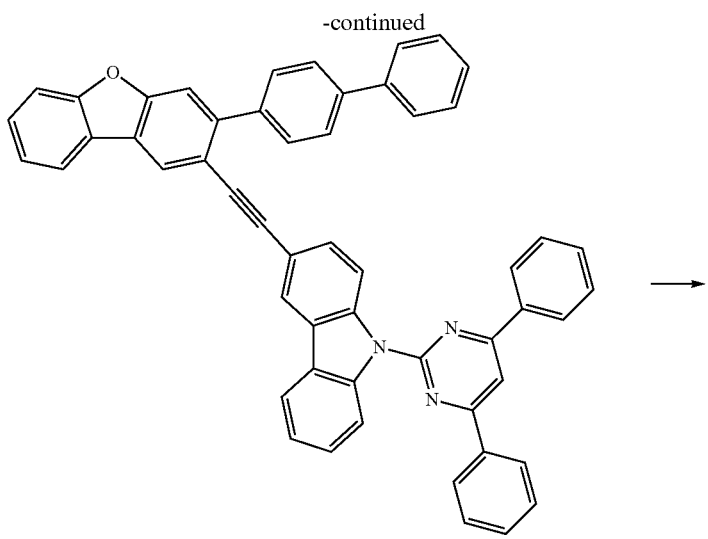

Intermediate 1-g-13

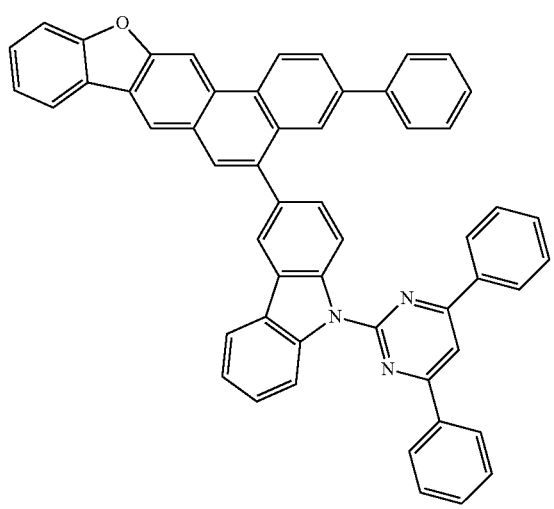

2-13

Synthesis of Intermediate 1-e-13

Intermediate 1-e-13 was prepared in the same manner as Intermediate 1-e, except that Compound c and Intermediate 1-12 were used instead of Compound a and Intermediate 1-4, respectively.

Synthesis of Intermediate 1-f-13

Intermediate 1-f-3 was prepared in the same manner as Intermediate 1-f, except that Intermediate 1-e-13 was used instead of Intermediate 1-e.

Synthesis of Intermediate 1-g-13

Intermediate 1-g-13 was prepared in the same manner as Intermediate 1-g, except that Intermediates 1-f-13 and Intermediate 2-15 were used instead of Intermediate 1-f and Intermediate 2-18, respectively.

Synthesis of Compound 2-13

Compound 2-13 was prepared in the same manner as Compound 2-10, except that Intermediate 1-g-13 was used instead of Intermediate 1-9.

Synthesis Example 4
Synthesis of Compound 2-17
Compound 2-17 was synthesized according to Reaction Scheme 4 below:
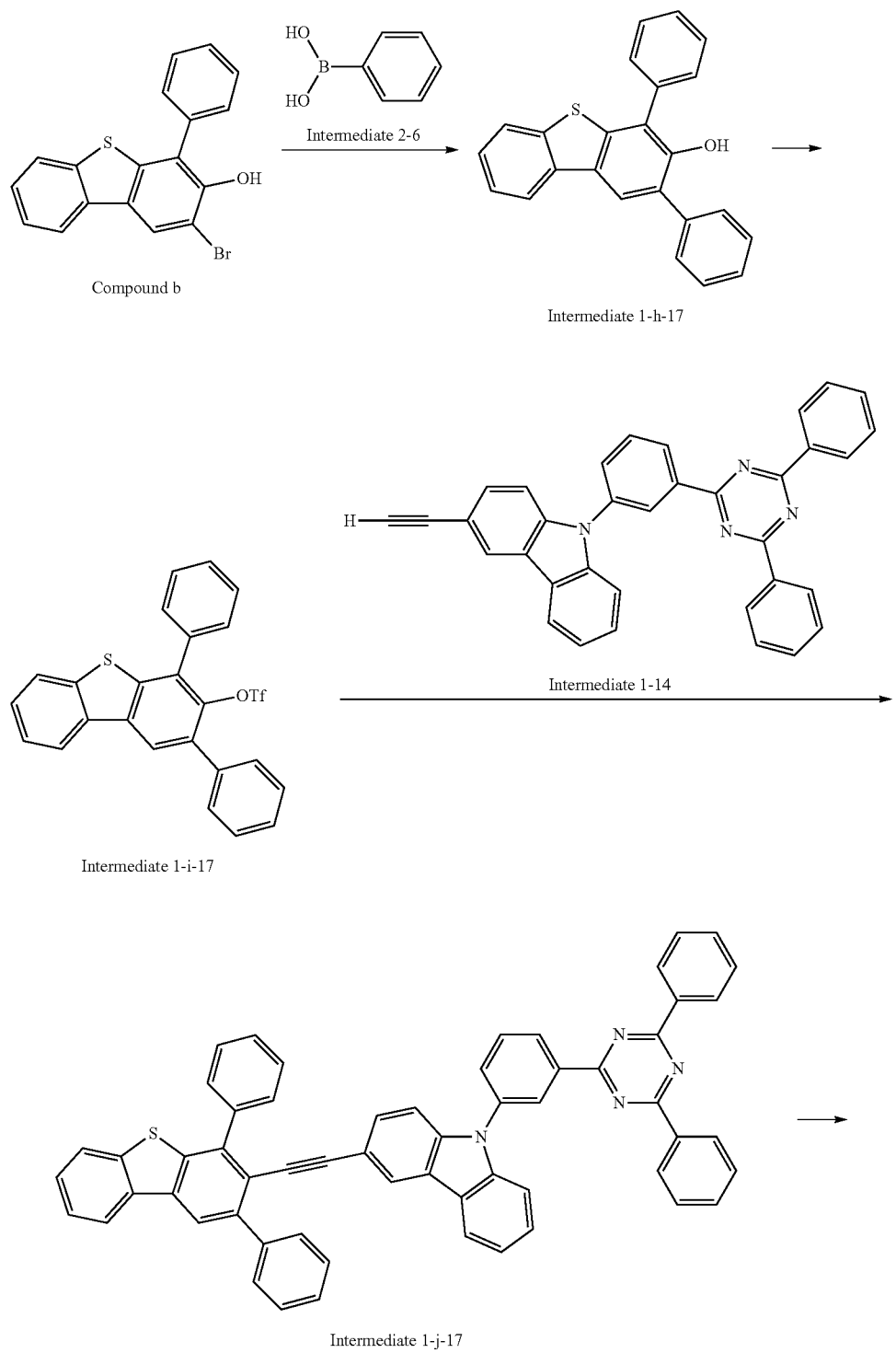

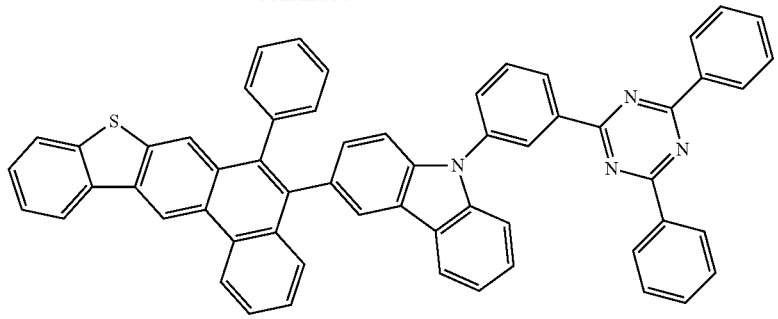

2-17

Synthesis of Intermediate 1-h-17

Intermediate 1-h-17 was prepared in the same manner as Intermediate 1-h, except that Intermediate 2-6 was used instead of Intermediate 2-18.

Synthesis of Intermediate 1-i-17

Intermediate 1-i-17 was prepared in the same manner as Intermediate 1-i, except that Intermediate 1-h-17 was used instead of Intermediate 1-h.

Synthesis of Intermediate 1-j-17

Intermediate 1-j-17 was prepared in the same manner as Intermediate 1-j, except that Intermediate 1-i-17 and Intermediate 1-14 were used instead of Intermediate 1-i and Intermediate 1-4, respectively.

Synthesis of Compound 2-17

Compound 2-17 was prepared in the same manner as Compound 2-15, except that Intermediate 1-j-17 was used instead of Intermediate 1-j.

Example 1

To manufacture an anode, a glass substrate with ITO/Ag/ITO deposited layers (70/1000/70 Å) was cut to a size of 50 mm×50 mm×0.5 mm and then ultrasonicated in isopropyl alcohol and pure water each for five minutes. The substrate was then cleaned by irradiation with ultraviolet rays for 30 minutes and exposure to ozone. The resulting glass substrate was loaded into a vacuum deposition device.

2-TNATA was vacuum-deposited on the anode to form an HIL having a thickness of 600 Å, and then Compound 1-8 was deposited on the HIL to form a HTL having a thickness of 1000 Å.

Compound 2-17 (host) and Ir(ppy)$_3$ (dopant) were co-deposited in a weight ratio of about 91:9 on the HTL to form an EML having a thickness of about 250 Å. Then, BCP was deposited on the EML to form a HBL having a thickness of about 50 Å. After deposition of Alq$_3$ on the HBL to form an ETL having a thickness of about 350 Å, LiF was deposited on the ETL to form an EIL having a thickness of about 10 Å. Then, Mg and Ag were deposited in a weight ratio of about 90:10 on the EIL to form a cathode having a thickness of about 120 Å, thereby completing manufacture of the organic light-emitting diode (emitting green light).

Example 2

An organic light-emitting diode was manufactured in the same manner as Example 1, except that Compound 1-19 was used instead of Compound 1-8 to form the HTL, and Compound 2-13 was used instead of Compound 2-17 as the host in forming the EML.

Example 3

To manufacture an anode, a glass substrate with ITO/Ag/ITO deposited layers (70/1000/70 Å) was cut to a size of 50 mm×50 mm×0.5 mm and then ultrasonicated in isopropyl alcohol and pure water each for five minutes. Then, the substrate was cleaned by irradiation with ultraviolet rays for 30 minutes and exposure to ozone. The resulting glass substrate was loaded into a vacuum deposition device.

2-TNATA was vacuum-deposited on the anode to form an HIL having a thickness of 600 Å, and then Compound 1-8 was deposited on the HIL to form a HTL having a thickness of 1350 Å.

Compound 2-10 (host) and PtOEP (dopant) were co-deposited in a weight ratio of about 91:9 on the HTL to form an EML having a thickness of about 400 Å. Then, BCP was deposited on the EML to form a HBL having a thickness of about 50 Å. After depositing Alq$_3$ on the HBL to form an ETL having a thickness of about 350 Å, LiF was deposited on the ETL to form an EIL having a thickness of about 10 Å. Then, Mg and Ag were deposited in a weight ratio of about 90:10 on the EIL to form a cathode having a thickness of about 120 Å, thereby manufacturing an organic light-emitting diode (emitting green light)

Example 4

An organic light-emitting diode was manufactured in the same manner as Example 3, except that Compound 1-17 was used instead of Compound 1-8 to form the HTL, and Compound 2-15 was used instead of Compound 2-10 as a host in forming the EML.

Comparative Example 1

An organic light-emitting diode was manufactured in the same manner as Example 1, except that Compound A, represented by Formula A below, was used instead of Compound 1-8 to form the HTL, and CBP was used instead of Compound 2-17 as a host in forming the EML.

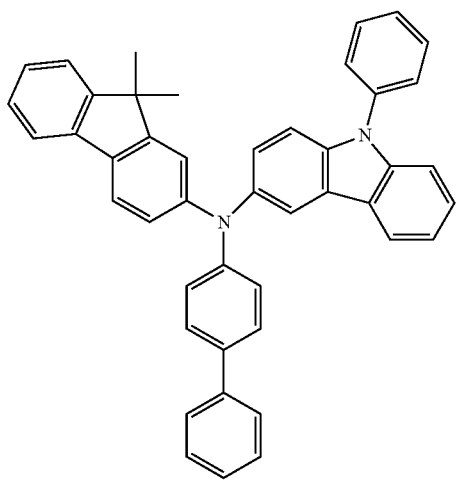 [SMILES: CC1(C)c2ccccc2-c2ccc(N(c3ccc(-c4ccccc4)cc3)c3ccc4c(c3)c3ccccc3n4-c3ccccc3)cc21]

Comparative Example 2

An organic light-emitting diode was manufactured in the same manner as Example 3, except that Compound A was used instead of Compound 1-8 to form the HTL, and CBP was used instead of Compound 2-10 as a host in forming the EML.

Evaluation Example 1

The driving voltages, current densities, luminance, emission colors, efficiencies, and half-life spans (@10 mA/cm$^2$) of the organic light-emitting diodes of Examples 1 to 4 and Comparative Examples 1 and 2 were evaluated using a PR650 (Spectroscan) Source Measurement Unit (available from Photo Research, Inc.). The results are shown in Table 1 below. $LT_{97}$ refers to the time (hr) elapsed until the initial luminance (assumed as 100%) was reduced to 97% during driving at about 10 mA/cm$^2$.

TABLE 1

| | HTL material | Host | Dopant | Driving voltage (V) | Current density (mA/cm$^2$) | Luminance (cd/m$^2$) | Efficiency (cd/A) | Emission color | $LT_{97}$ (hr) |
|---|---|---|---|---|---|---|---|---|---|
| Example 1 | Comp. 1-8 | Comp. 2-17 | Ir(ppy)$_3$ | 5.8 | 10 | 6,479 | 64.8 | Green | 81 |
| Example 2 | Comp. 1-19 | Comp. 2-13 | Ir(ppy)$_3$ | 5.9 | 10 | 6,652 | 66.5 | Green | 85 |
| Example 3 | Comp. 1-8 | Comp. 2-10 | PtOEP | 6.4 | 10 | 3,273 | 32.7 | Red | 138 |
| Example 4 | Comp. 1-17 | Comp. 2-15 | PtOEP | 6.2 | 10 | 3,524 | 35.2 | Red | 140 |
| Comp. Example 1 | Comp. A | CBP | Ir(ppy)$_3$ | 6.5 | 10 | 4,523 | 45.2 | Green | 60 |
| Comp. Example 2 | Comp. A | CBP | PtOEP | 6.8 | 10 | 2,548 | 25.8 | Red | 116 |

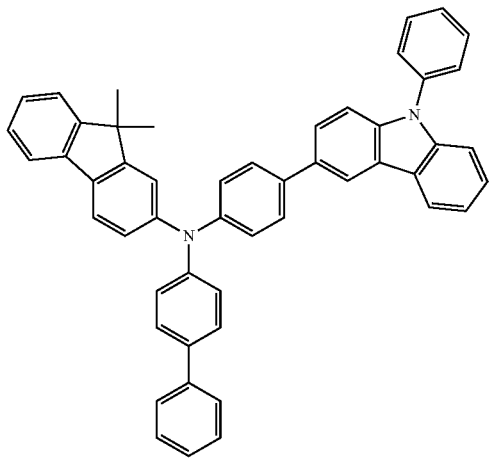

1-8

TABLE 1-continued
| HTL material | Host | Dopant | Driving voltage (V) | Current density (mA/cm$^2$) | Luminance (cd/m$^2$) | Efficiency (cd/A) | Emission color | LT$_{97}$ (hr) |
|---|---|---|---|---|---|---|---|---|
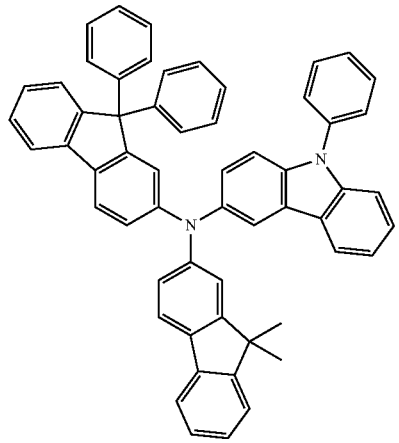
1-17
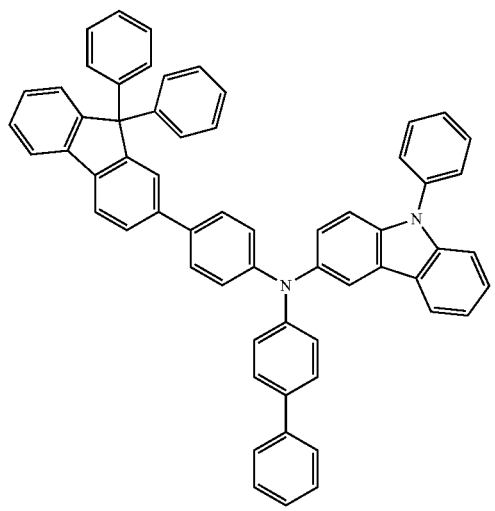
1-19
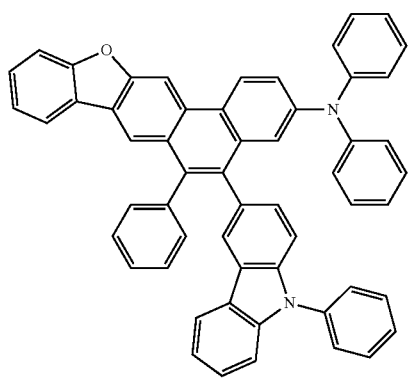
2-10

TABLE 1-continued

| HTL material | Host | Dopant | Driving voltage (V) | Current density (mA/cm²) | Luminance (cd/m²) | Efficiency (cd/A) | Emission color | LT₉₇ (hr) |
|---|---|---|---|---|---|---|---|---|

2-15

2-13

2-17

Referring to Table 1, the organic light-emitting diodes of Examples 1 and 2 had lower driving voltages, higher luminance, higher efficiencies, higher color purities, and longer lifetimes than the organic light-emitting diode of Comparative Example 1. The organic light-emitting diodes of Examples 3 and 4 had lower driving voltages, higher luminance, higher efficiencies, higher color purities, and longer lifetimes than the organic light-emitting diode of Comparative Example 2.

As described above, according to the one or more embodiments of the present invention, an organic light-emitting diode including a first compound of Formula 1 and a second compound of Formula 100 may have a low driving voltage, high luminance, high efficiency, and long lifetime.

It is understood that the exemplary embodiments described herein are to be considered in a descriptive sense only, and not for purposes of limitation. Also, descriptions of features or aspects of each embodiment should typically be considered as available for other similar features or aspects in other embodiments.

What is claimed is:

1. An organic light-emitting diode, comprising:
a substrate;
a first electrode on the substrate;
a second electrode facing the first electrode;
an emission layer between the first electrode and the second electrode;
a hole transfer region between the first electrode and the emission layer; and
an electron transfer region between the emission layer and the second electrode,
wherein the hole transfer region comprises a first compound represented by Formula 1, and the emission layer comprises a second compound represented by Formula 100A or 100B:

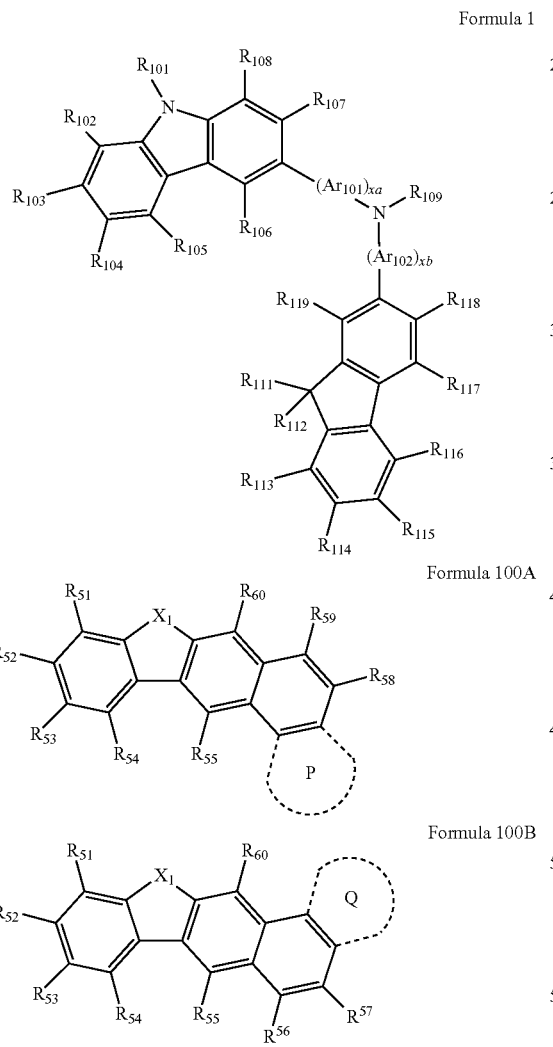

Formula 1

Formula 100A

Formula 100B wherein, in Formula 1:
$Ar_{101}$ and $Ar_{102}$ are each independently a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;

xa and xb are each independently an integer of 0 to 5;
$R_{101}$ and $R_{109}$ are each independently a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group;
$R_{102}$ to $R_{108}$, and $R_{111}$ to $R_{119}$ are each independently a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthiol group, a substituted or unsubstituted $C_2$-$C_{60}$ heteroaryl group, —$N(Q_1)(Q_2)$, or —$Si(Q_3)(Q_4)(Q_5)$; and
$Q_1$ to $Q_5$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group; and
in Formula 100A and 100B:
$X_1$ is O or S;
Ring P and ring Q are each independently a substituted or unsubstituted $C_3$-$C_{60}$ cyclic moiety, or a substituted or unsubstituted $C_2$-$C_{60}$ heterocyclic moiety;
$R_{51}$ to $R_{60}$ are each independently a substituent represented by —$(Ar_{51})_q$—$(Ar_{61})$;
$Ar_{51}$ is a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;
$Ar_{61}$ is a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, a substituted or unsubstituted $C_2$-$C_{60}$ heteroaryl group, —$N(Q_{21})(Q_{22})$, or —$Si(Q_{23})(Q_{24})(Q_{25})$;
$Q_{21}$ and $Q_{22}$ are each independently a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, or a substituted or unsubstituted $C_2$-$C_{60}$ heteroaryl group; and $Q_{23}$ to $Q_{25}$ are each independently a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, or a substituted or unsubstituted $C_2$-$C_{60}$ heteroaryl group; and q is an integer of 0 to 5, provided that $Ar_{51}$ of $R_{57}$ in Formula 100B is a group represented by one of Formulae 103-4 to 103-10 and 103-14 to 103-16:

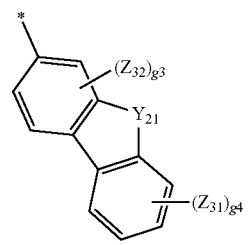

Formula 103-4

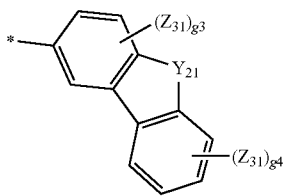

Formula 103-5

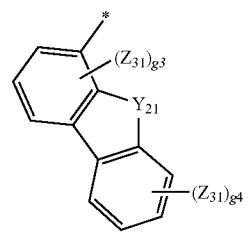

Formula 103-6

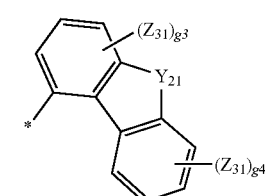

Formula 103-7

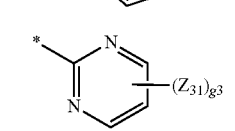

Formula 103-8

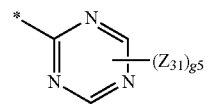

Formula 103-9

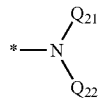

Formula 103-10

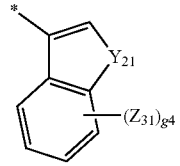

Formula 103-14

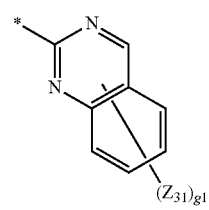

Formula 103-15

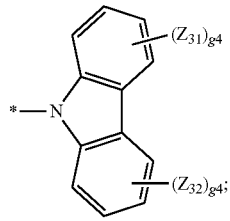

Formula 103-16 wherein, in Formulae 103-4 to 103-10 and 103-14 to 103-16:

$Y_{21}$ is O, S, or N($Z_{43}$);

$Z_{31}$ and $Z_{32}$ are each independently a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group;

g1 is an integer of 1 to 5;

g3 is an integer of 1 to 3;

g4 is an integer of 1 to 4; and g5 is 1 or 2.

2. The organic light-emitting diode of claim 1, wherein $Ar_{101}$ and $Ar_{102}$ in Formula 1 are each independently a moiety represented by one of Formulae 3-1 to 3-24:

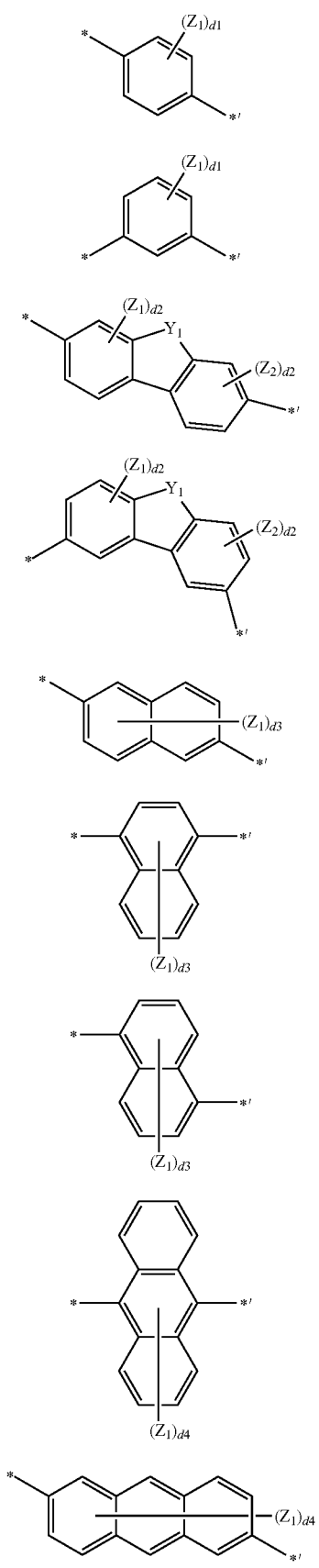
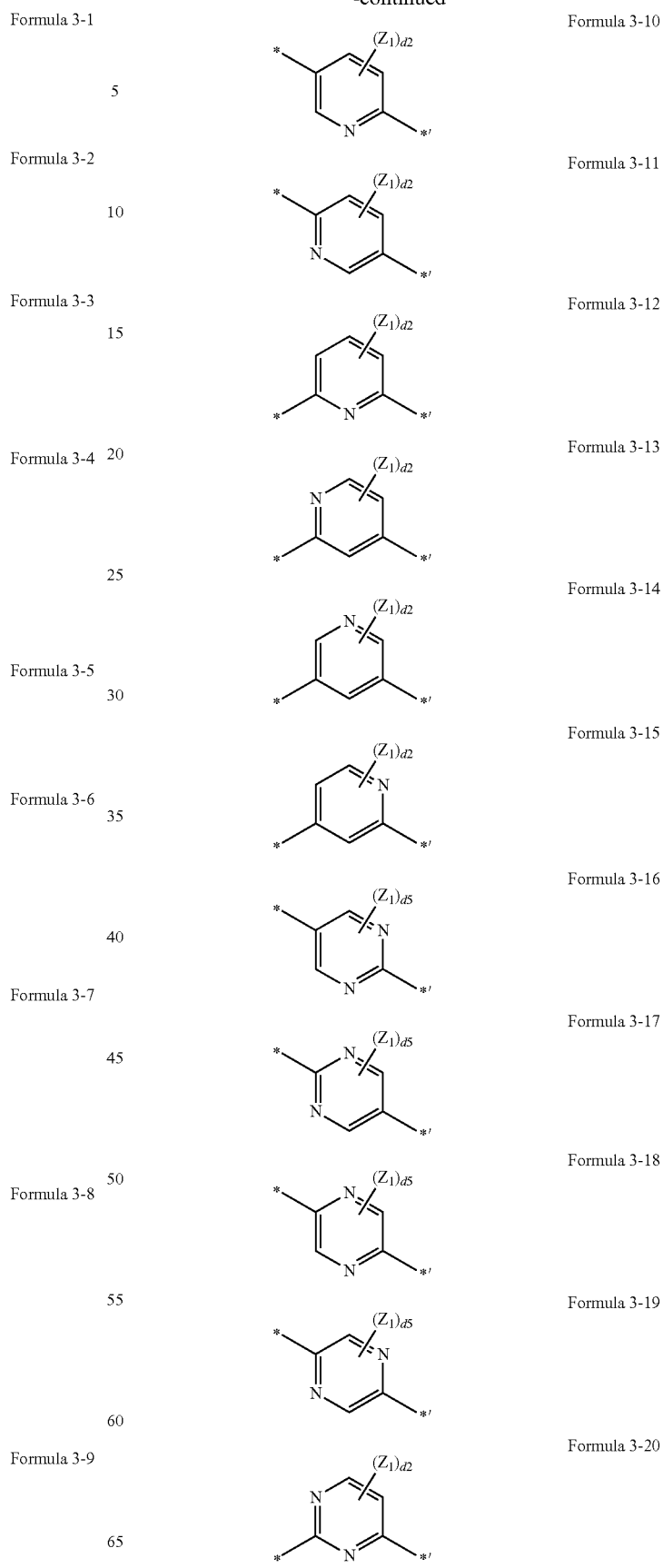

-continued

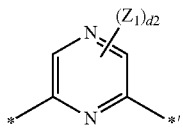
Formula 3-21

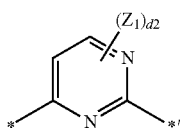
Formula 3-22

Formula 3-23

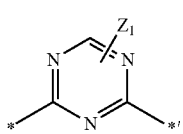
Formula 3-24 wherein, in Formulae 3-1 to 3-24:
$Y_1$ is O, S, $C(R_{21})(R_{22})$, or $N(R_{23})$;
$Z_1$, $Z_2$, and $R_{21}$ to $R_{23}$ are each independently:
  i) a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group, or
  ii) a $C_1$-$C_{20}$ alkyl group or a $C_1$-$C_{20}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof, or
  iii) a $C_6$-$C_{20}$ aryl group or a $C_2$-$C_{20}$ heteroaryl group, or
  iv) a $C_6$-$C_{20}$ aryl group or a $C_2$-$C_{20}$ heteroaryl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group, or
  v) $-N(Q_{11})(Q_{12})$, or $-Si(Q_{13})(Q_{14})(Q_{15})$, wherein $Q_{11}$ to $Q_{15}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group;
d1 is an integer of 1 to 4;
d2 is an integer of 1 to 3;
d3 is an integer of 1 to 6;
d4 is an integer of 1 to 8; and
d5 is 1 or 2.

3. The organic light-emitting diode of claim 1, wherein $Ar_{101}$ and $Ar_{102}$ in Formula 1 are each independently a moiety represented by one of Formulae 4-1 to 4-7:

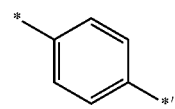
Formula 4-1

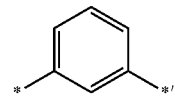
Formula 4-2

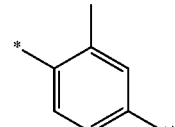
Formula 4-3

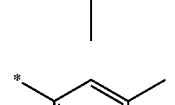
Formula 4-4

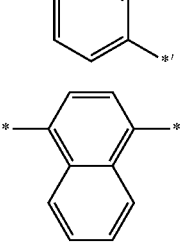
Formula 4-5

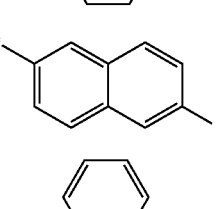
Formula 4-6

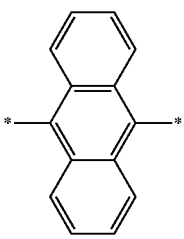
Formula 4-7

4. The organic light-emitting diode of claim 1, wherein, in Formula 1, either: i) xa=0 and xb=0; or ii) xa=1 and xb=0; or iii) xa=2 and xb=0; or iv) xa=0 and xb=1; or v) xa=0 and xb=2; or vi) xa=1 and xb=1.

5. The organic light-emitting diode of claim 1, wherein, in Formula 1, $R_{101}$ and $R_{109}$ are each independently a moiety represented by one of Formulae 5-1 to 5-22:

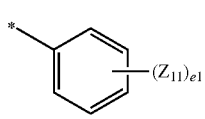
Formula 5-1

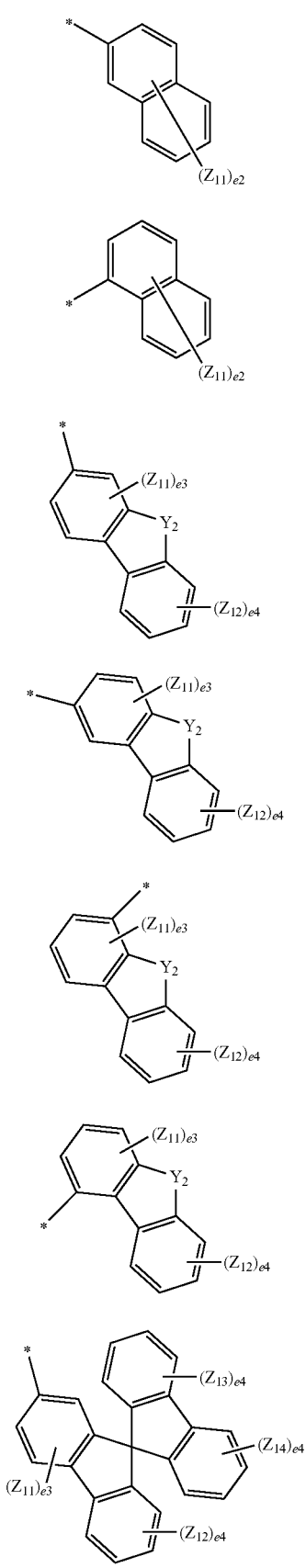
Formula 5-2
Formula 5-3
Formula 5-4
Formula 5-5
Formula 5-6
Formula 5-7
Formula 5-8
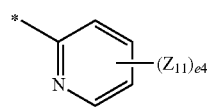
Formula 5-9
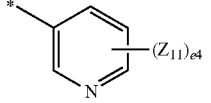
Formula 5-10
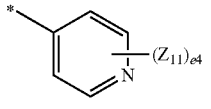
Formula 5-11
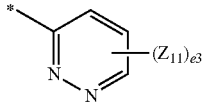
Formula 5-12
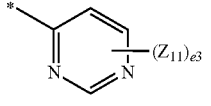
Formula 5-13
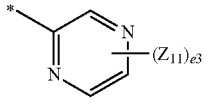
Formula 5-14
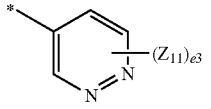
Formula 5-15
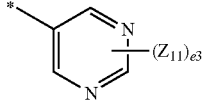
Formula 5-16
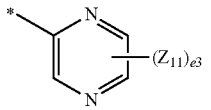
Formula 5-17
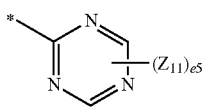
Formula 5-18
Formula 5-19

Formula 5-19

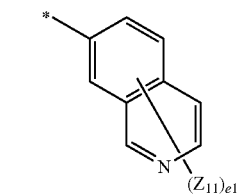

Formula 5-21

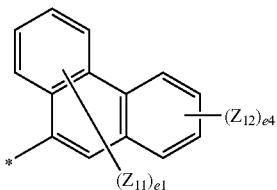

Formula 5-22

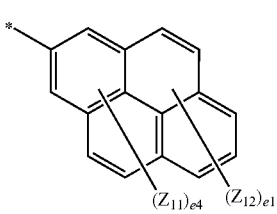

wherein, in Formulae 5-1 to 5-22:
$Y_2$ and $Y_3$ are each independently O, S, $C(R_{25})(R_{26})$, or $N(R_{27})$;
$Z_{11}$ to $Z_{14}$, and $R_{25}$ to $R_{27}$ are each independently:
  i) a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group, or
  ii) a $C_1$-$C_{20}$ alkyl group or a $C_1$-$C_{20}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof, or
  iii) a $C_6$-$C_{20}$ aryl group or a $C_2$-$C_{20}$ heteroaryl group, or
  iv) a $C_6$-$C_{20}$ aryl group or a $C_2$-$C_{20}$ heteroaryl group substituted with at least one of a deuterium atom, a halogen atom, a hydroxyl group, a cyano group, a nitro group, an amino group, an amidino group, a hydrazine, a hydrazone, a carboxyl group or a salt thereof, sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ an alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group, or
  v) $-N(Q_{11})(Q_{12})$, or $-Si(Q_{13})(Q_{14})(Q_{15})$, wherein $Q_{11}$ to $Q_{15}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group;
e1 is an integer of 1 to 5;
e2 is an integer of 1 to 7;
e3 is an integer of 1 to 3;
e4 is an integer of 1 to 4; and
e5 is 1 or 2.

6. The organic light-emitting diode of claim 1, wherein $R_{101}$ in Formula 1 is represented by one of Formulae 6-1 to 6-8, and $R_{109}$ in Formula 1 is represented by one of Formulae 6-1 to 6-11:

Formula 6-1

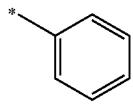

Formula 6-2

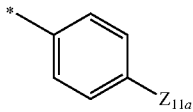

Formula 6-3

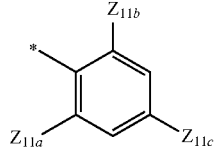

Formula 6-4

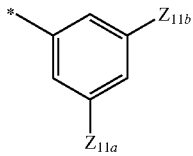

Formula 6-5

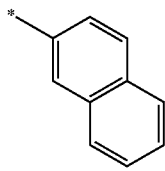

Formula 6-6

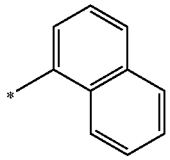

Formula 6-7

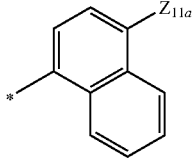

Formula 6-8

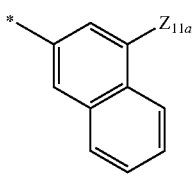

-continued

Formula 6-9

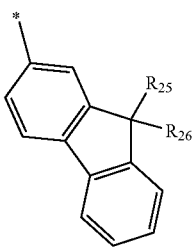

Formula 6-10

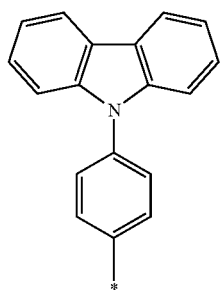

Formula 6-11

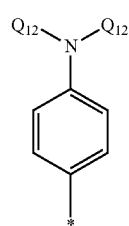

wherein, in Formulae 6-1 to 6-11:

$Z_{11a}$ to $Z_{11c}$, $R_{25}$, and $R_{26}$ are each independently:
  i) a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group, or
  ii) a $C_1$-$C_{20}$ alkyl group or a $C_1$-$C_{20}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof, or
  iii) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group, or
  iv) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluore-nyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group; and each $Q_{12}$ is each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

7. The organic light-emitting diode of claim 1, wherein $R_{111}$ and $R_{112}$ in Formula 1 are each independently:
  i) a $C_1$-$C_{20}$ alkyl group, or
  ii) a $C_1$-$C_{20}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof, or
  iii) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group, or
  iv) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

8. The organic light-emitting diode of claim 1, wherein the ring P and the ring Q are each independently:
  i) benzene, naphthalene, fluorene, carbazole, dibenzofuran, or dibenzothiophene; or
  ii) benzene, naphthalene, fluorene, carbazole, dibenzofuran, or dibenzothiophene substituted with at least one of:
    ii)a) a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group, or
    ii)b) a $C_1$-$C_{20}$ alkyl group, or a $C_1$-$C_{60}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof, or
    ii)c) a phenyl group, a naphthyl group, an anthryl group, a fluorenyl group, a carbazolyl group, a pyridinyl group, a pyrimidinyl group, a pyrazinyl group, a pyridazinyl group, triazinyl group, a quinolyl group, or an isoquinolyl group, or ii)d) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group, or ii)e) —$N(Q_{11})(Q_{12})$, wherein $Q_{11}$ and $Q_{12}$ are each independently a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

9. The organic light-emitting diode of claim 1, wherein the second compound is represented by one of Formulae 100A-1 to 100A-8 and 100B-1 to 100B-8:

Formula 100A-1

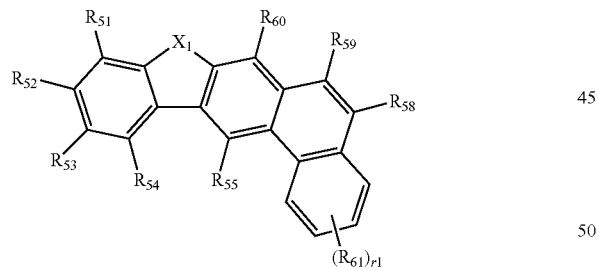

Formula 100A-2

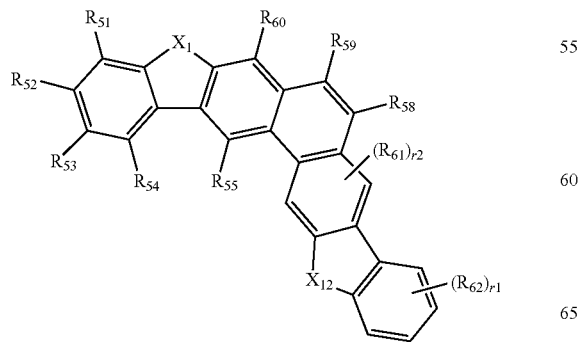

Formula 100A-3

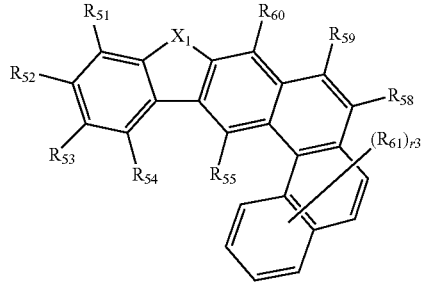

Formula 100A-4

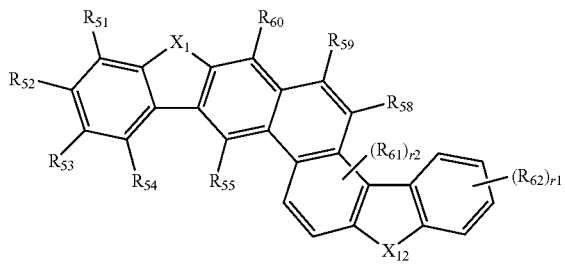

Formula 100A-5

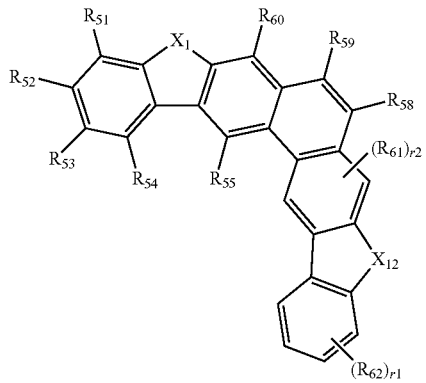

Formula 100A-6

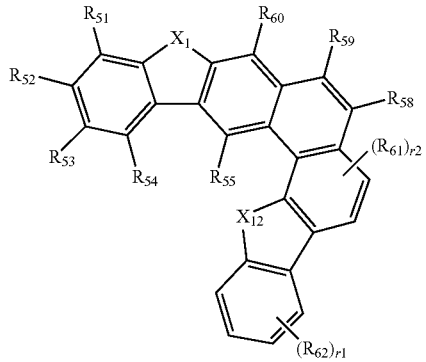

Formula 100A-7

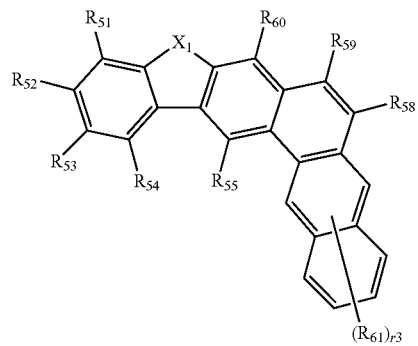

Formula 100A-8

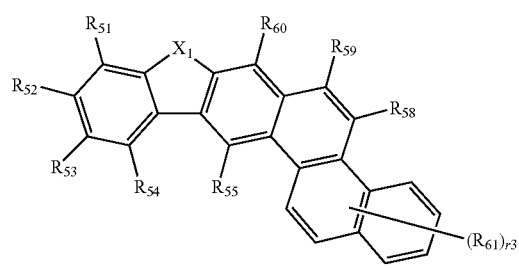

Formula 100B-1

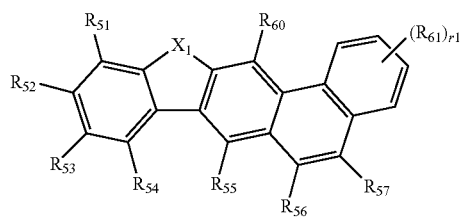

Formula 100B-2

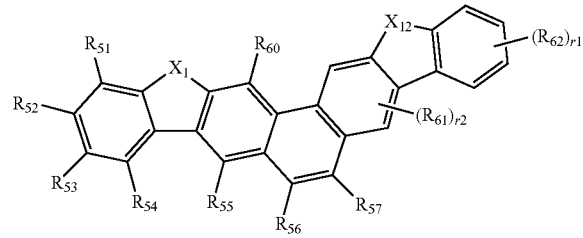

Formula 100B-3

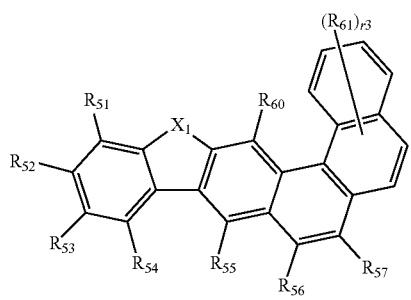

Formula 100B-4

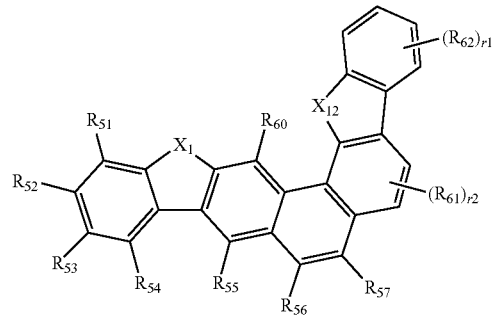

Formula 100B-5

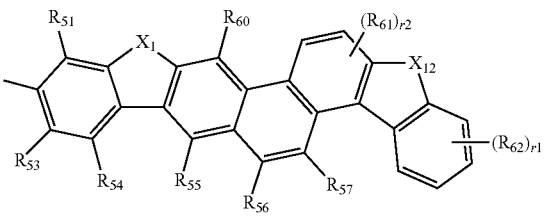

Formula 100B-6

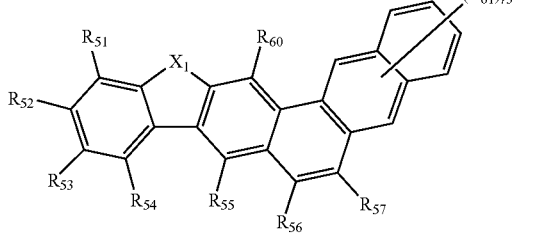

Formula 100B-7

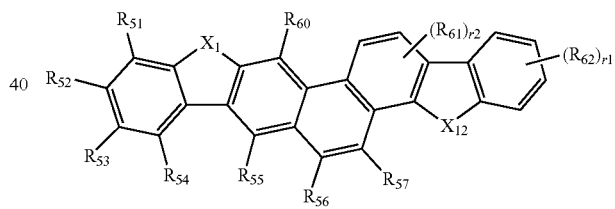

Formula 100B-8

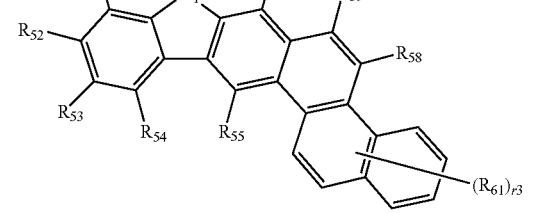

wherein, in Formulae 100A-1 to 100A-8 and 100B-1 to 100B-8:

$X_{12}$ is O, S, C($R_{71}$)($R_{72}$), or N($R_{73}$);

$R_{61}$, $R_{62}$, and $R_{71}$ to $R_{73}$ are each independently:

i) a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, or ii) a $C_1$-$C_{60}$ alkyl group, a $C_2$-$C_{60}$ alkenyl group, a $C_2$-$C_{60}$ alkynyl group, or a $C_1$-$C_{60}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof, or iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group, or iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or a isoquinolyl group, or v) —N($Q_{11}$)($Q_{12}$), or —Si($Q_{13}$)($Q_{14}$)($Q_{15}$), wherein $Q_{11}$ and $Q_{12}$ are each independently a $C_6$-$C_{60}$ aryl group or a $C_2$-$C_{60}$ heteroaryl group, and $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group;

r1 is an integer of 1 to 4;
r2 is 1 or 2; and
r3 is an integer of 1 to 6.

10. The organic light-emitting diode of claim 1, wherein $Ar_{51}$ in Formula 100A and 100B is:

i) a phenylene group, a naphthalene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, or a dibenzothiophenylene group, or ii) a phenylene group, a naphthalene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, or a dibenzothiophenylene group substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

11. The organic light-emitting diode of claim 1, wherein $Ar_{61}$ of $R_{56}$, $R_{57}$, $R_{58}$ and $R_{59}$ in Formula 100A and 100B is a group represented by one of Formulae 103-1 to 103-16:

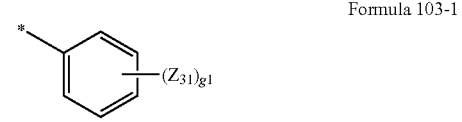

Formula 103-1

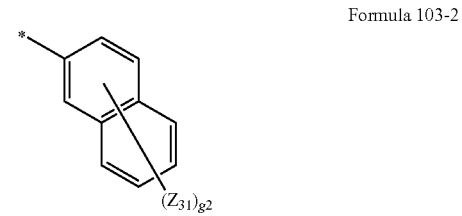

Formula 103-2

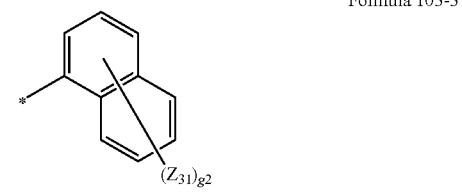

Formula 103-3

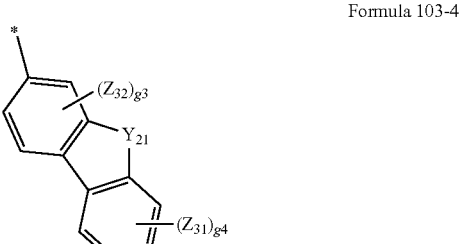

Formula 103-4

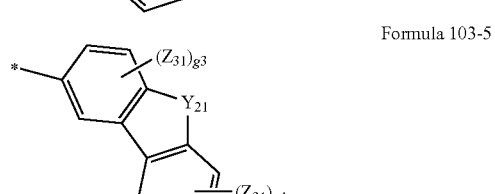

Formula 103-5

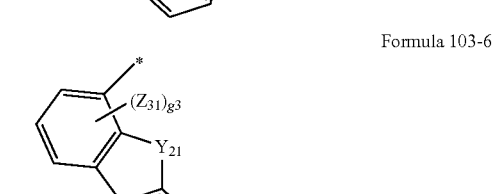

Formula 103-6

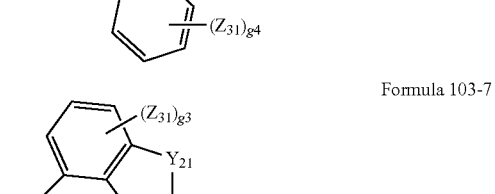

Formula 103-7

-continued

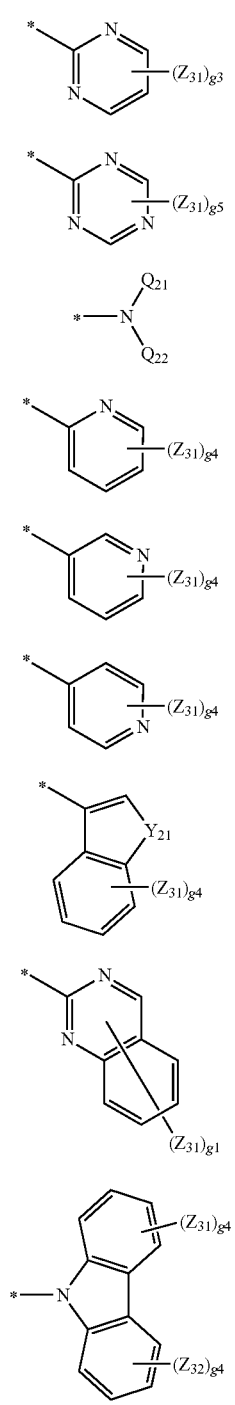

Formula 103-8

Formula 103-9

Formula 103-10

Formula 103-11

Formula 103-12

Formula 103-13

Formula 103-14

Formula 103-15

Formula 103-16 wherein, in Formulae 103-1 to 103-16:
$Y_{21}$ is O, S, $C(Z_{41})(Z_{42})$, or $N(Z_{43})$;
$Z_{31}$, $Z_{32}$, and $Z_{41}$ to $Z_{43}$ are each independently a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group;

$Q_{21}$ and $Q_{22}$ are each independently a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group;

g1 is an integer of 1 to 5;
g2 is an integer of 1 to 7;
g3 is an integer of 1 to 3;
g4 is an integer of 1 to 4; and
g5 is 1 or 2.

12. An organic light-emitting diode, comprising:
a substrate;
a first electrode on the substrate;
a second electrode facing the first electrode;
an emission layer between the first electrode and the second electrode;
a hole transfer region between the first electrode and the emission layer; and
an electron transfer region between the emission layer and the second electrode,
wherein the hole transfer region comprises a first compound represented by Formula 1, and the emission layer comprises a second compound represented by Formula 100A-H1, 100A-H2, 100B-H1, or 100B-H2:

Formula 1

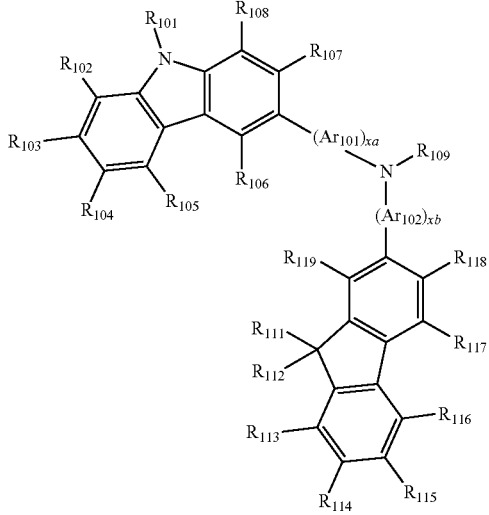

wherein, in Formula 1:
$Ar_{101}$ and $Ar_{102}$ are each independently a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;
xa and xb are each independently an integer of 0 to 5;

$R_{101}$ and $R_{109}$ are each independently a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group;

$R_{102}$ to $R_{108}$ and $R_{111}$ to $R_{119}$ are each independently a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthiol group, a substituted or unsubstituted $C_2$-$C_{60}$ heteroaryl group, —N($Q_1$)($Q_2$), or —Si($Q_3$)($Q_4$)($Q_5$); and $Q_1$ to $Q_5$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group;

<Formula 100A-H1>

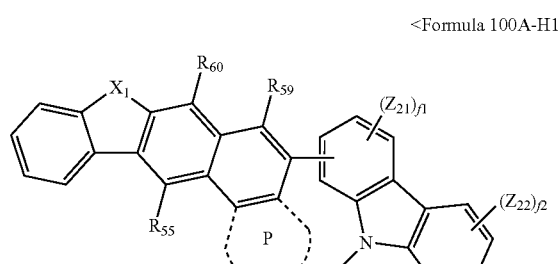

<Formula 100A-H2>

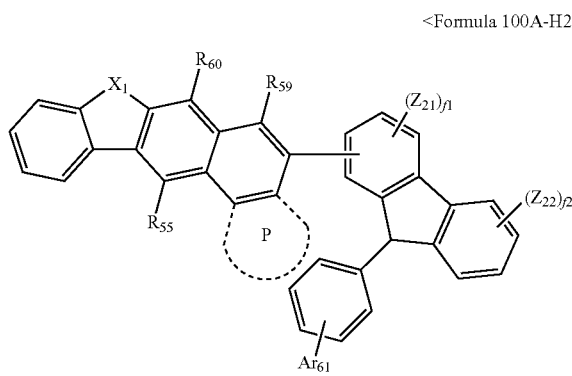

Formula 100B-H1

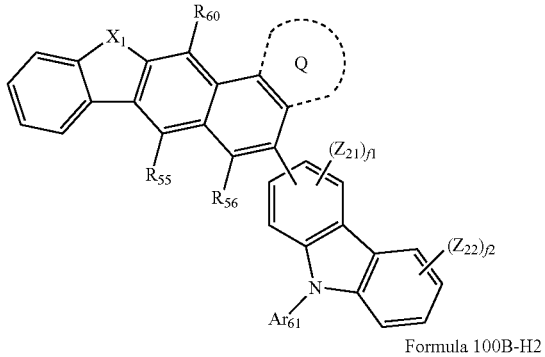

Formula 100B-H2

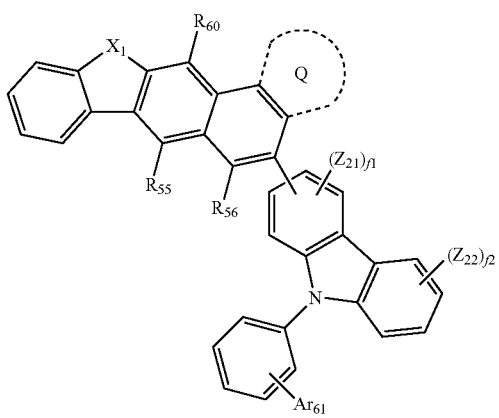

wherein, in Formulae 100A-H1, 100A-H2, 100B-H1, and 100B-H2:

$X_1$ is O or S;

ring P and ring Q are each independently:
  i) benzene, naphthalene, fluorene, carbazole, dibenzofuran, or dibenzothiophene; or
  ii) benzene, naphthalene, fluorene, carbazole, dibenzofuran, or dibenzothiophene substituted with at least one of:
    ii)a) a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group, or
    ii)b) a $C_1$-$C_{20}$ alkyl group, or a $C_1$-$C_{60}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof, or
    ii)c) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group, or
    ii)d) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, or an isoquinolyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group, or —N($Q_{11}$)($Q_{12}$), wherein $Q_{11}$ and $Q_{12}$ are each independently a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group;

$R_{55}$, $R_{56}$, $R_{59}$, $R_{60}$, $Z_{21}$, and $Z_{22}$ are each independently a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group;

f1 and f2 are each independently 0, 1, or 2; and $Ar_{61}$ is a group represented by one of Formulae 103-1 to 103-16:

Formula 103-1

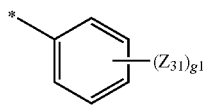

Formula 103-2

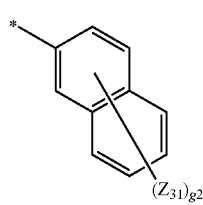

Formula 103-3

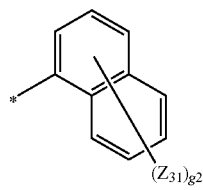

Formula 103-4

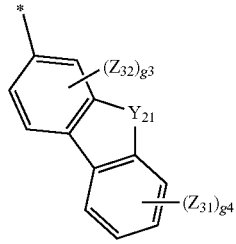

Formula 103-5

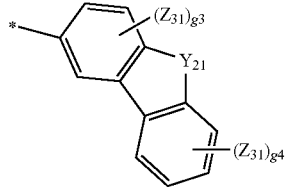

Formula 103-6

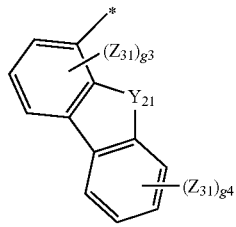

Formula 103-7

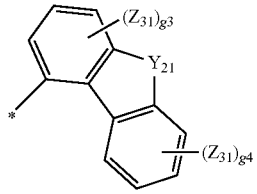

Formula 103-8

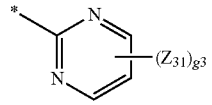

Formula 103-9

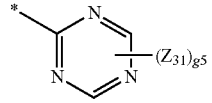

Formula 103-10

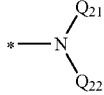

Formula 103-11

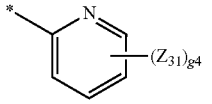

Formula 103-12

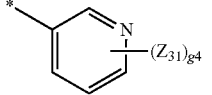

-continued

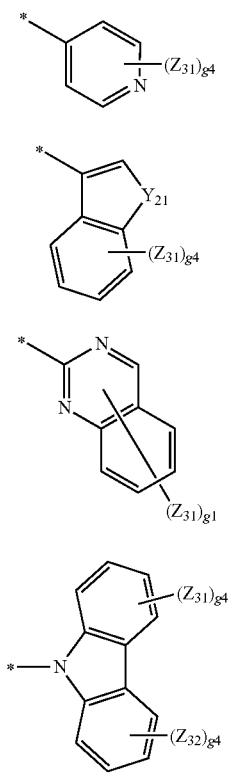

Formula 103-13

Formula 103-14

Formula 103-15

Formula 103-16 wherein, in Formulae 103-1 to 103-16:

$Y_{21}$ is O, S, $C(Z_{41})(Z_{42})$, Or $N(Z_{43})$;

$Z_{31}$, $Z_{32}$, and $Z_{41}$ to $Z_{43}$ are each independently a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group;

$Q_{21}$ and $Q_{22}$ are each independently a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group;

g1 is an integer of 1 to 5;

g2 is an integer of 1 to 7;

g3 is an integer of 1 to 3;

g4 is an integer of 1 to 4; and g5 is 1 or 2.

13. The organic light-emitting diode of claim 1, wherein the first compound is one of Compounds 1-1 to 1-19:

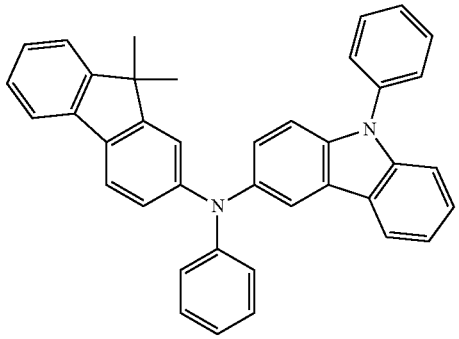

1-1

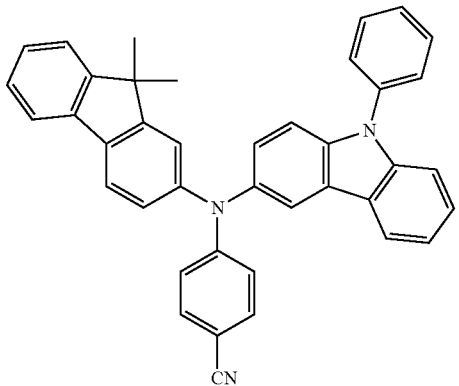

1-2

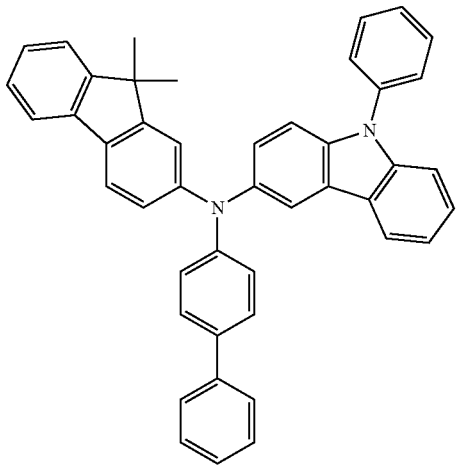

1-3

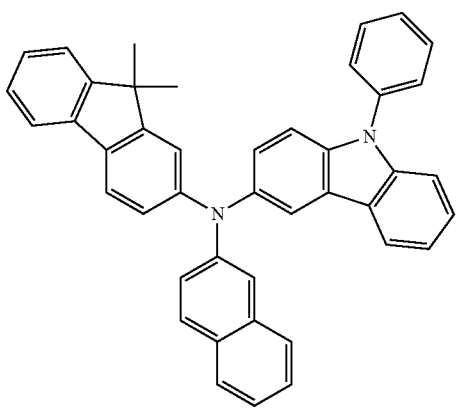

1-4

1-5
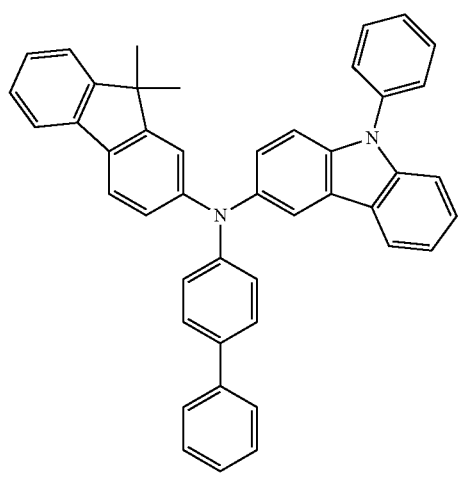
1-6
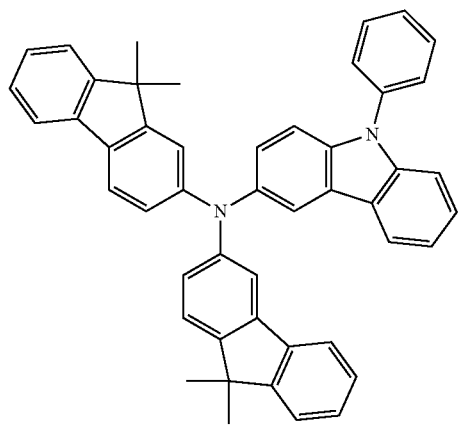
1-7
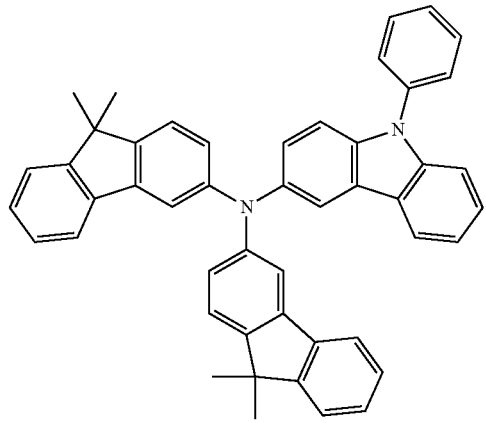
1-8
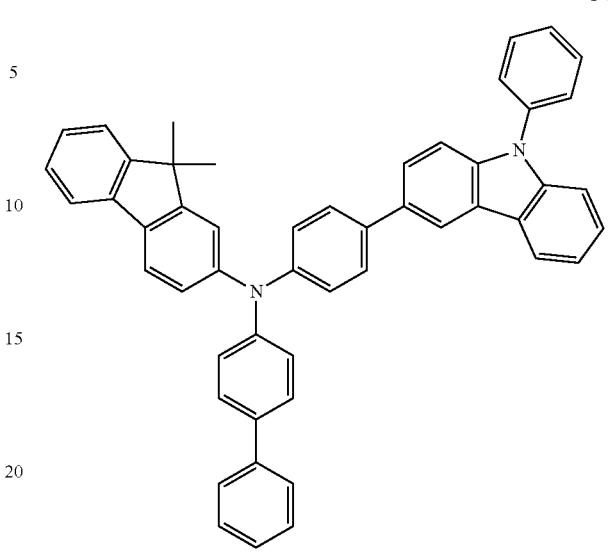
1-9
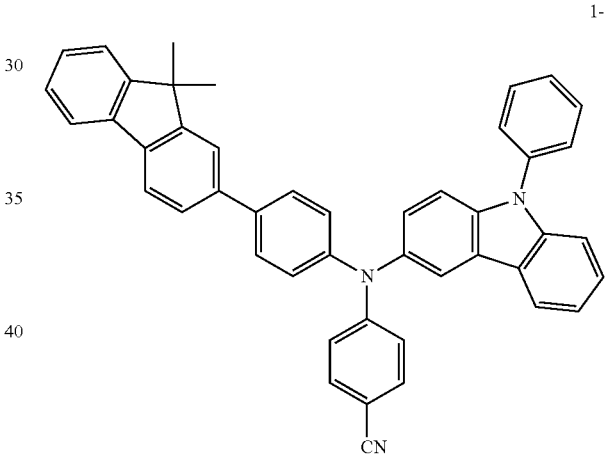
1-10
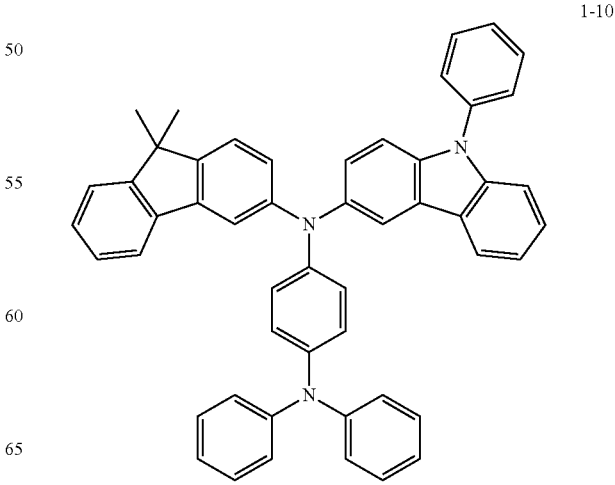

-continued
1-11
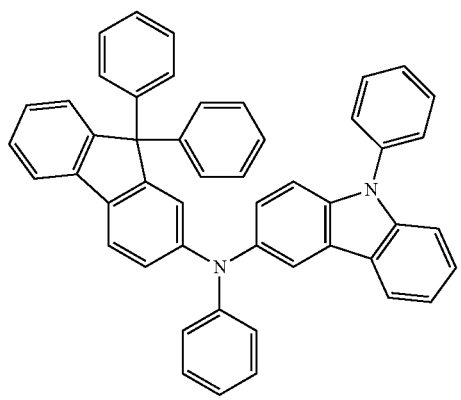
1-12
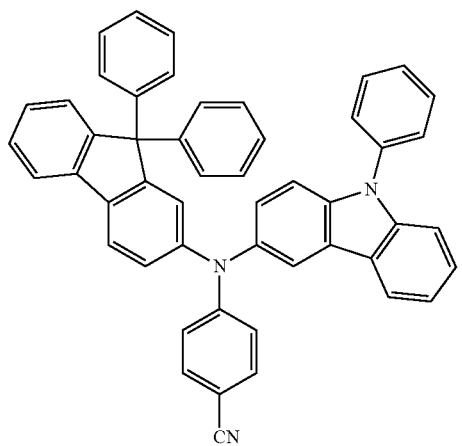
1-13
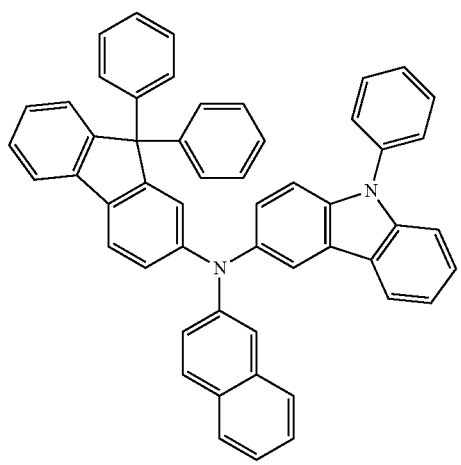
-continued
1-14
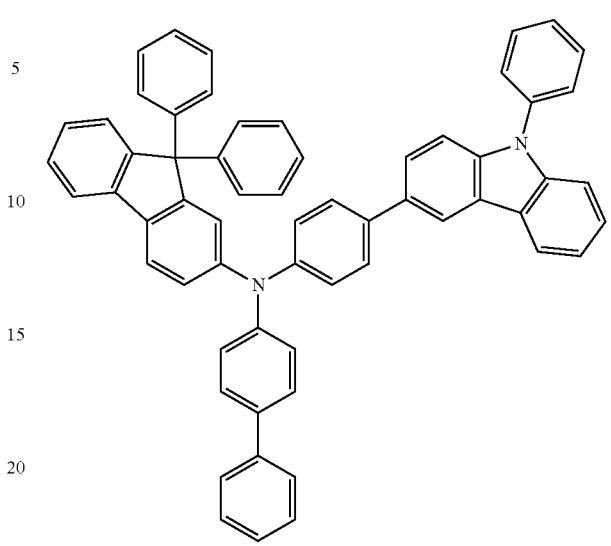
1-15
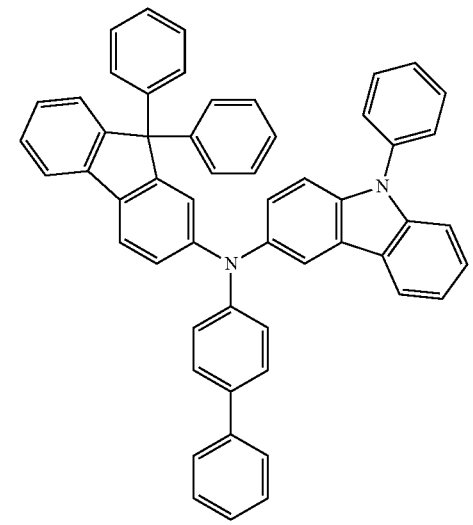
1-16
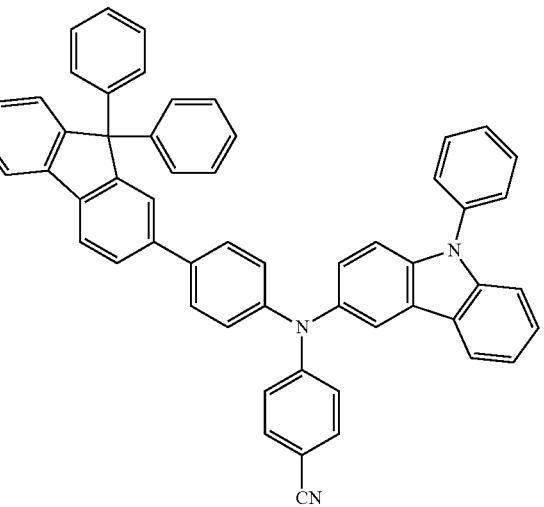

-continued 1-17

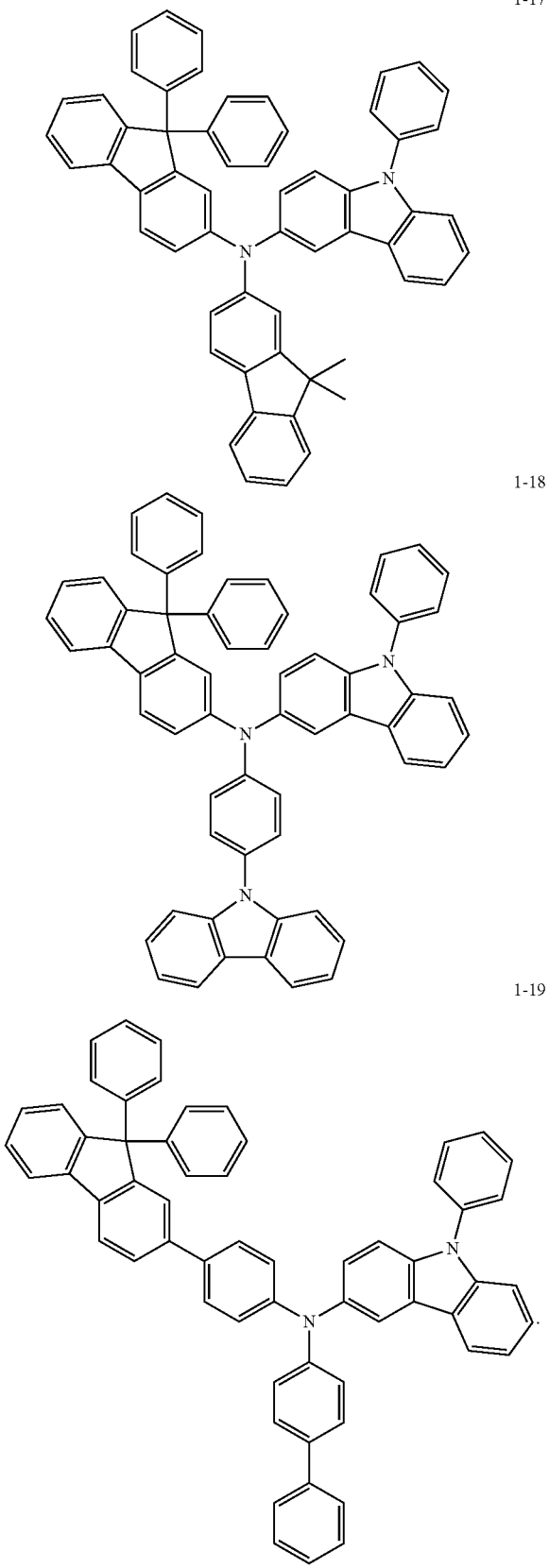

1-18

1-19

14. An organic light-emitting diode, comprising:
a substrate;
a first electrode on the substrate;
a second electrode facing the first electrode;
an emission layer between the first electrode and the second electrode;
a hole transfer region between the first electrode and the emission layer; and
an electron transfer region between the emission layer and the second electrode,
wherein the hole transfer region comprises a first compound represented by Formula 1, and the emission layer comprises a second compound selected from the group consisting of Compounds 2-1 through 2-25:

Formula 1

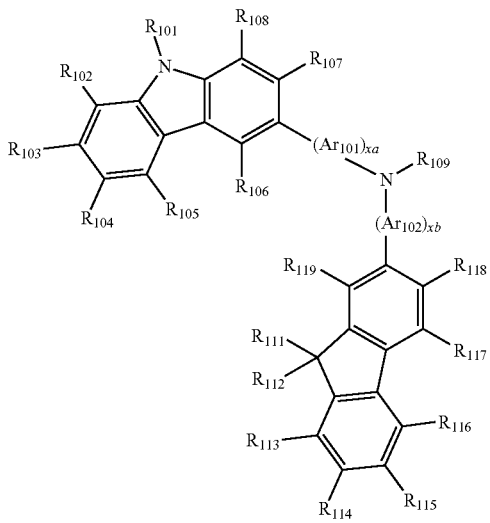

wherein, in Formula 1:
$Ar_{101}$ and $Ar_{102}$ are each independently a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;
xa and xb are each independently an integer of 0 to 5;
$R_{101}$ and $R_{109}$ are each independently a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group;
$R_{102}$ to $R_{108}$ and $R_{111}$ to $R_{119}$ are each independently a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthiol group, a substituted or unsubstituted $C_2$-$C_{60}$ heteroaryl group, —N($Q_1$)($Q_2$), or —Si($Q_3$)($Q_4$)($Q_5$); and $Q_1$ to $Q_5$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group;

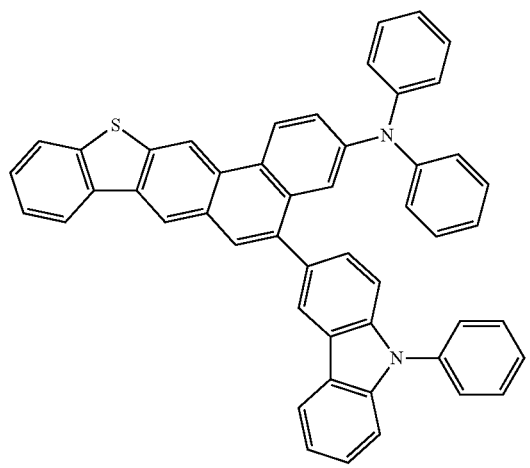

2-1

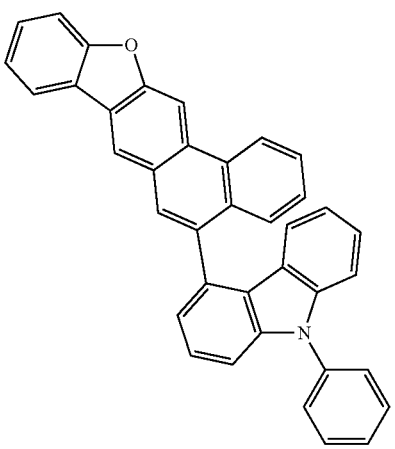

2-2

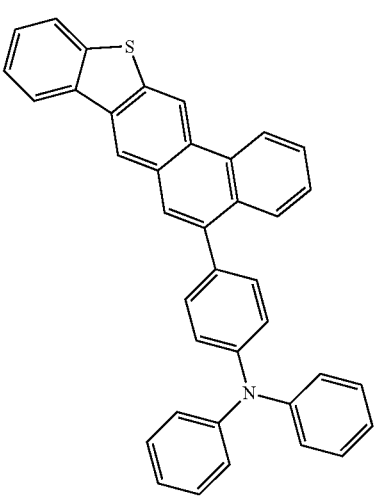

2-3

-continued

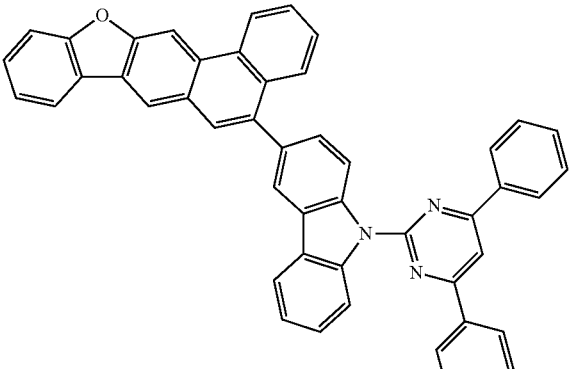

2-4

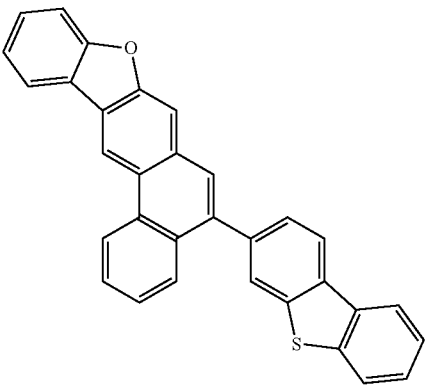

2-5

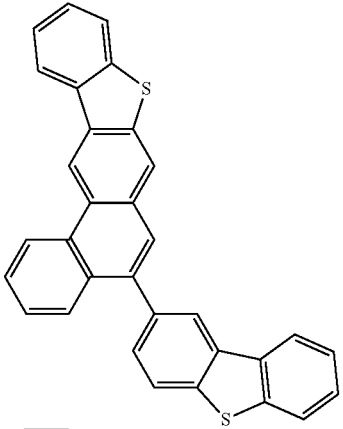

2-6

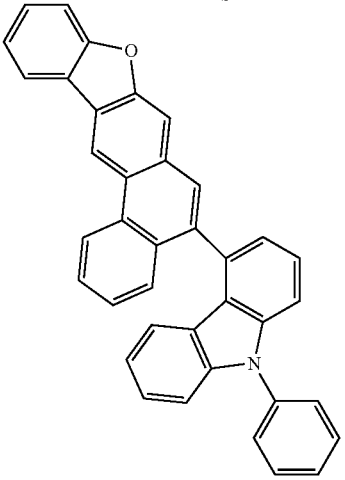

2-7

2-8
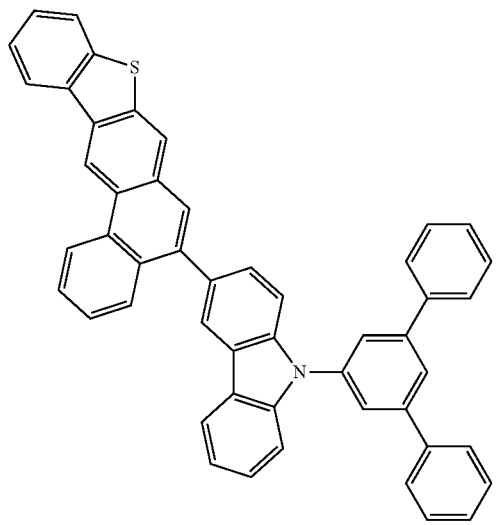
2-9
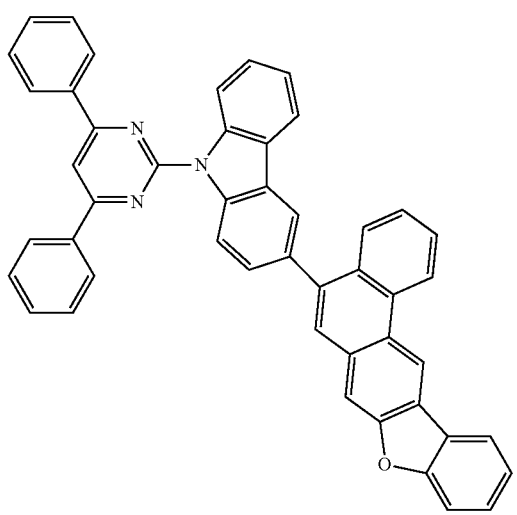
2-10
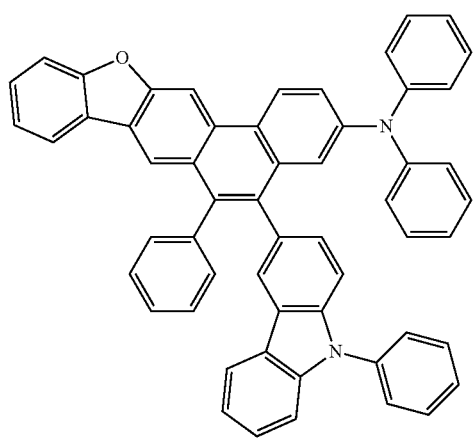
2-11
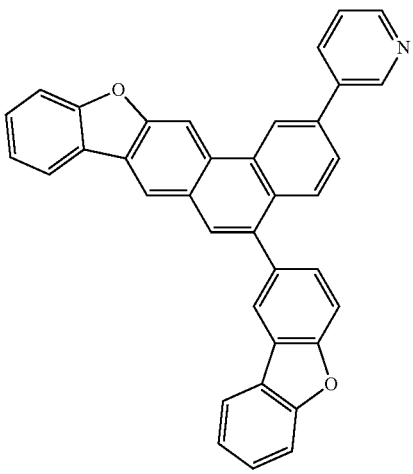
2-12
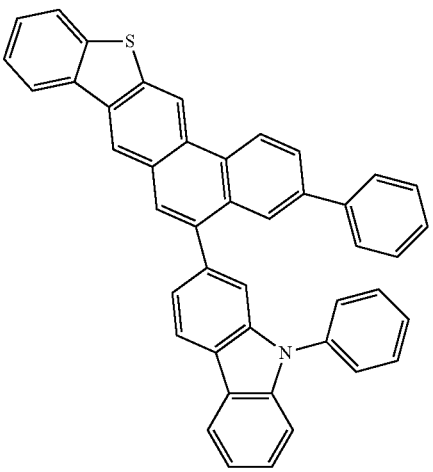
2-13
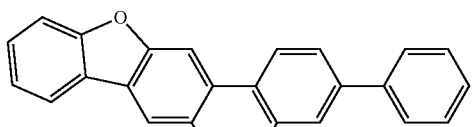
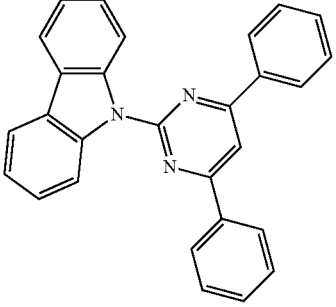

2-14
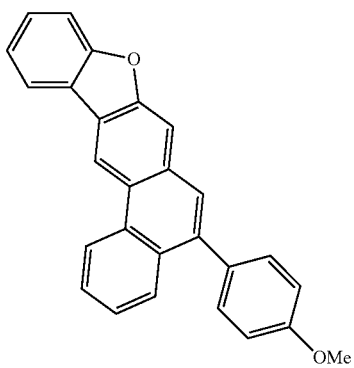
2-17
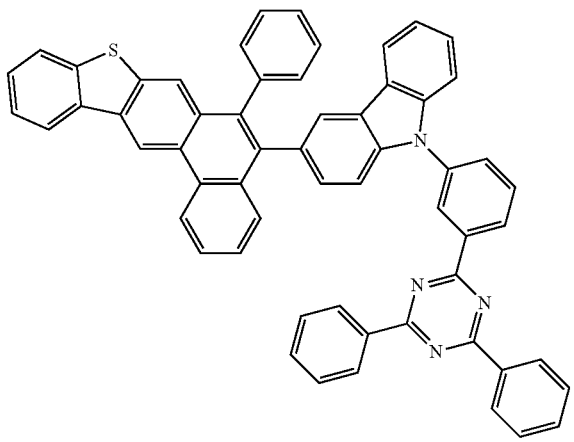
2-15
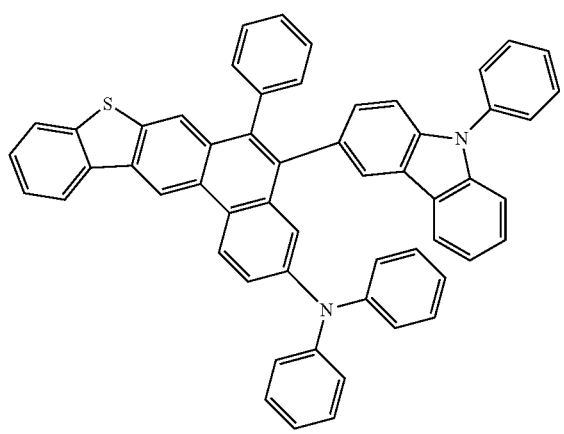
2-18
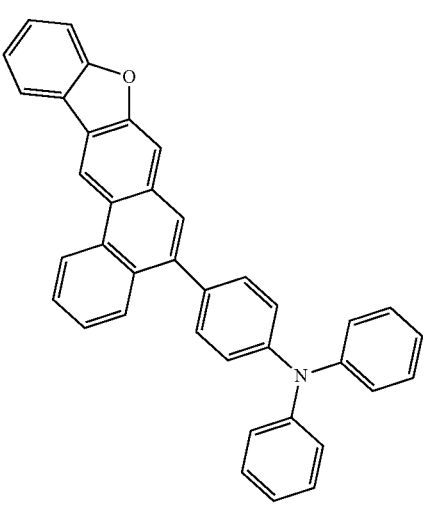
2-16
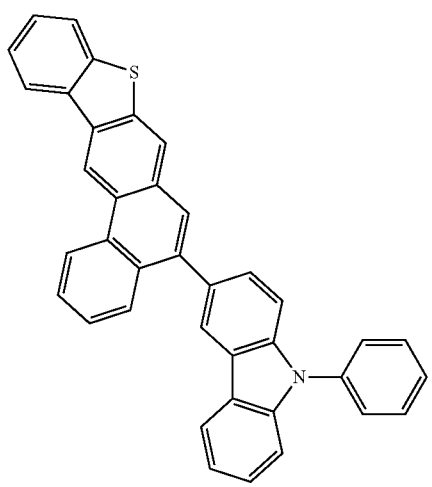
2-19
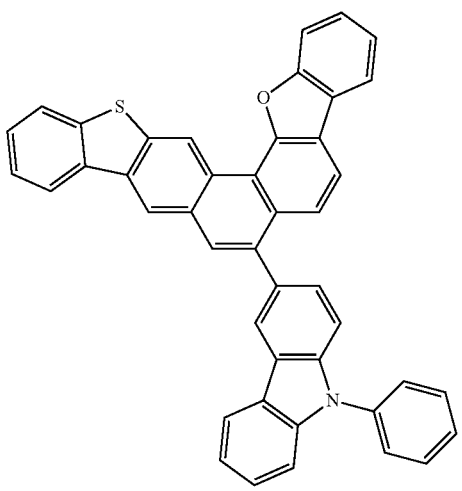

149
-continued 2-20

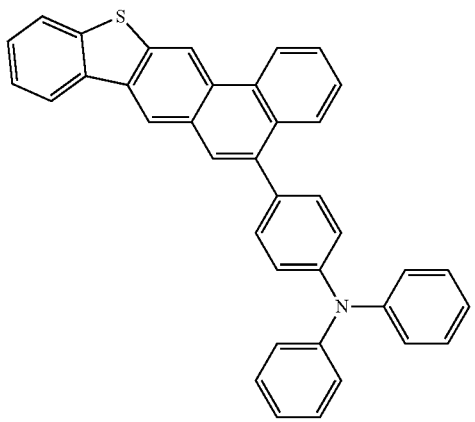

2-21

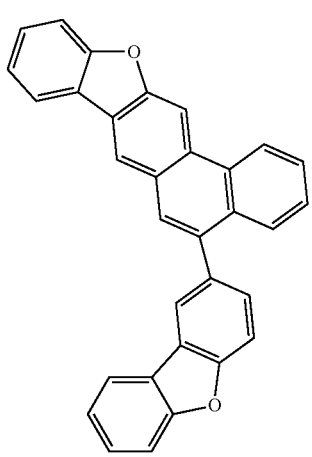

2-22

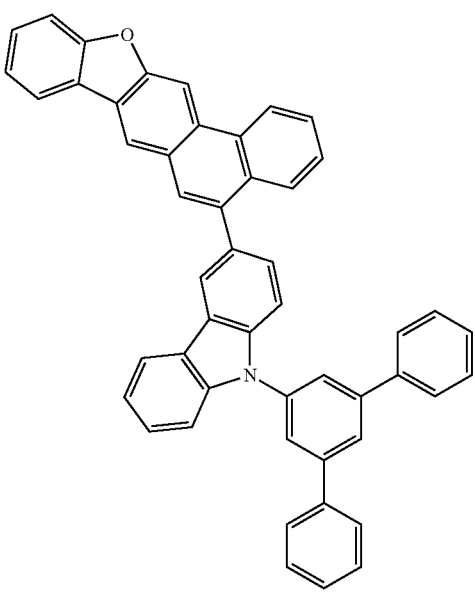

150
-continued 2-23

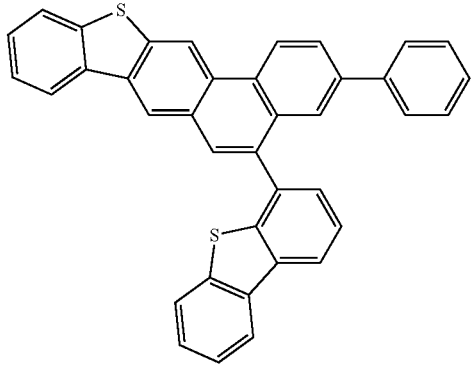

2-24

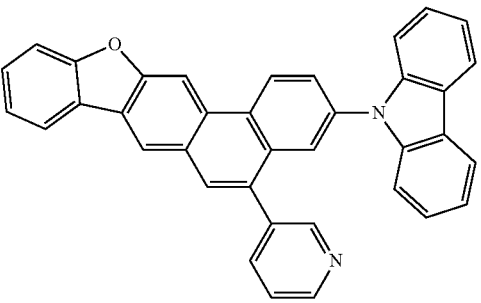

2-25

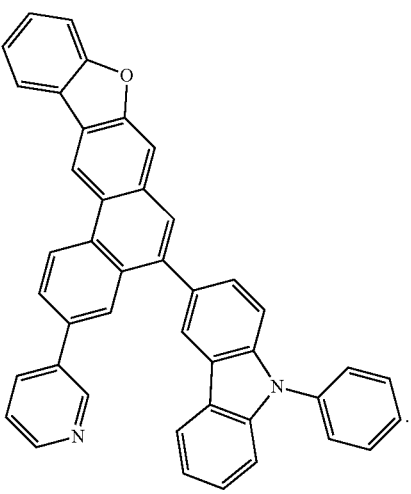

15. The organic light-emitting diode of claim 1, wherein the hole transfer region further comprises a charge-generating material.

16. The organic light-emitting diode of claim 1, wherein the hole transfer region comprises a hole transport layer, and the first compound is in the hole transport layer.

17. The organic light-emitting diode of claim 16, wherein the hole transfer region further comprises at least one of a hole injection layer between the first electrode and the hole transport layer, and a buffer layer between the hole transport layer and the emission layer.

18. The organic light-emitting diode of claim 1, wherein the hole transfer region is a single layer.

* * * * *